(12) United States Patent
Misaki

(10) Patent No.: US 10,749,259 B2
(45) Date of Patent: Aug. 18, 2020

(54) TFT SUBSTRATE, SCANNING ANTENNA PROVIDED WITH TFT SUBSTRATE AND METHOD FOR PRODUCING TFT SUBSTRATE

(71) Applicant: SHARP KABUSHIKI KAISHA, Sakai, Osaka (JP)

(72) Inventor: Katsunori Misaki, Yonago (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 39 days.

(21) Appl. No.: 16/321,823

(22) PCT Filed: Jul. 24, 2017

(86) PCT No.: PCT/JP2017/026713
§ 371 (c)(1),
(2) Date: Jan. 29, 2019

(87) PCT Pub. No.: WO2018/021247
PCT Pub. Date: Feb. 1, 2018

(65) Prior Publication Data
US 2019/0173173 A1   Jun. 6, 2019

(30) Foreign Application Priority Data
Jul. 29, 2016 (JP) .................................. 2016-150287

(51) Int. Cl.
*H01Q 3/44* (2006.01)
*H01L 27/12* (2006.01)
(Continued)

(52) U.S. Cl.
CPC ............. *H01Q 3/44* (2013.01); *G02F 1/1368* (2013.01); *G02F 1/134309* (2013.01);
(Continued)

(58) Field of Classification Search
None
See application file for complete search history.

(56) References Cited

U.S. PATENT DOCUMENTS 7,466,269 B2   12/2008  Haziza
7,847,894 B2   12/2010  Rho
(Continued)

OTHER PUBLICATIONS

Co-pending letter regarding a related co-pending U.S. Appl. No. 15/542,488, filed Jul. 10, 2017.

*Primary Examiner* — Jany Richardson
(74) *Attorney, Agent, or Firm* — ScienBiziP, P.C.

(57) ABSTRACT

This TFT substrate includes a TFT provided with a gate electrode, a source electrode, and a drain electrode; a gate metal layer including the gate electrode; a gate insulating layer formed on the gate metal layer; and a source metal layer that is formed on the gate insulating layer and includes the source electrode, the drain electrode, and a patch electrode. The source metal layer includes a first metal layer that contains one of Ti, Mo, Ta, W and Nb, and a second metal layer that is formed on the first metal layer and contains one of Cu, Al, Ag and Au. The source electrode and the drain electrode each include the first metal layer and the second metal layer. A distance from the first metal layer of the source electrode to the first metal layer of the drain electrode in a channel direction is less than a distance from the second metal layer of the source electrode to the second metal layer of the drain electrode in the channel direction.

19 Claims, 45 Drawing Sheets

(51) Int. Cl.

| | |
|---|---|
| *H01Q 3/34* | (2006.01) |
| *H01Q 21/06* | (2006.01) |
| *H01Q 13/22* | (2006.01) |
| *H01L 29/786* | (2006.01) |
| *G02F 1/1343* | (2006.01) |
| *G02F 1/1362* | (2006.01) |
| *G02F 1/1368* | (2006.01) |
| *H01Q 1/24* | (2006.01) |
| *H01Q 3/38* | (2006.01) |
| *H01Q 9/04* | (2006.01) |

(52) U.S. Cl.
CPC ...... *G02F 1/136286* (2013.01); *H01L 27/124* (2013.01); *H01L 27/127* (2013.01); *H01L 27/1218* (2013.01); *H01L 27/1255* (2013.01); *H01L 27/1288* (2013.01); *H01L 29/786* (2013.01); *H01Q 1/247* (2013.01); *H01Q 3/34* (2013.01); *H01Q 3/385* (2013.01); *H01Q 9/0414* (2013.01); *H01Q 13/22* (2013.01)

(56) References Cited

U.S. PATENT DOCUMENTS

| | | | |
|---|---|---|---|
| 9,448,433 B2* | 9/2016 | Yamazaki | G09G 3/3677 |
| 10,153,550 B2* | 12/2018 | Orui | H01L 23/66 |
| 2012/0092577 A1 | 4/2012 | Shi et al. | |
| 2012/0138922 A1 | 6/2012 | Yamazaki et al. | |
| 2012/0194399 A1 | 8/2012 | Bily et al. | |
| 2013/0320334 A1 | 12/2013 | Yamazaki et al. | |
| 2014/0286076 A1 | 9/2014 | Aoki et al. | |

* cited by examiner

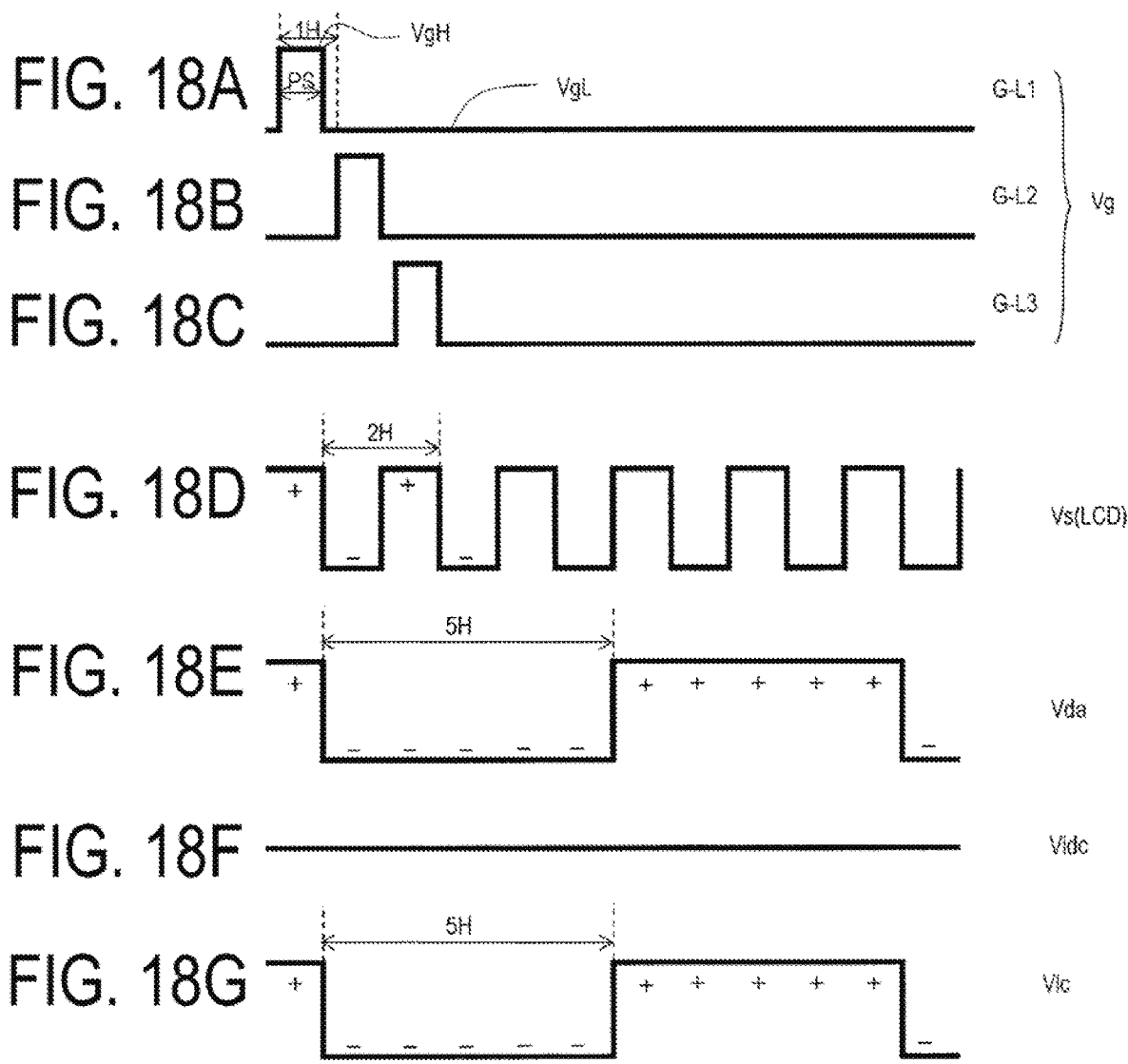

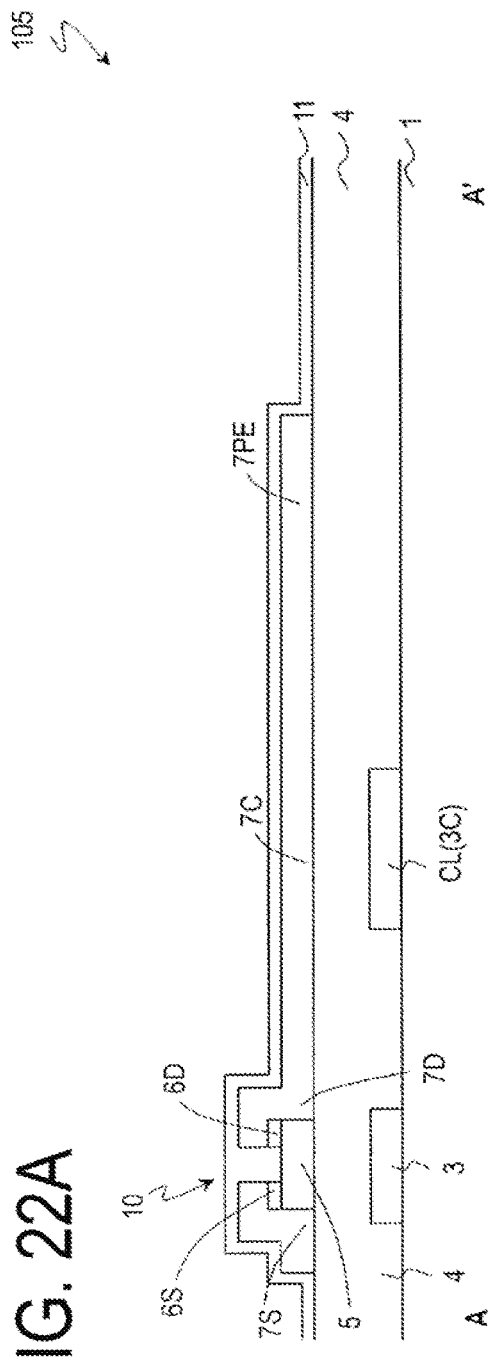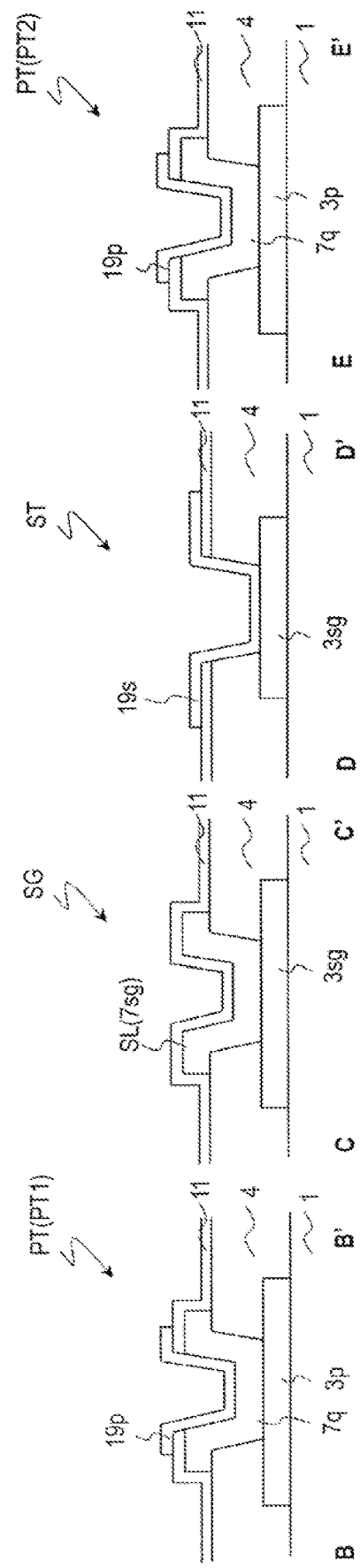

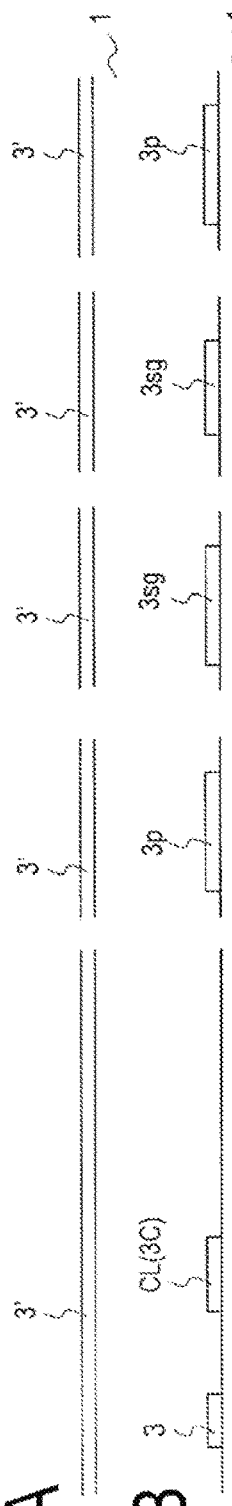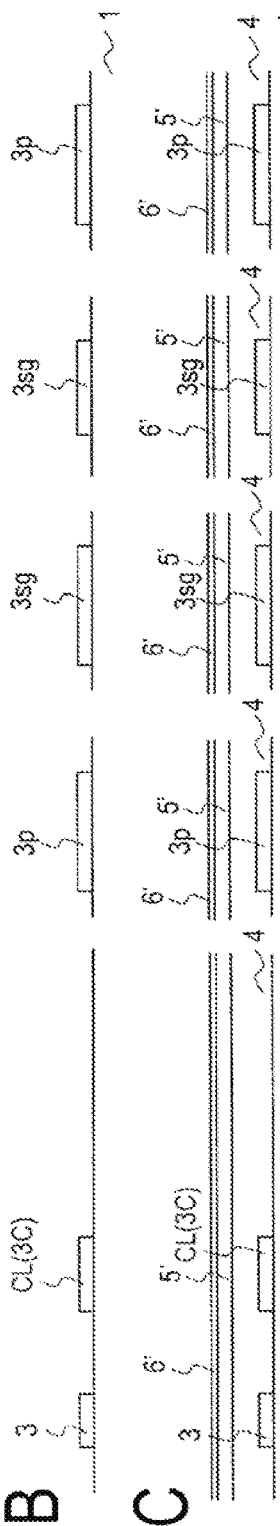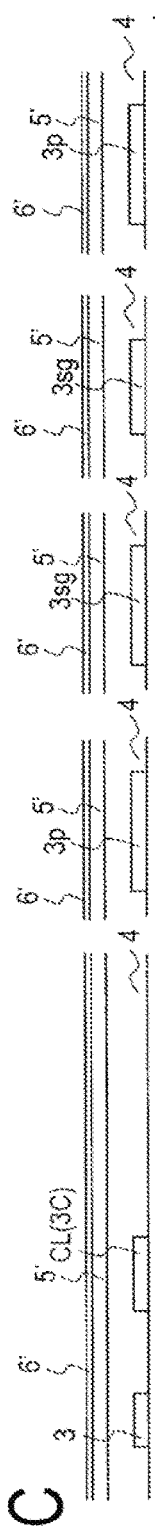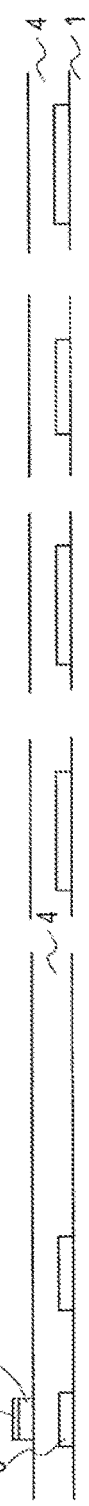

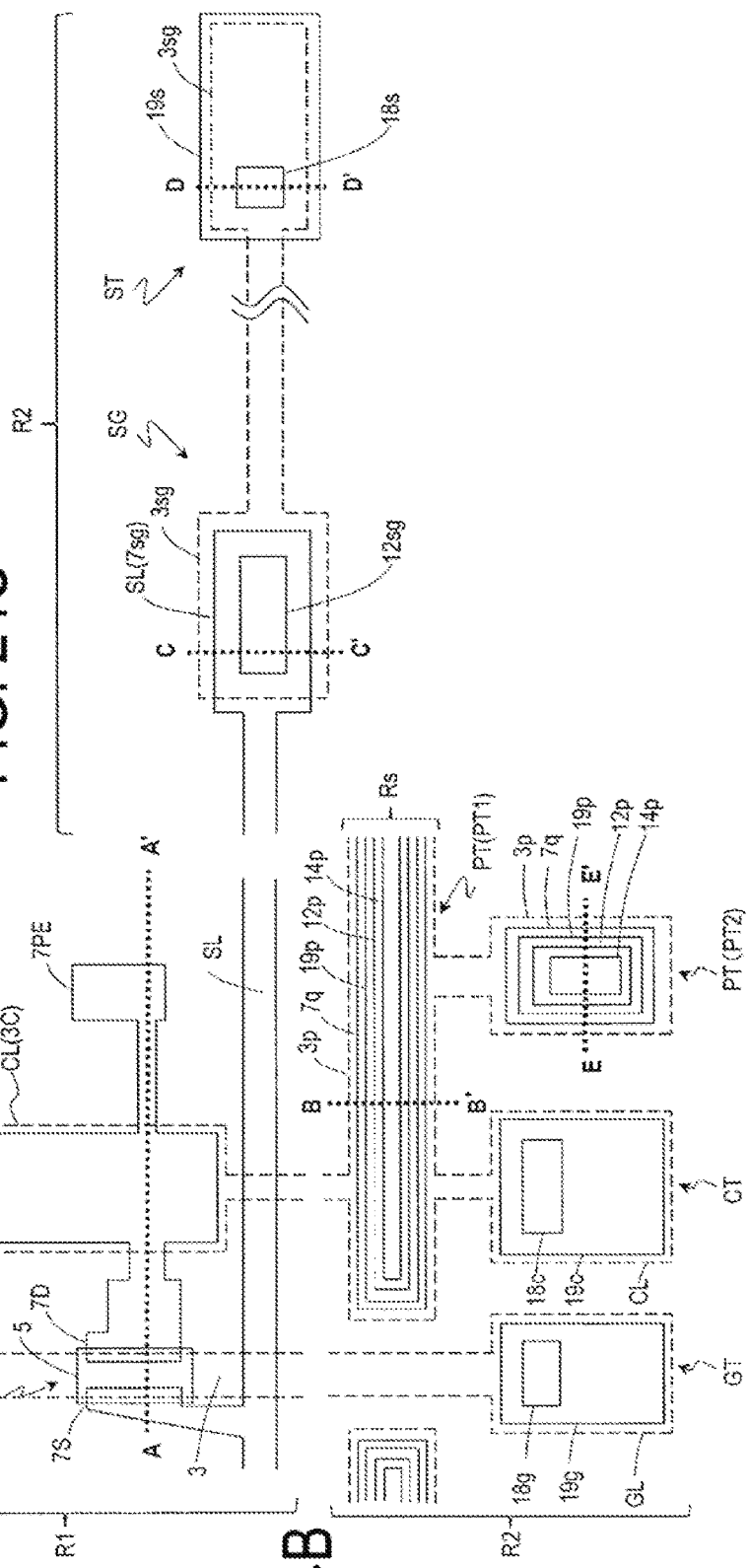
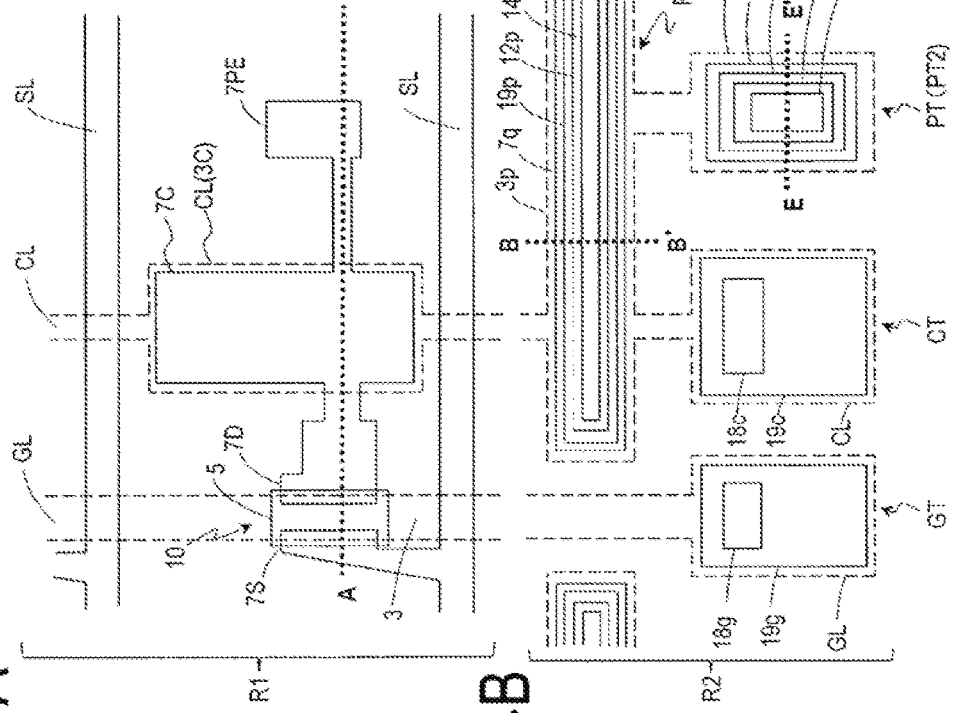
FIG. 24A
FIG. 24B
FIG. 24C

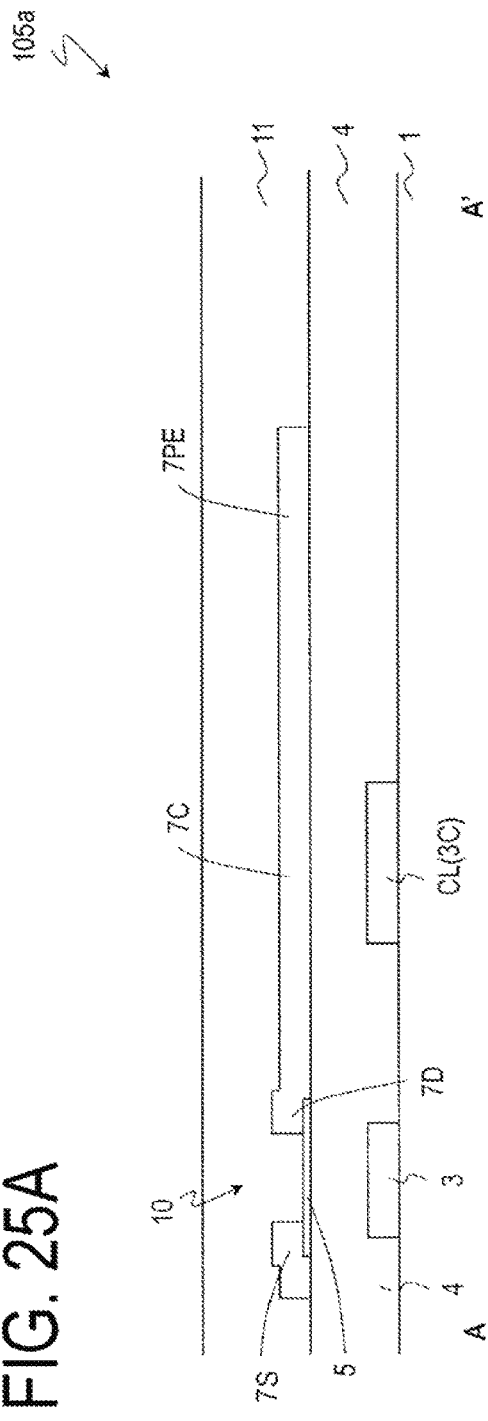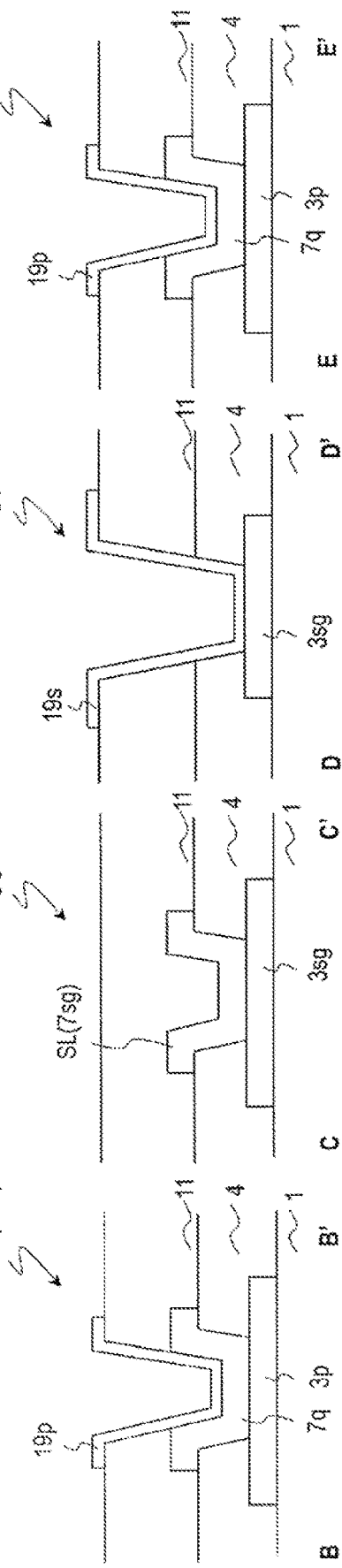

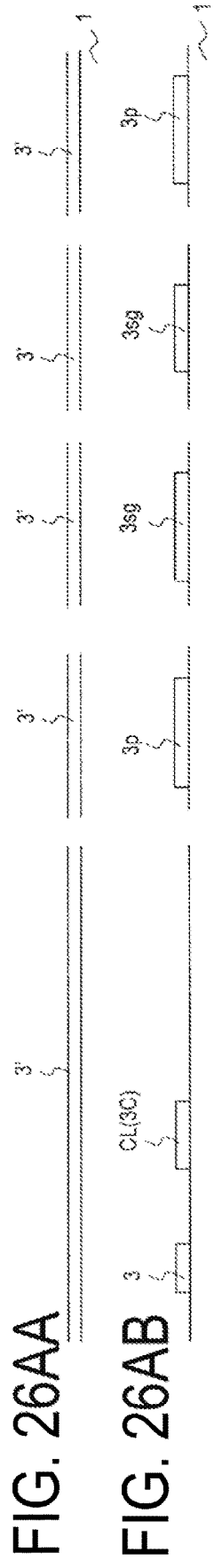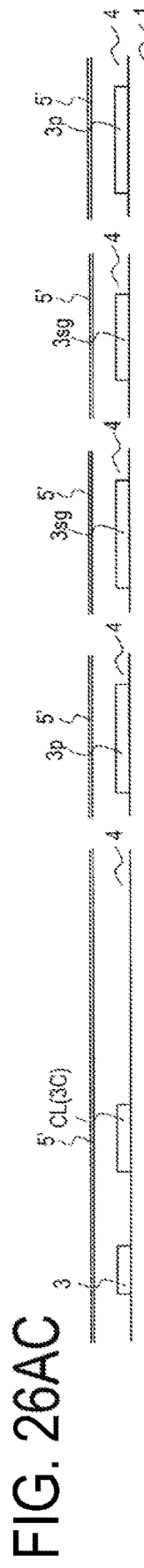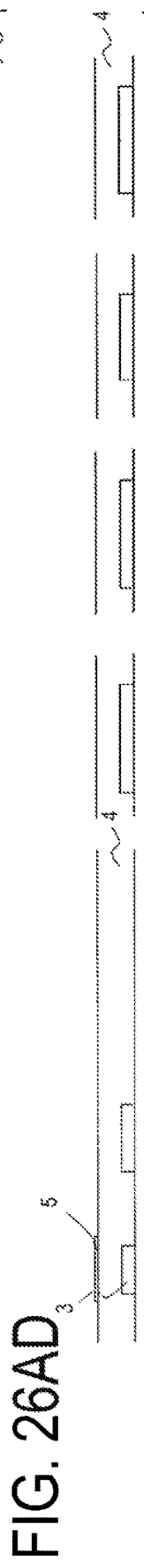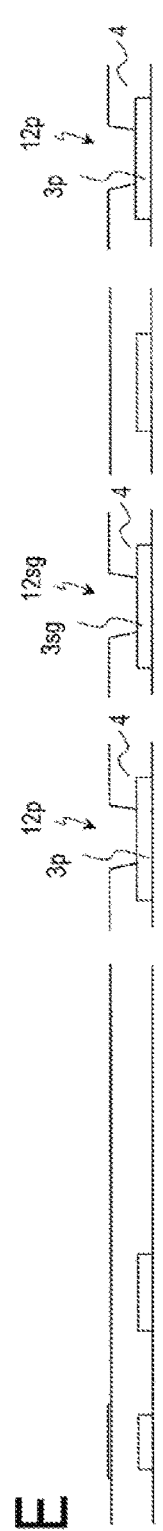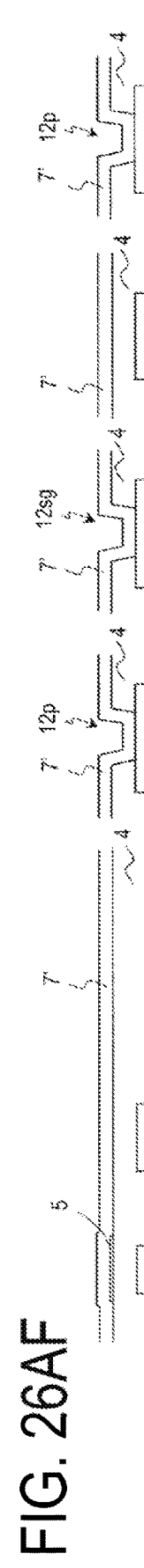

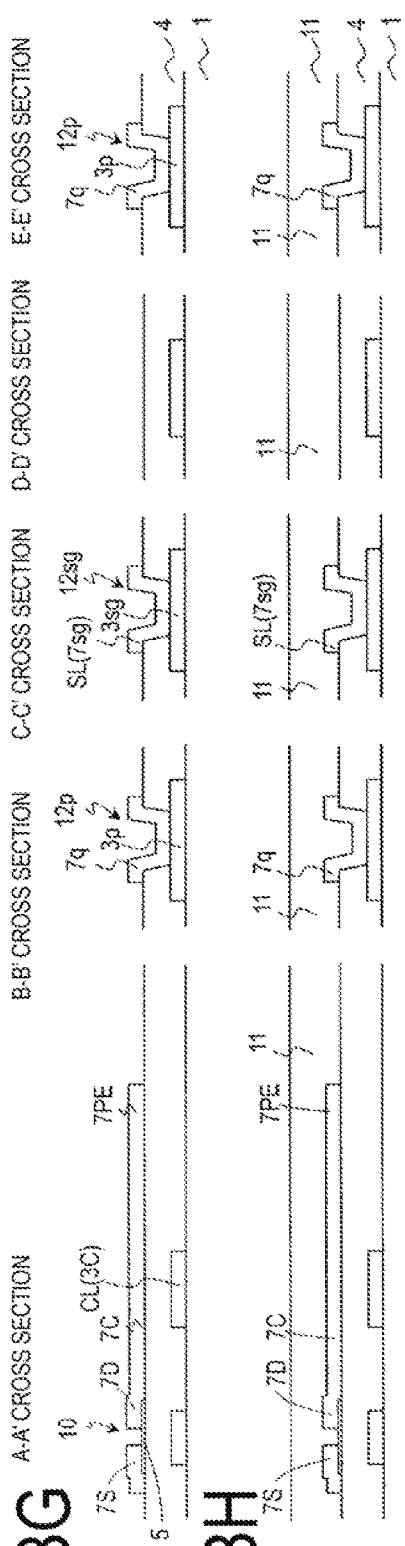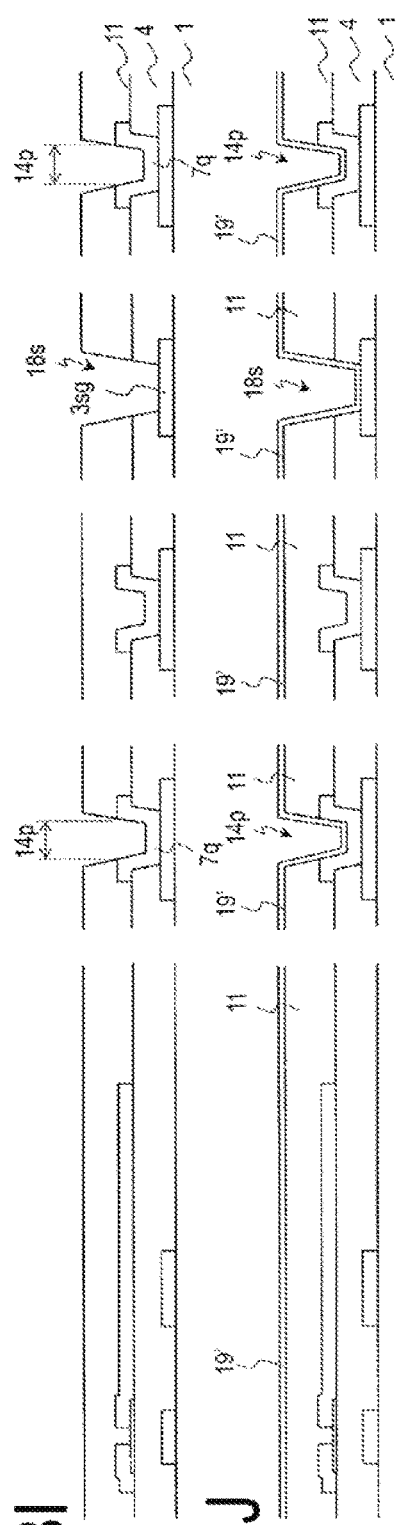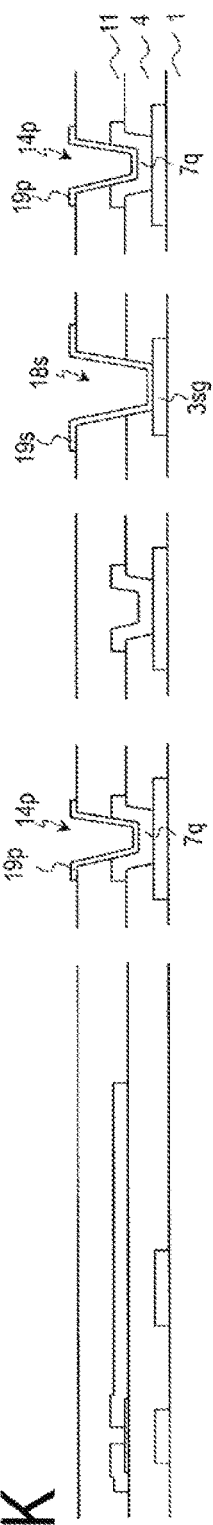

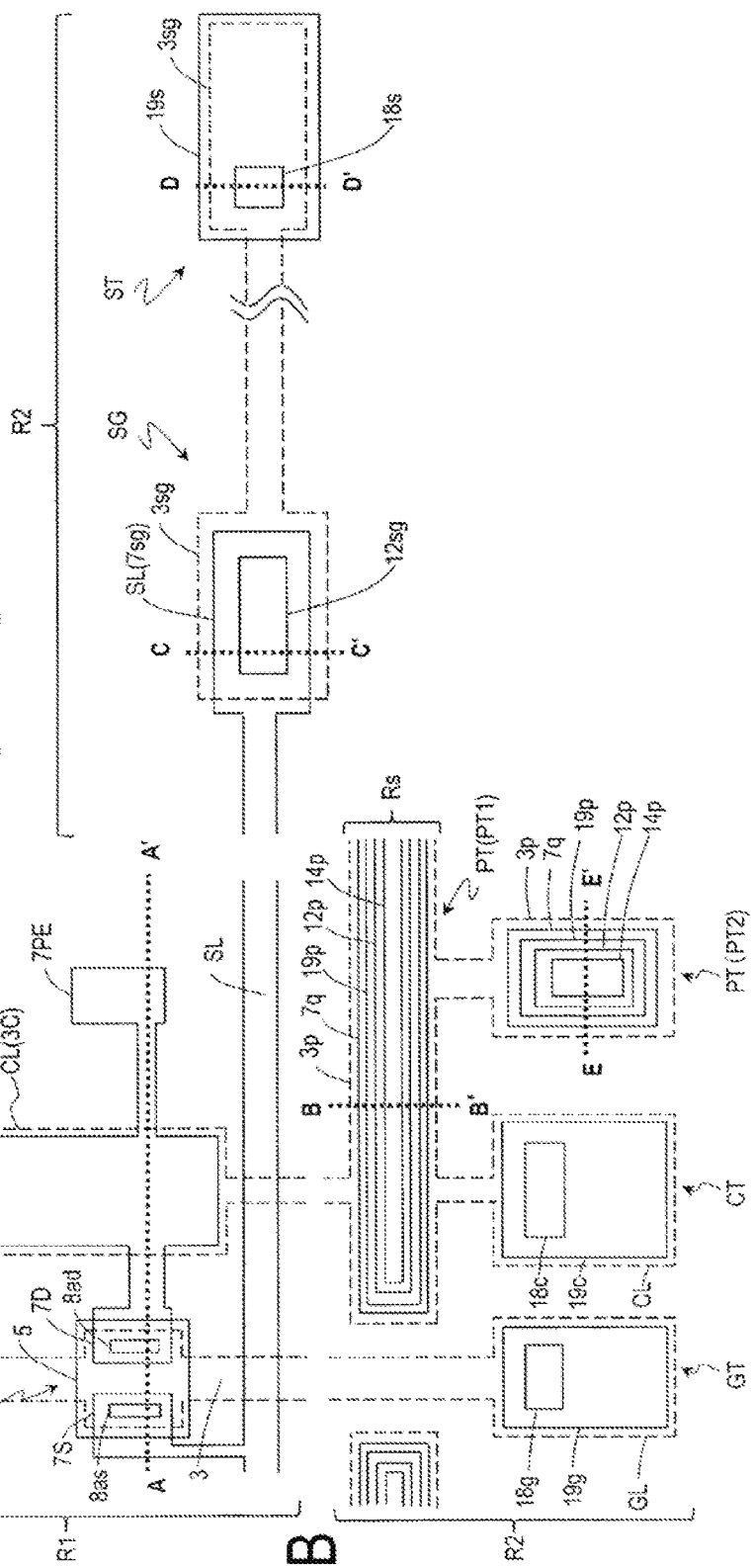

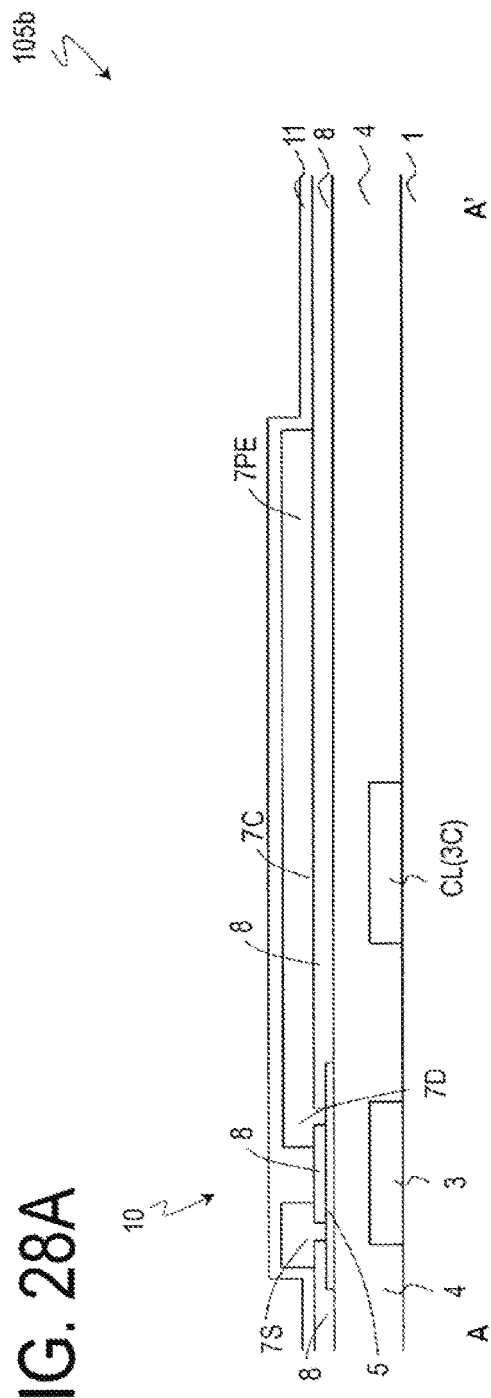
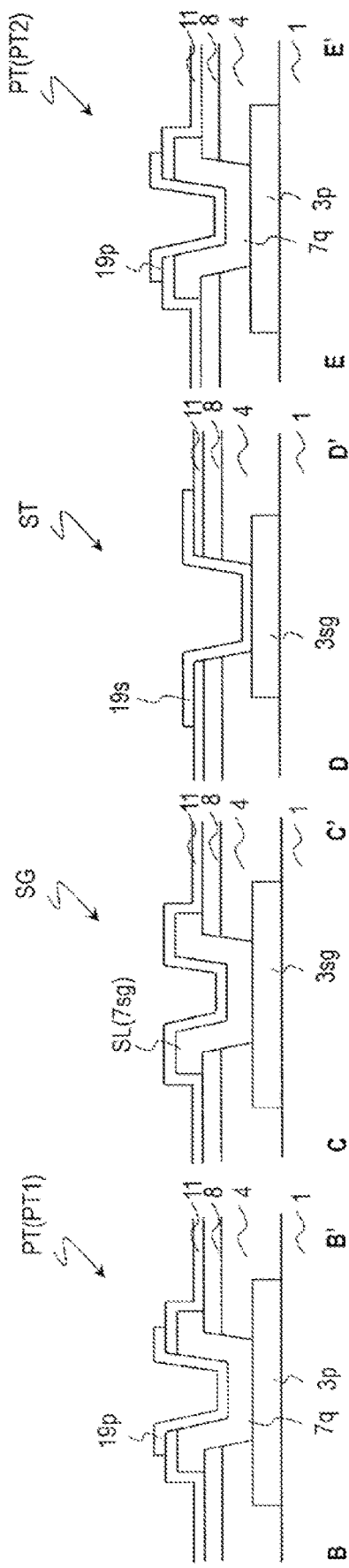

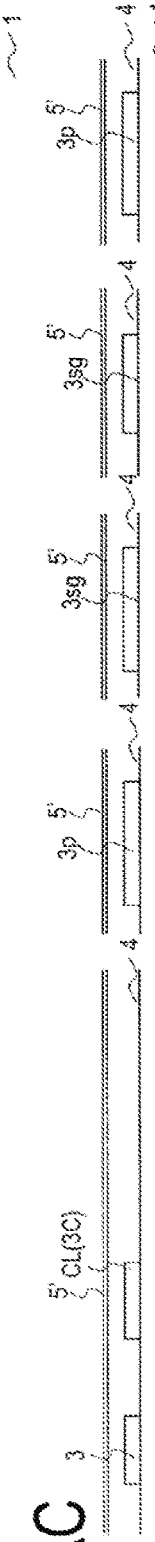
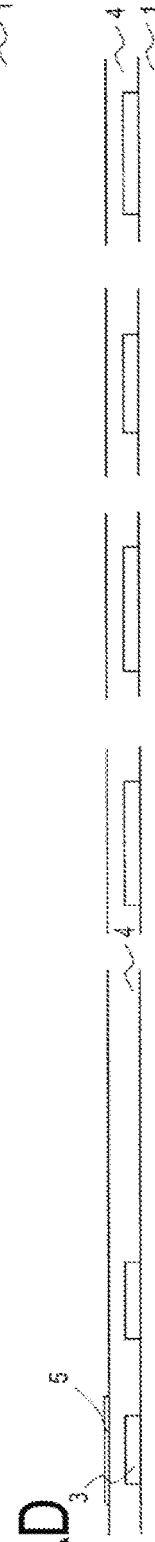
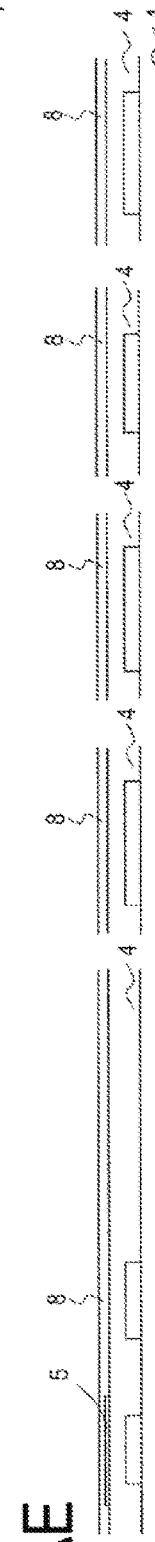
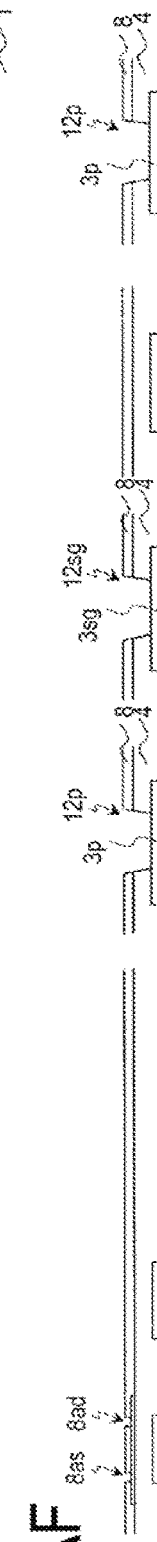
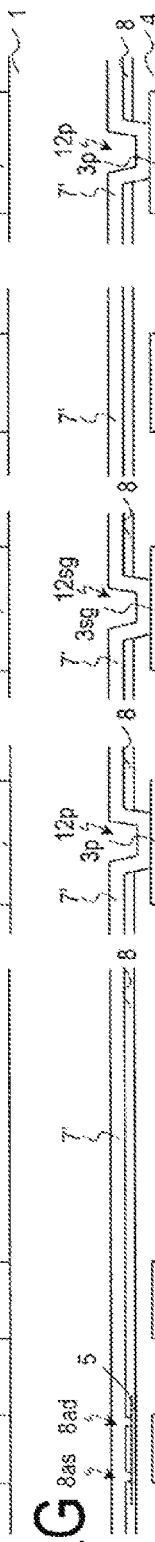
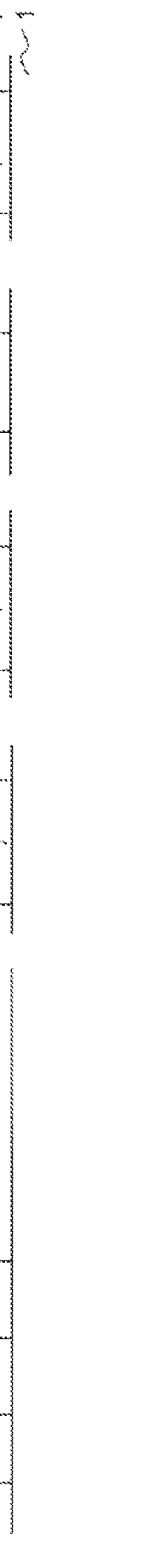

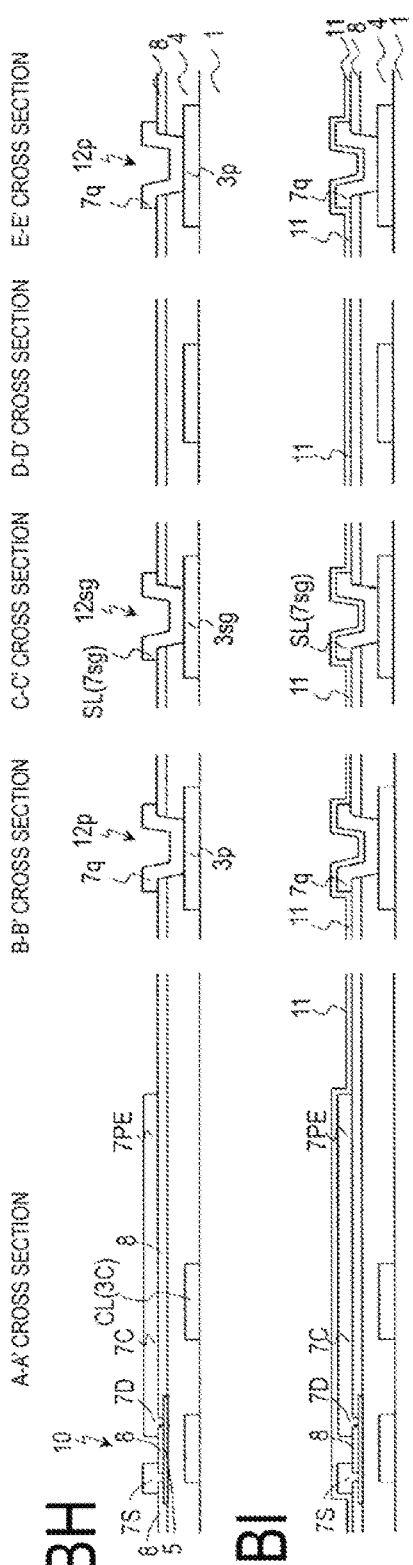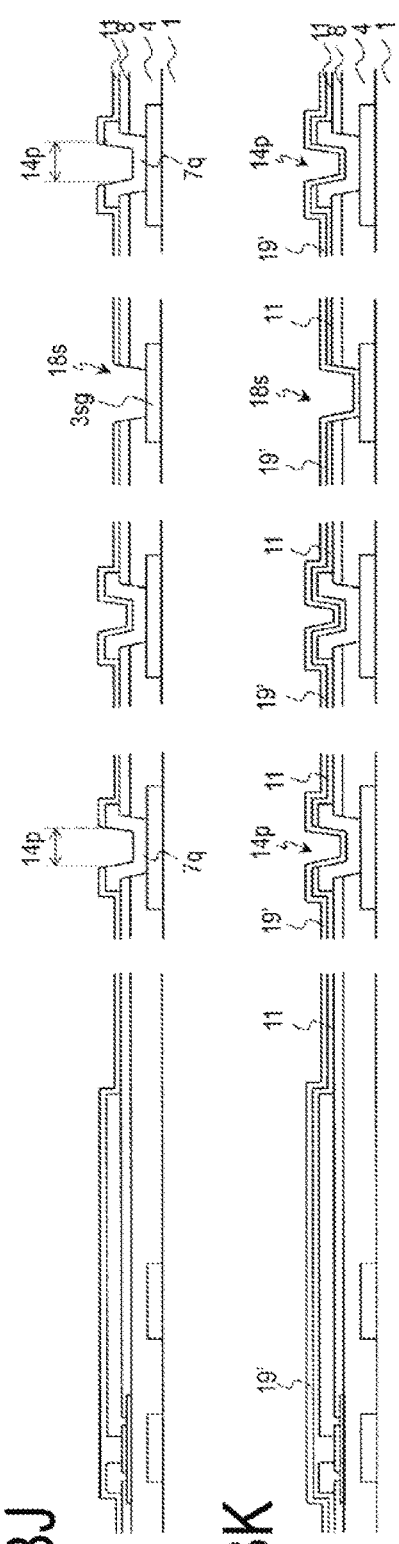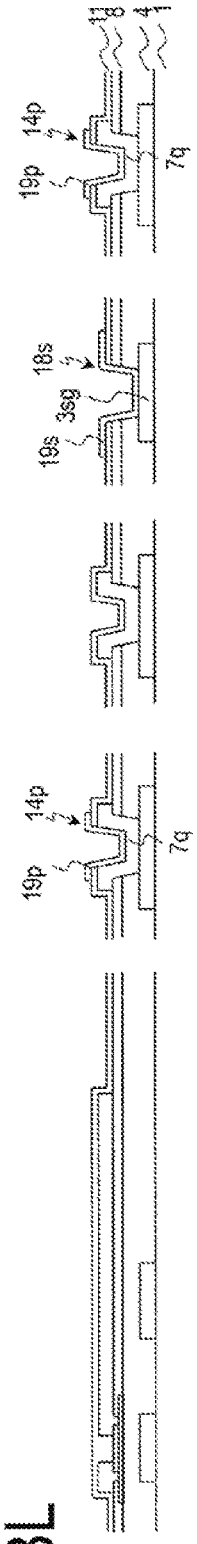

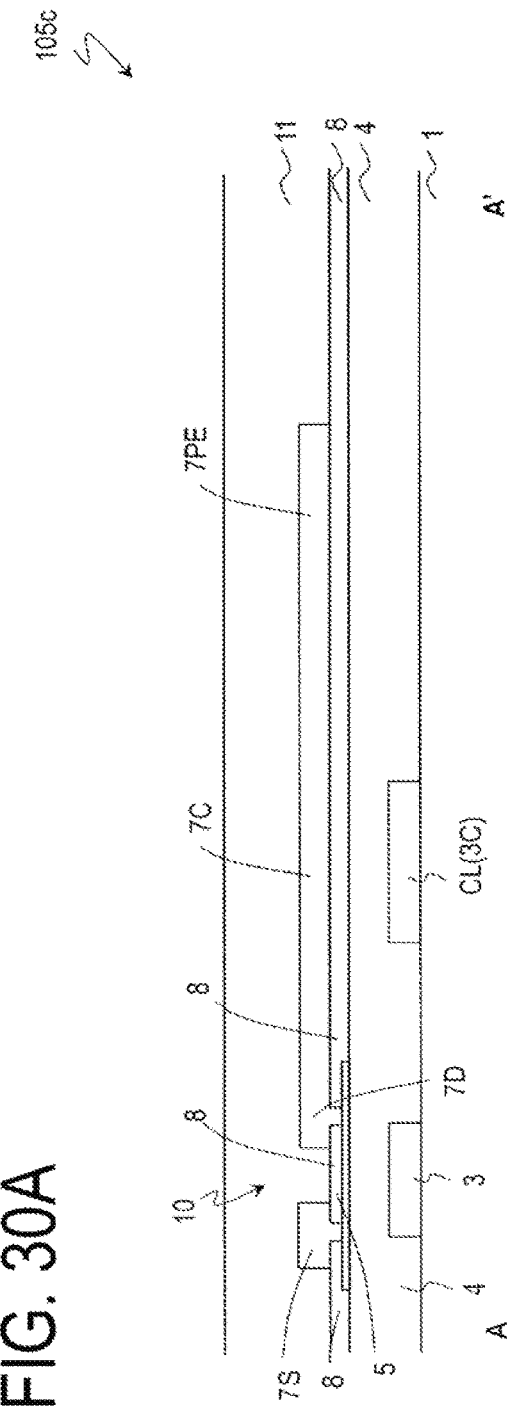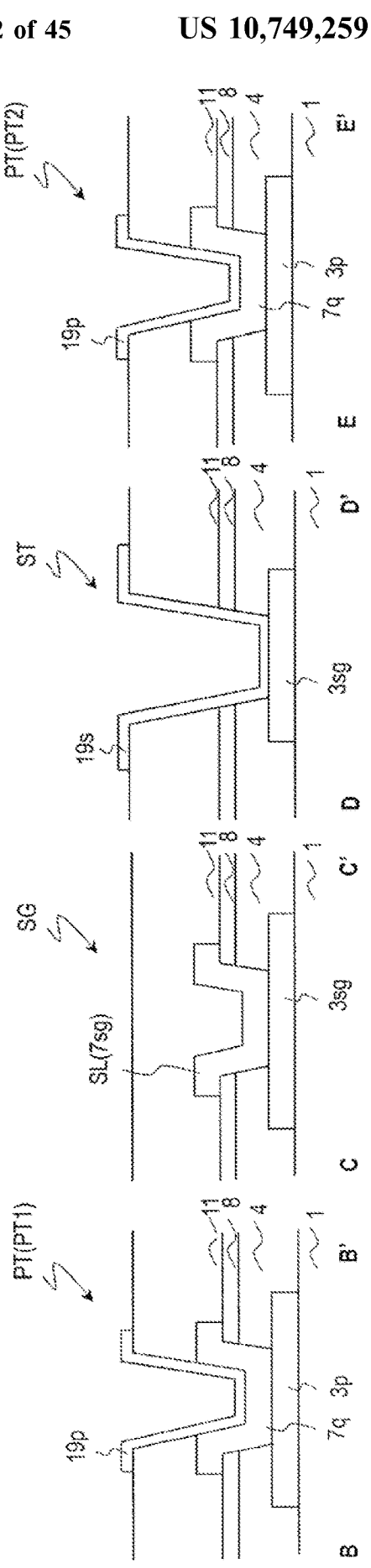

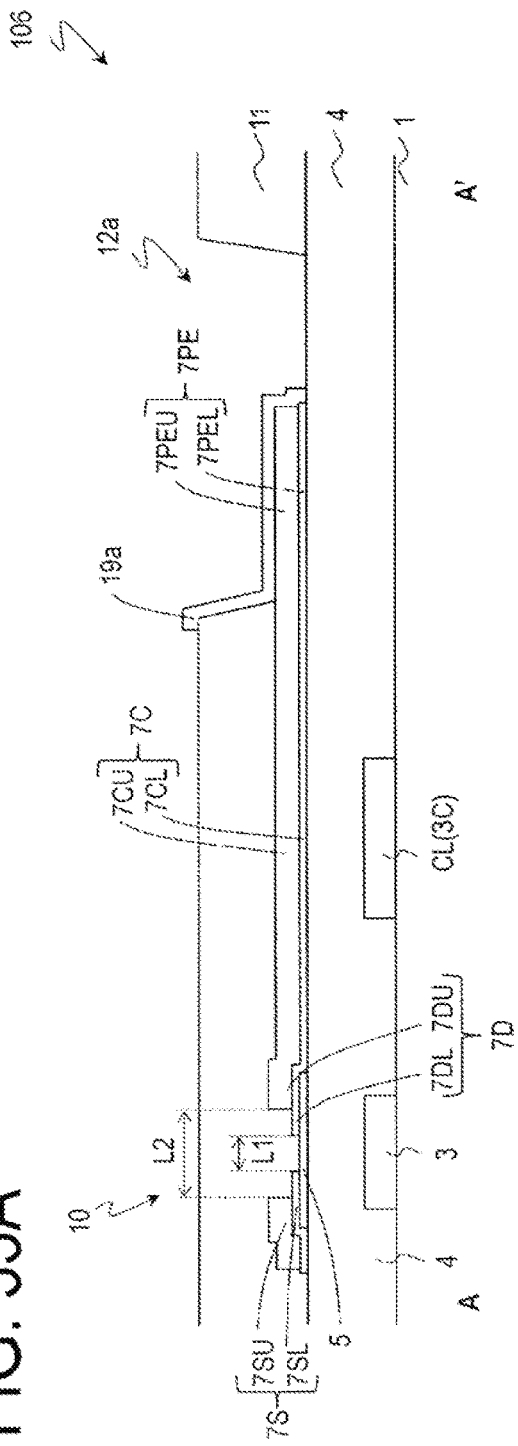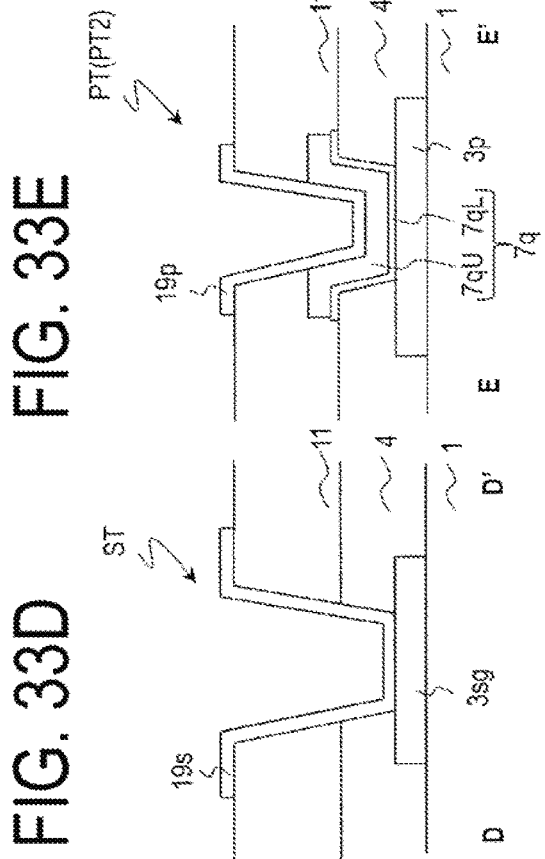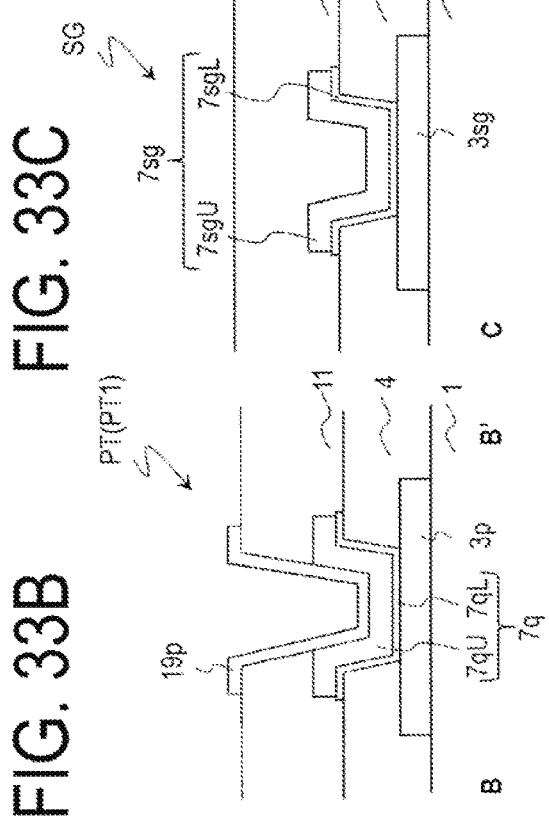

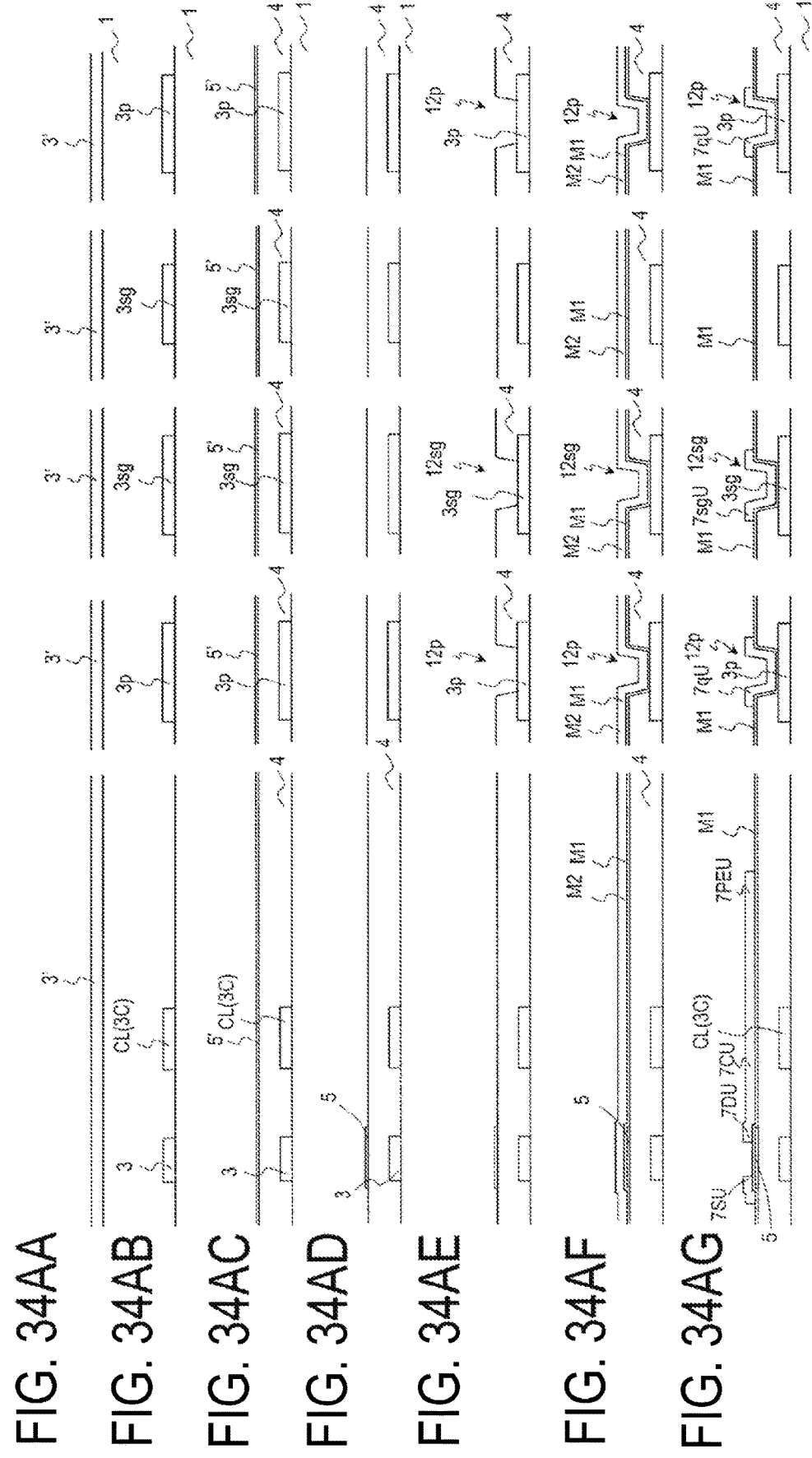

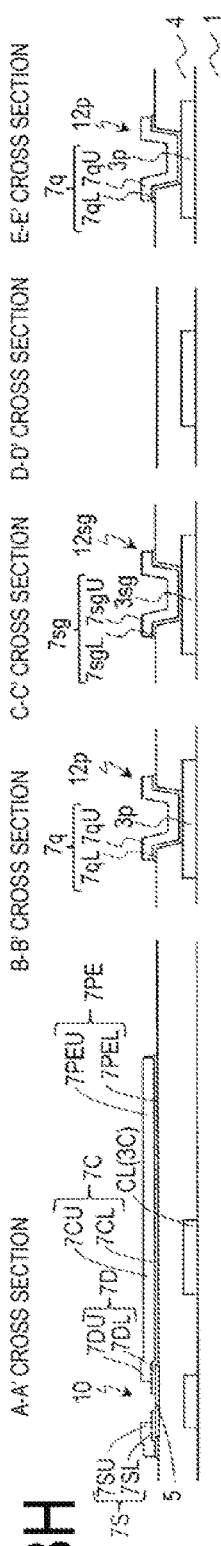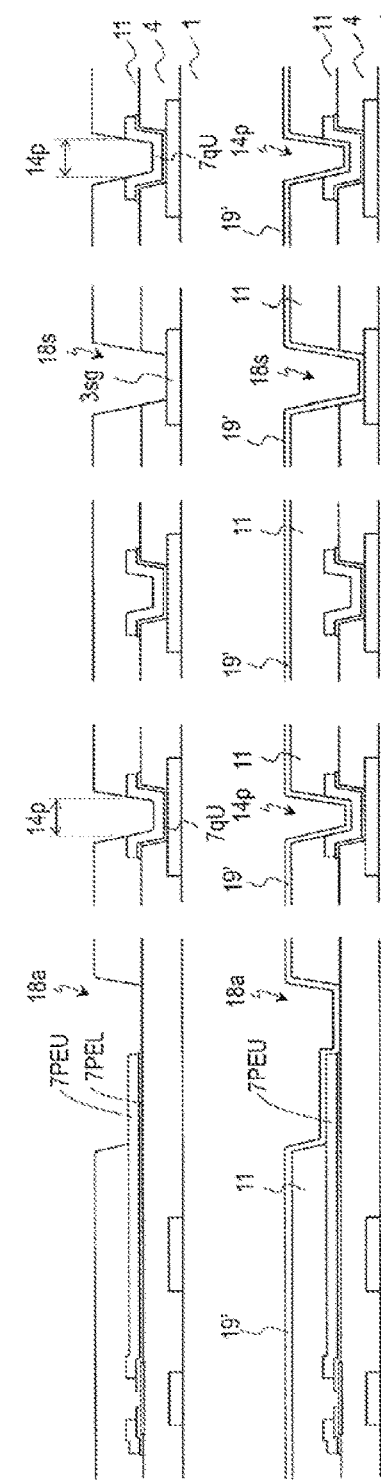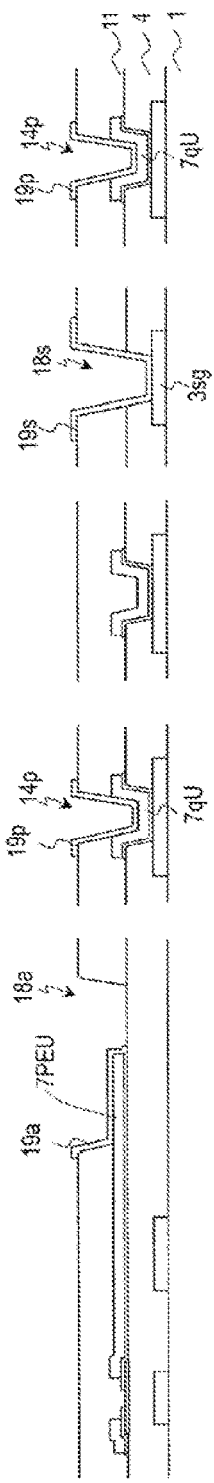
FIG. 34BH
FIG. 34BI
FIG. 34BJ
FIG. 34BK
FIG. 34BL

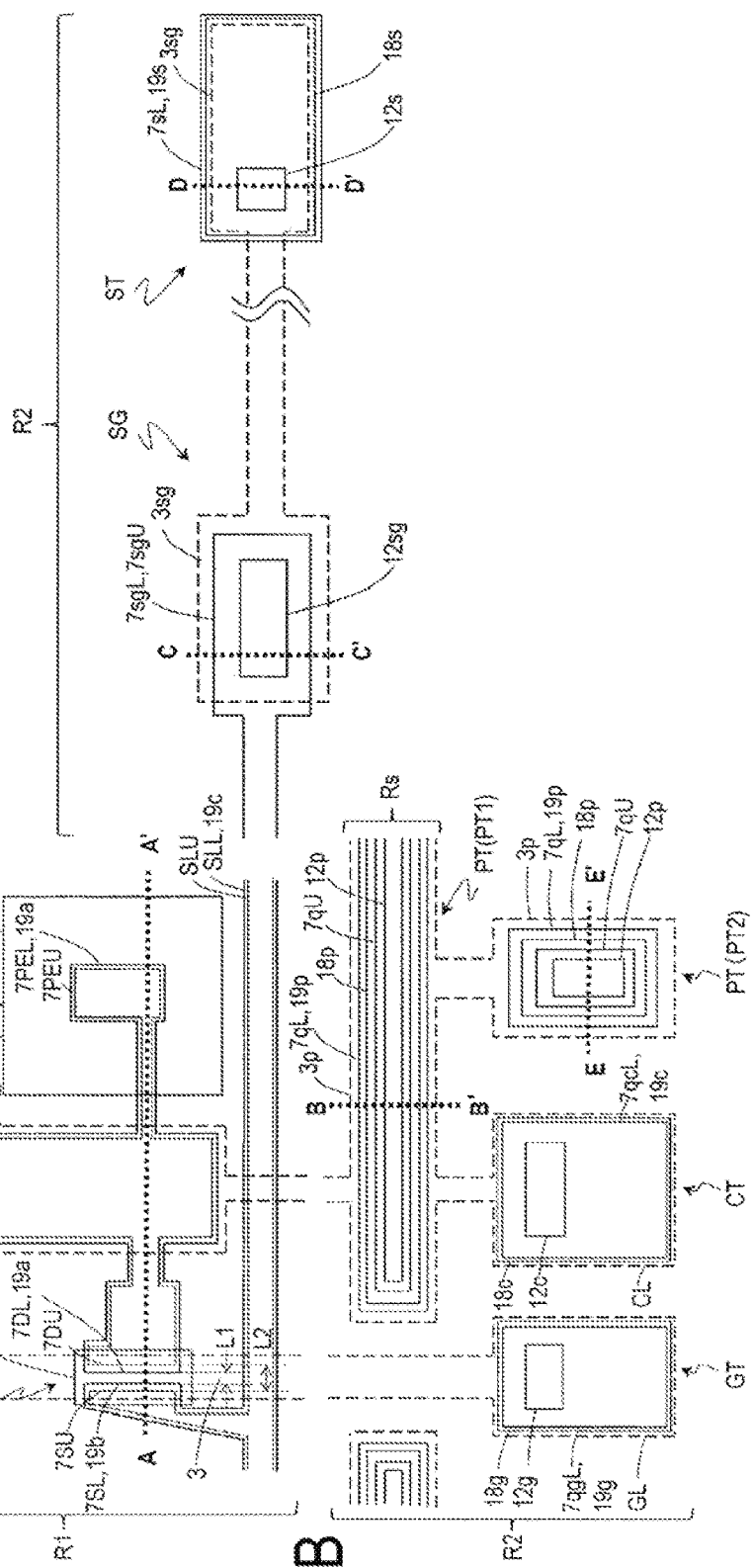

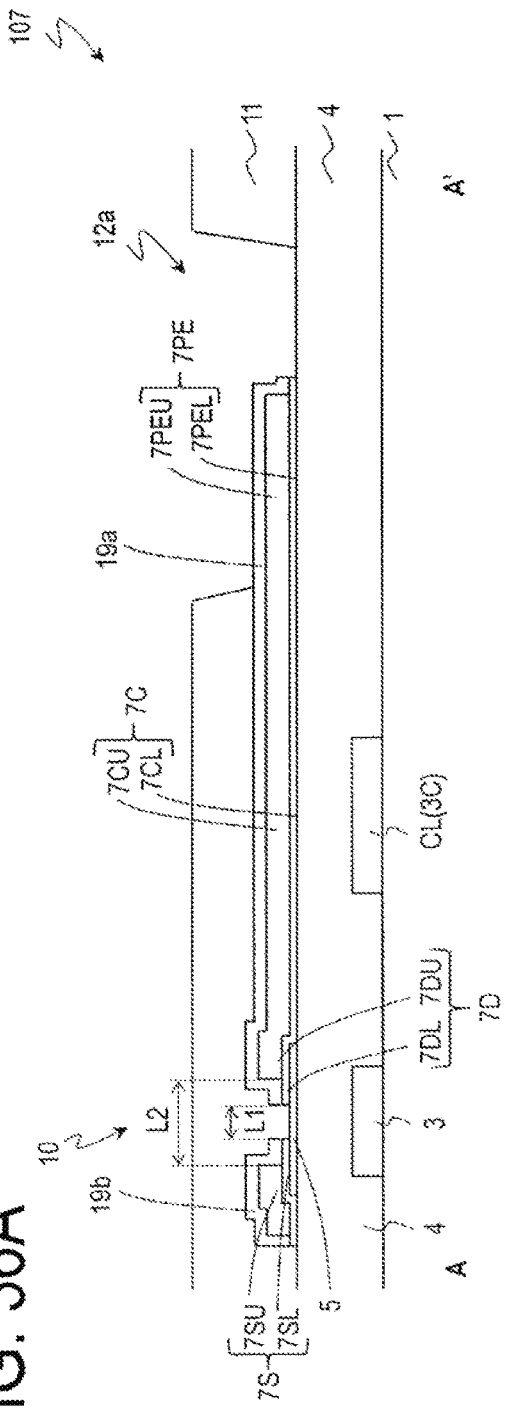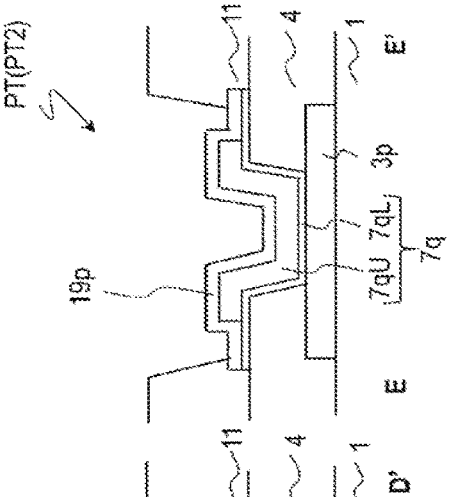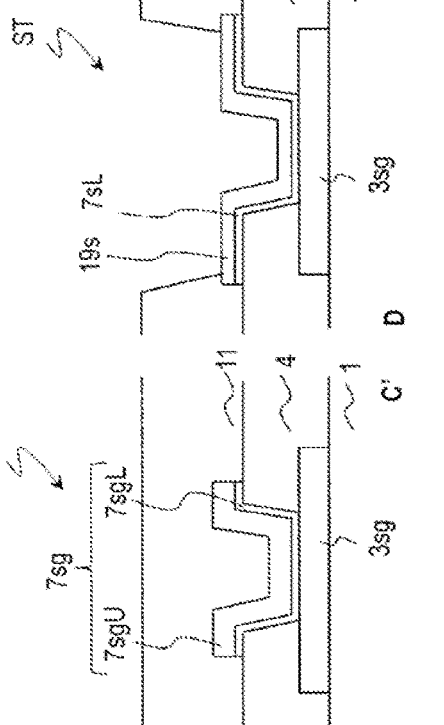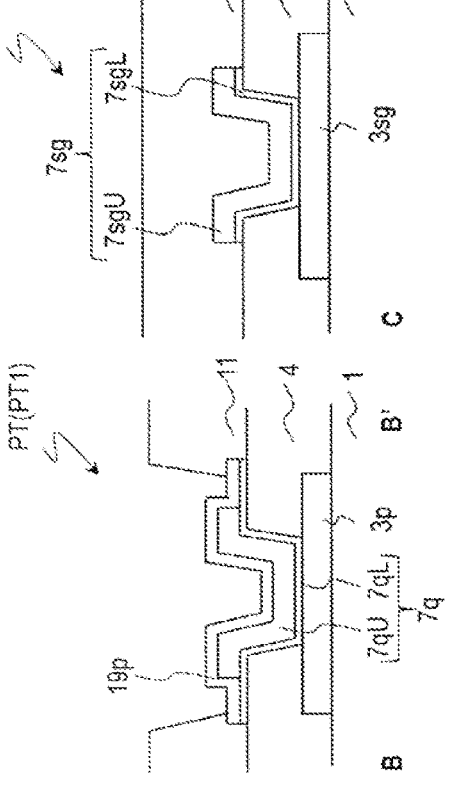

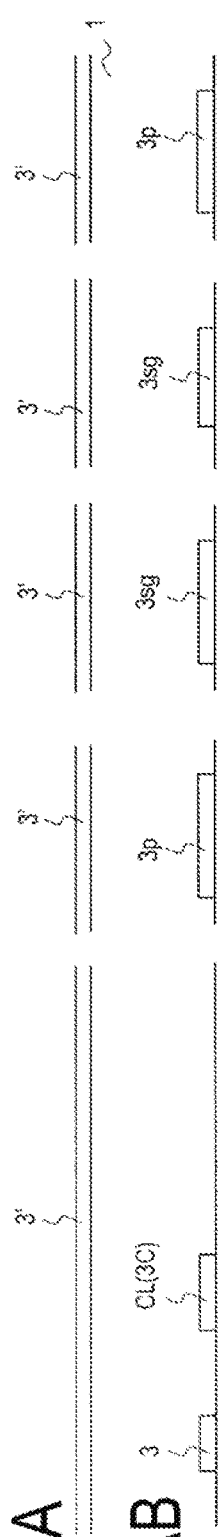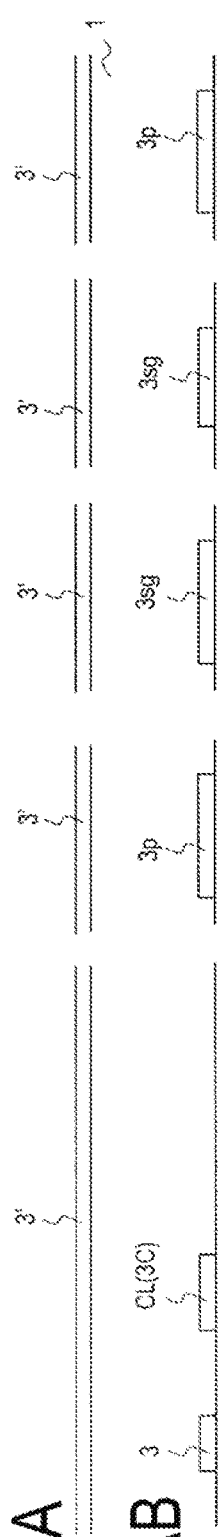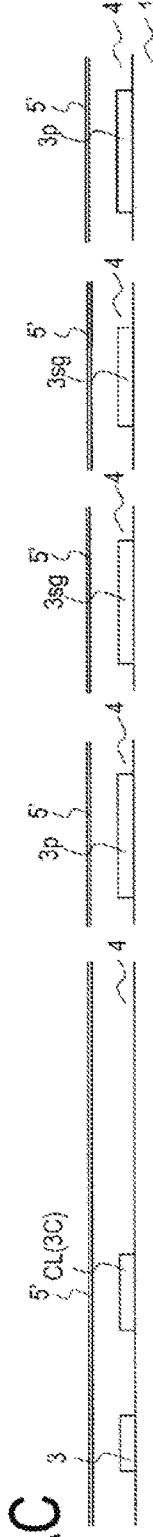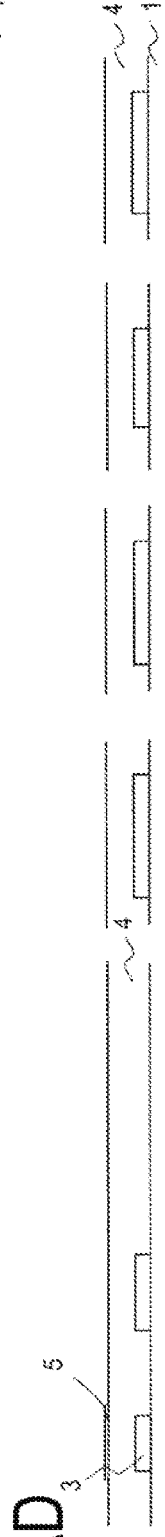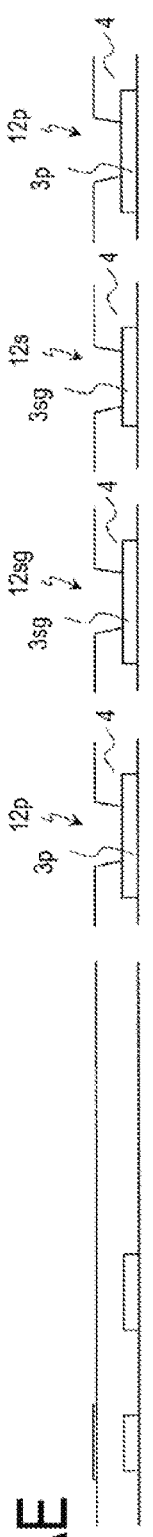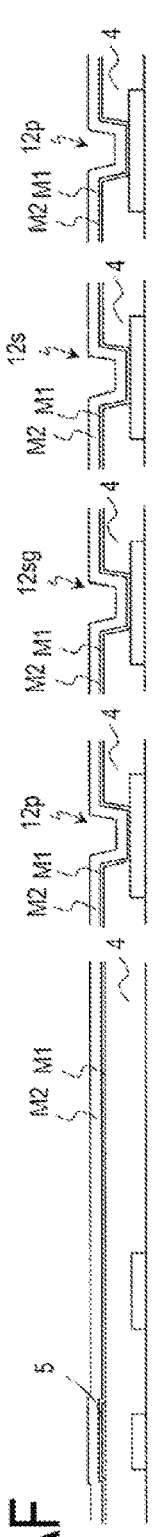

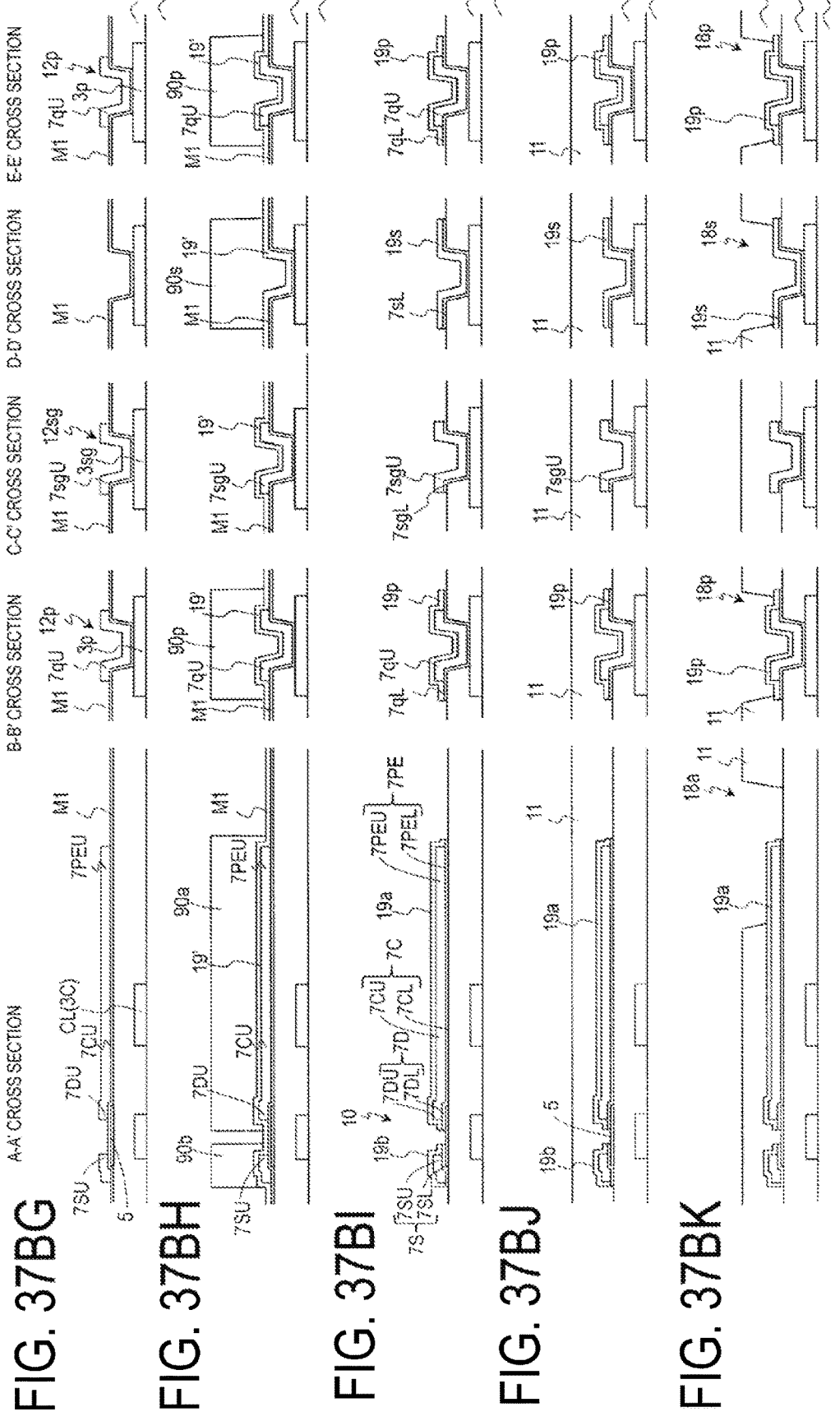

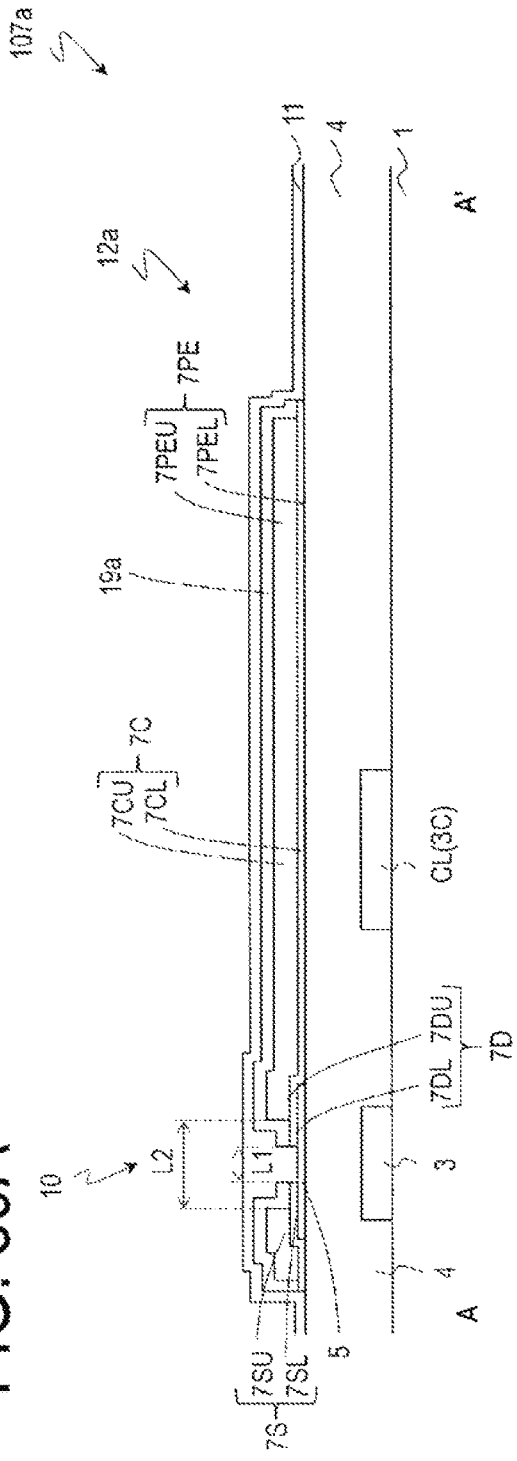
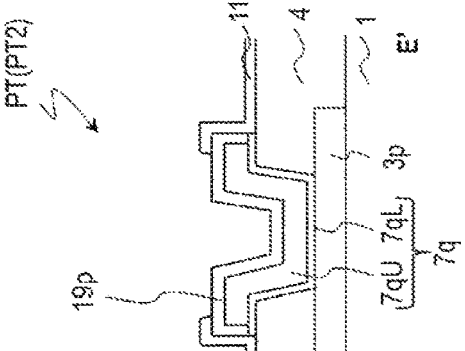
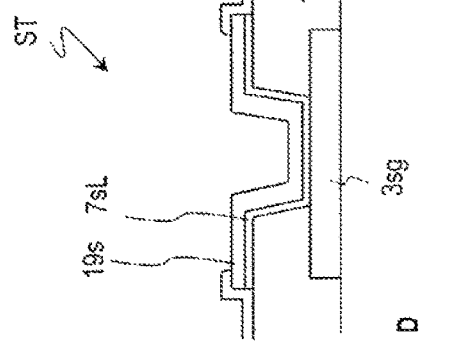
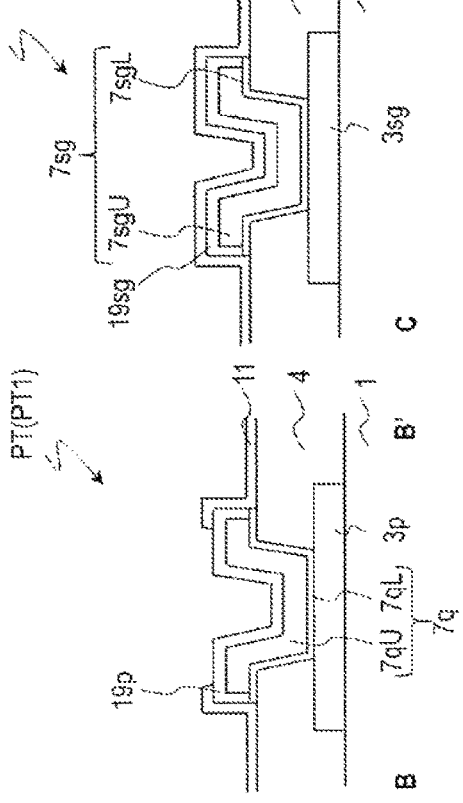

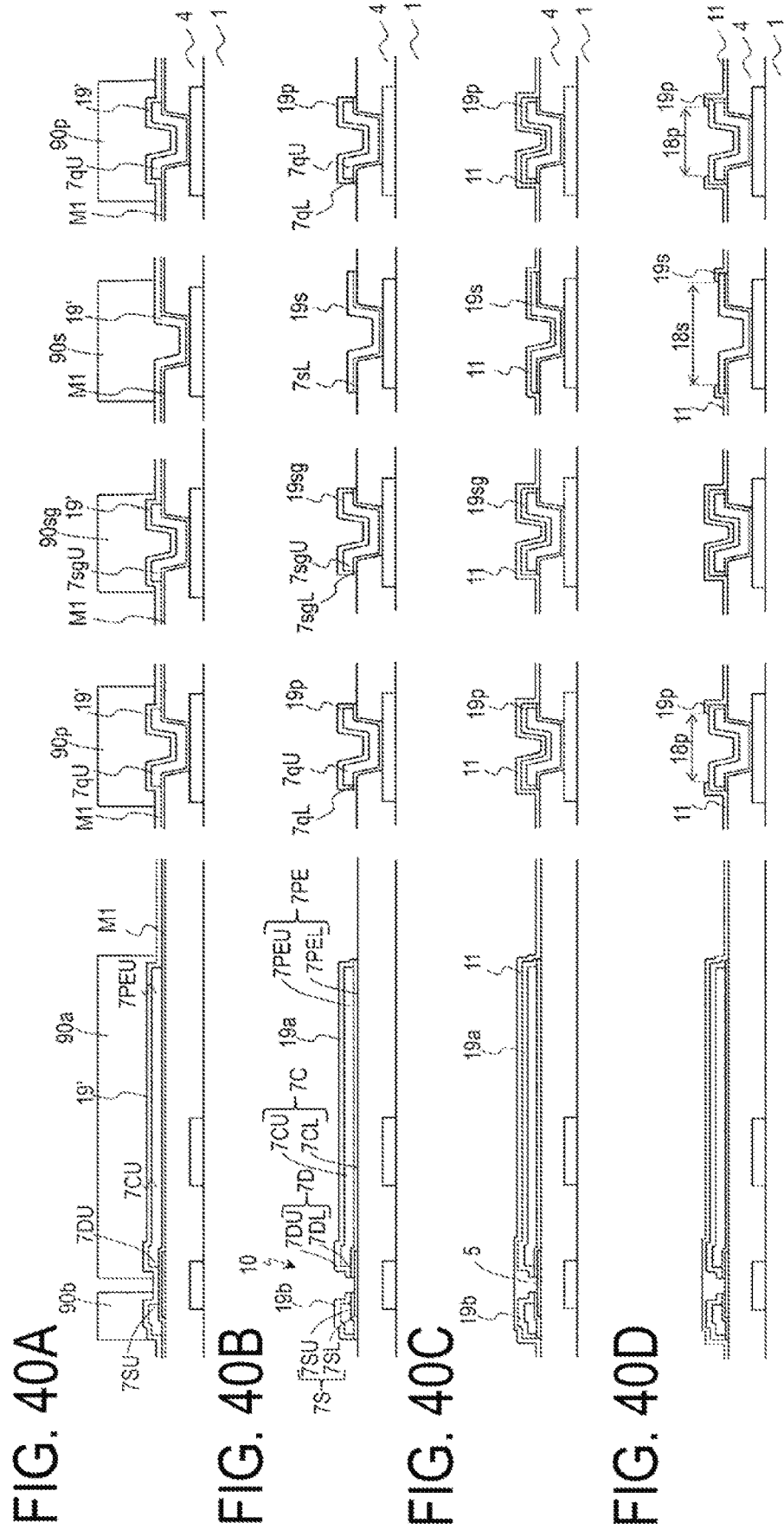

TFT SUBSTRATE, SCANNING ANTENNA PROVIDED WITH TFT SUBSTRATE AND METHOD FOR PRODUCING TFT SUBSTRATE

TECHNICAL FIELD

The disclosure relates to a scanning antenna, and particularly to a scanning antenna (also referred to as a "liquid crystal array antenna") provided with an antenna unit (also referred to as an "element antenna") having a liquid crystal capacitance, a TFT substrate used in such a scanning antenna, and a method for manufacturing such a TFT substrate.

BACKGROUND ART

Antennas for mobile communication and satellite broadcasting require functions that can change the beam direction (referred to as "beam scanning" or "beam steering"). As an example of an antenna (hereinafter referred to as a "scanning antenna", and may be referred to as "scanned antenna") having such functionality, phased array antennas equipped with antenna units are known. However, existing phased array antennas are expensive, which is an obstacle for popularization as a consumer product. In particular, as the number of antenna units increases, the cost rises considerably.

Therefore, scanning antennas that utilize the high dielectric anisotropy (birefringence) of liquid crystal materials (including nematic liquid crystals and polymer dispersed liquid crystals) have been proposed (PTL 1 to PTL 5 and NPL 1). Since the dielectric constant of liquid crystal materials has a frequency dispersion, in the present specification, the dielectric constant in a frequency band for microwaves (also referred to as the "dielectric constant for microwaves") is particularly denoted as "dielectric constant $M(\varepsilon_M)$".

PTL 3 and NPL 1 describe how an inexpensive scanning antenna can be obtained by using liquid crystal display (hereinafter referred to as "LCD") device technology.

CITATION LIST

Patent Literature

PTL 1: JP 2007-116573 A
PTL 2: JP 2007-295044 A
PTL 3: JP 2009-538565 A
PTL 4: JP 2013-539949 A
PTL 5: WO 2015-126550

Non Patent Literature

NPL 1: R. A. Stevenson et al., "Rethinking Wireless Communications: Advanced Antenna Design using LCD Technology", SID 2015 DIGEST, pp. 827-830.
NPL 2: M. ANDO et al., "A Radial Line Slot Antenna for 12 GHz Satellite TV Reception", IEEE Transactions of Antennas and Propagation, Vol. AP-33, No. 12, pp. 1347-1353 (1985).

SUMMARY

Technical Problem

As described above, although the idea of realizing an inexpensive scanning antenna by applying LCD technology is known, there are no documents that specifically describe the structure, the manufacturing method, and the driving method of scanning antennas using LCD technology.

Accordingly, an object of the disclosure is to provide a scanning antenna which can be mass-manufactured by utilizing the existing manufacturing techniques of LCDs, a TFT substrate used in such a scanning antenna, and a method for manufacturing such a TFT substrate.

Solution to Problem

A TFT substrate according to an embodiment of the disclosure includes a dielectric substrate; a transmission and/or reception region provided with a plurality of antenna unit regions arranged on the dielectric substrate, the plurality of antenna unit regions each including a TFT provided with a drain electrode, a gate electrode, and a source electrode, and a patch electrode connected with the drain electrode; a non-transmission and/or reception region positioned in a region other than the transmission and/or reception region: a gate metal layer supported by the dielectric substrate and including the gate electrode: a gate insulating layer formed on the gate metal layer; and a source metal layer formed on the gate insulating layer and including the source electrode, the drain electrode, and the patch electrode. The source metal layer includes a first metal layer that contains one of Ti, Mo, Ta, W, and Nb, and a second metal layer that is formed on the first metal layer and contains one of Cu, Al, Ag, and Au. The source electrode and the drain electrode each include the first metal layer and the second metal layer. Further, a distance from the first metal layer of the source electrode to the first metal layer of the drain electrode in a channel direction is less than a distance from the second metal layer of the source electrode to the second metal layer of the drain electrode in the channel direction.

In an embodiment, the patch electrode includes the first metal layer and the second metal layer, and a side surface of the first metal layer of the patch electrode and a side surface of the second metal layer of the patch electrode are not aligned on a side surface of the patch electrode.

In an embodiment, the TFT substrate further includes a first insulating layer formed on the source metal layer and provided with a first opening exposing at least a part of the patch electrode, and a transparent conductive section formed on the first insulating layer and inside the first opening, and covering at least a part of the patch electrode.

In an embodiment, the TFT substrate further includes a transfer terminal section in the non-transmission and/or reception region. The transfer terminal section includes a gate connection section formed from the same conductive film as the gate electrode, the gate insulating layer that extends over the gate connection section and is provided with a second opening exposing a part of the gate connection section, a source connection section provided with the first metal layer and the second metal layer, formed on the gate insulating layer and inside the second opening, and in contact with the gate connection section inside the second opening, the first insulating layer formed on the source connection section and provided with a third opening exposing a part of the source connection section, and a transparent conductive connection section formed on the first insulating layer and inside the third opening, and in contact with the source connection section inside the third opening.

In an embodiment, an edge of the second metal layer of the patch electrode is on an inner side of an edge of the first metal layer of the patch electrode when viewed from a normal direction of the dielectric substrate.

In an embodiment, the TFT substrate further includes a transparent conductive section formed on the source metal layer and in contact with an upper surface and a side surface of the second metal layer of the patch electrode, and a side surface of the first metal layer of the patch electrode and a side surface of the transparent conductive section are aligned on a side surface of the patch electrode.

In an embodiment, the TFT substrate further includes a first insulating layer formed on the transparent conductive section.

In an embodiment, the first insulating layer includes a first opening exposing at least a part of the transparent conductive section.

In an embodiment, the TFT substrate further includes a transfer terminal section in the non-transmission and/or reception region. The transfer terminal section includes a gate connection section formed from the same conductive film as the gate electrode, the gate insulating layer that extends over the gate connection section and is provided with a second opening exposing a part of the gate connection section, a source connection section provided with the first metal layer and the second metal layer, formed on the gate insulating layer and inside the second opening, and in contact with the gate connection section inside the second opening, a transparent conductive connection section formed on the source connection section, and the first insulating layer formed on the transparent conductive connection section and provided with a third opening exposing a part of the transparent conductive connection section.

In an embodiment, a side surface of the first metal layer of the source connection section and a side surface of the second metal layer of the source connection section are not aligned on a side surface of the source connection section.

In an embodiment, an edge of the second metal layer of the source connection section is on an inner side of an edge of the first metal layer of the source connection section when viewed from the normal direction of the dielectric substrate.

In an embodiment, a side surface of the first metal layer of the source connection section and a side surface of the transparent conductive connection section are aligned.

A scanning antenna according to an embodiment of the disclosure includes any of the TFT substrates described, a slot substrate disposed facing the TFT substrate, a liquid crystal layer provided between the TFT substrate and the slot substrate, and a reflective conductive plate disposed facing a surface of the slot substrate on a side opposite the liquid crystal layer via a dielectric layer. The slot substrate includes another dielectric substrate, and a slot electrode formed on a surface of the other dielectric substrate on the liquid crystal layer side. The slot electrode includes a plurality of slots. The plurality of slots are disposed correspondingly with the patch electrodes of the plurality of antenna unit regions of the TFT substrate.

A method for manufacturing a TFT substrate according to an embodiment of the disclosure is a method for manufacturing a TFT substrate including a transmission and/or reception region provided with a plurality of antenna unit regions, and a non-transmission and/or reception region positioned in a region other than the transmission and/or reception region, each of the plurality of antenna unit regions being provided with a TFT and a patch electrode. The manufacturing method includes the steps of (a) forming a gate conductive film on a dielectric substrate, and forming a plurality of gate bus lines and a gate electrode of the TFT by patterning the gate conductive film, (b) forming a gate insulating layer that covers the plurality of gate bus lines and the gate electrode, (c) forming a semiconductor layer of the TFT on the gate insulating layer, and (d) forming a source conductive film on the semiconductor layer and on the gate insulating layer, and forming a plurality of source bus lines, a source electrode and a drain electrode connected to the semiconductor layer, and the patch electrode by patterning the source conductive film.

In an embodiment, the step (d) further includes the steps of (d1) forming a first source conductive film containing one of Ti, Mo, Ta, W, and Nb on the semiconductor layer and the gate insulating layer, (d2) forming a second source conductive film containing one of Cu, Al, Ag, and Au on the first source conductive film, (d3) forming a first metal layer by patterning the first source conductive film, and (d4) forming a second metal layer by patterning the second source conductive film. The source electrode, the drain electrode, and the patch electrode each include the first metal layer and the second metal layer.

In an embodiment, the patterning of the step (d3) and the patterning of the step (d4) are performed using the same mask.

In an embodiment, the patterning of the step (d3) and the patterning of the step (d4) are performed using different masks.

In an embodiment, the step (d3) and the step (d4) include a step of forming the first metal layer and the second metal layer with a distance in a channel direction from the first metal layer of the source electrode to the first metal layer of the drain electrode being less than a distance in the channel direction from the second metal layer of the source electrode to the second metal layer of the drain electrode.

In an embodiment, the step (d) further includes the step of (d5) forming a transparent conductive film on the first source conductive film and on the second metal layer before the step (d1), after the steps (d2) and (d4), and before the step (d3); and the step (d3) includes a step of patterning the transparent conductive film and the first source conductive film using the same mask.

Advantageous Effects of Disclosure

According to an embodiment of the disclosure, there are provided a scanning antenna which can be mass-manufactured by utilizing the existing manufacturing techniques of LCDs, a TFT substrate used in such a scanning antenna, and a method for manufacturing such a TFT substrate.

BRIEF DESCRIPTION OF DRAWINGS

FIG. 18A to FIG. 18C, and FIG. 18E to FIG. 18G are each a diagram illustrating an example of a waveform of each signal used for driving the scanning antenna according to an embodiment, and FIG. 18D is a diagram illustrating a waveform of a display signal of an LCD panel performing dot inversion driving.

FIGS. 22A to 22E are each a schematic cross-sectional view of the TFT substrate 105.

FIG. 23AA to FIG. 23AF are each a process cross-sectional view illustrating an example of a manufacturing method of the TFT substrate 105.

FIG. 24A to FIG. 24C are each a schematic plan view illustrating a TFT substrate 105a of modification 1 of the fourth embodiment.

FIG. 25A to FIG. 25E are each a schematic cross-sectional view of the TFT substrate 105a.

FIG. 26AA to FIG. 26AF are each a process cross-sectional view illustrating an example of a manufacturing method of the TFT substrate 105a.

FIG. 26BG to FIG. 26BK are each a process cross-sectional view illustrating an example of a manufacturing method of the TFT substrate 105a.

FIG. 27A to FIG. 27C are each a schematic plan view illustrating a TFT substrate 105b of modification 1 of the fourth embodiment.

FIG. 28A to FIG. 28E are each a schematic cross-sectional view of the TFT substrate 105b.

FIG. 29AA to FIG. 29AG are each a process cross-sectional view illustrating an example of a manufacturing method of the TFT substrate 105b.

FIG. 29BH to FIG. 29BL are each a process cross-sectional view illustrating an example of a manufacturing method of the TFT substrate 105b.

FIG. 30A to FIG. 30E are each a schematic cross-sectional view of a TFT substrate 105c of modification 3 of the fourth embodiment.

FIG. 33A to FIG. 33E are each a schematic cross-sectional view of the TFT substrate 106.

FIG. 34AA to FIG. 34AG are each a process cross-sectional view illustrating an example of a manufacturing method of the TFT substrate 106.

FIG. 34BH to FIG. 34BL are each a process cross-sectional view illustrating an example of a manufacturing method of the TFT substrate 106.

FIG. 35A to FIG. 35C are each a schematic plan view illustrating a TFT substrate 107 of a sixth embodiment.

FIG. 36A to FIG. 36E are each a schematic cross-sectional view of the TFT substrate 107.

FIG. 37AA to FIG. 37AF are each a process cross-sectional view illustrating an example of a manufacturing method of the TFT substrate 107.

FIG. 37BG to FIG. 37BK are each a process cross-sectional view illustrating an example of a manufacturing method of the TFT substrate 107.

FIG. 39A to FIG. 39E are each a schematic cross-sectional view of the TFT substrate 107a.

FIG. 40A to FIG. 40D are each a process cross-sectional view illustrating an example of a manufacturing method of the TFT substrate 107a.

FIG. 41B is a schematic cross-sectional view of an LCD panel 900a.

DESCRIPTION OF EMBODIMENTS

Hereinafter, a scanning antenna and a manufacturing method thereof according to embodiments of the disclosure will be described with reference to the drawings. In the following description, first, the structure and manufacturing method of a known TFT-type LCD (hereinafter referred to as a "TFT-LCD") will be described. However, the description of matters well-known within the technical field of LCDs may be omitted. For a description of basic TFT-LCD technology, please refer to, for example, Liquid Crystals, Applications and Uses, Vol. 1-3 (Editor: Birenda Bahadur, Publisher: World Scientific Pub Co Inc), or the like. For reference, the entire contents of the disclosures of the above documents are incorporated herein.

The structure and operation of a typical transmissive TFT-LCD (hereinafter simply referred to as an "LCD") 900 will be described with reference to FIG. 41A and FIG. 41B. Here, an LCD 900 with a vertical electric field mode (for example, a TN mode or a vertical alignment mode) in which a voltage is applied in a thickness direction of a liquid crystal layer is provided as an example. The frame frequency (which is typically twice a polarity inversion frequency) of the voltage applied to the liquid crystal capacitance of the LCD is 240 Hz even at quad speed driving, and the dielectric constant c of the liquid crystal layer that serves as the dielectric layer of the liquid crystal capacitance of the LCD is different from the dielectric constant M ($\varepsilon_M$) of microwaves (for example, satellite broadcasting, the Ku band (from 12 to 18 GHz), the K band (from 18 to 26 GHz), and the Ka band (from 26 to 40 GHz)).

Figure 41A:
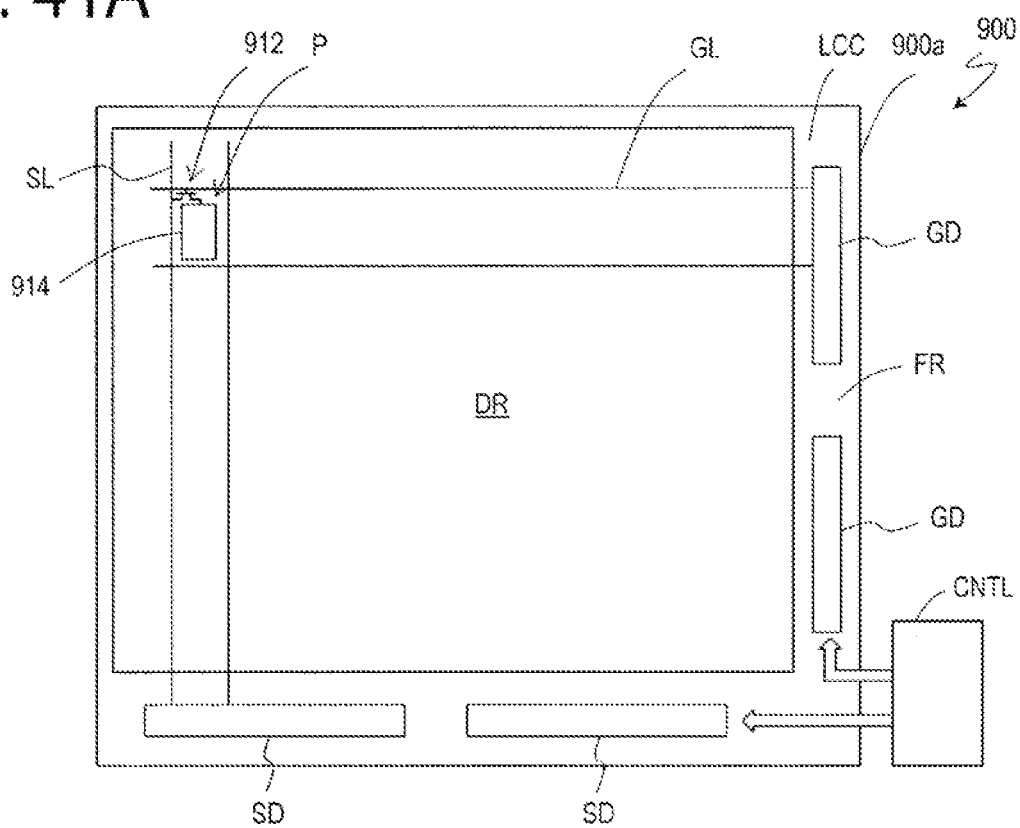
FIG. 41A is a schematic view illustrating a structure of an existing LCD 900.

As is schematically illustrated in FIG. 41A, the transmissive LCD 900 includes a liquid crystal display panel 900a, a control circuit CNTL, a backlight (not illustrated), a power supply circuit (not illustrated), and the like. The liquid crystal display panel 900a includes a liquid crystal display cell LCC and a driving circuit including a gate driver GD and a source driver SD. The driving circuit may be, for example, mounted on a TFT substrate 910 of the liquid crystal display cell LCC, or all or a part of the driving circuit may be integrated (monolithic integration) with the TFT substrate 910.

Figure 41B:
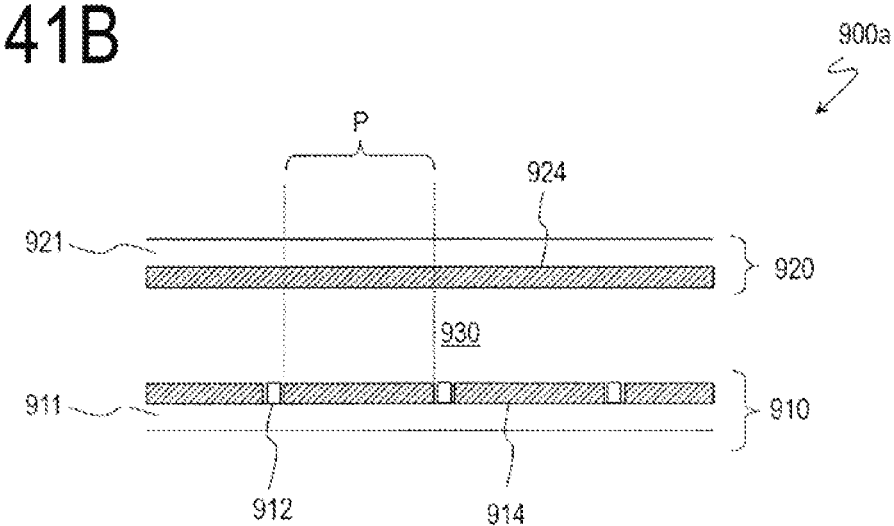

FIG. 41B illustrates a schematic cross-sectional view of the liquid crystal display panel (hereinafter referred to as an "LCD panel") 900a included in the LCD 900. The LCD panel 900a includes the TFT substrate 910, a counter substrate 920, and a liquid crystal layer 930 provided therebetween. Both the TFT substrate 910 and the counter substrate 920 include transparent substrates 911 and 921, such as glass substrates. In addition to glass substrates, plastic substrates may also be used as the transparent substrates 911 and 921 in some cases. The plastic substrates are formed of, for example, a transparent resin (for example, polyester) and a glass fiber (for example, nonwoven fabric).

A display region DR of the LCD panel 900a is configured of pixels P arranged in a matrix. A frame region FR that does not serve as part of the display is formed around the display region DR. The liquid crystal material is sealed in the display region DR by a sealing portion (not illustrated) formed surrounding the display region DR. The sealing portion is formed by curing a sealing material including, for example, an ultraviolet curable resin and a spacer (for example, resin beads or silica beads), and bonds and secures the TFT substrate 910 and the counter substrate 920 to each other. The spacer in the sealing material controls a gap between the TFT substrate 910 and the counter substrate 920, that is, a thickness of the liquid crystal layer 930, to be constant. To suppress an in-plane variation in the thickness of the liquid crystal layer 930, columnar spacers are formed on light blocking portions (for example, on a wiring line) in the display region DR by using an ultraviolet curable resin. In recent years, as seen in LCD panels for liquid crystal televisions and smart phones, a width of the frame region FR that does not serve as part of the display is very narrow.

In the TFT substrate 910, a TFT 912, a gate bus line (scanning line) GL, a source bus line (display signal line) SL, a pixel electrode 914, an auxiliary capacitance electrode (not illustrated), and a CS bus line (auxiliary capacity line) (not illustrated) are formed on the transparent substrate 911. The CS bus line is provided parallel to the gate bus line. Alternatively, the gate bus line of the next stage may be used as the CS bus line (CS on-gate structure).

The pixel electrode 914 is covered with an alignment film (for example, a polyimide film) for controlling the alignment of the liquid crystals. The alignment film is provided so as to be in contact with the liquid crystal layer 930. The TFT substrate 910 is often disposed on the backlight side (the side opposite to the viewer).

The counter substrate 920 is often disposed on the observer side of the liquid crystal layer 930. The counter substrate 920 includes a color filter layer (not illustrated), a counter electrode 924, and an alignment film (not illustrated) on the transparent substrate 921. Since the counter electrode 924 is provided in common to a plurality of pixels P constituting the display region DR, it is also referred to as a common electrode. The color filter layer includes a color filter (for example, a red filter, a green filter, and a blue filter) provided for each pixel P, and a black matrix (light shielding layer) for blocking light unnecessary for display. The black matrix is arranged, for example, so as to block lights between the pixels P in the display region DR and at the frame region FR.

The pixel electrode 914 of the TFT substrate 910, the counter electrode 924 of the counter substrate 920, and the liquid crystal layer 930 therebetween constitute a liquid crystal capacitance Clc. Individual liquid crystal capacitances correspond to the pixels. To retain the voltage applied to the liquid crystal capacitance Clc (so as to increase what is known as the voltage retention rate), an auxiliary capacitance CS electrically connected in parallel with the liquid crystal capacitance Clc is formed. The auxiliary capacitance CS is typically composed of an electrode having the same potential as the pixel electrode 914, an inorganic insulating layer (for example, a gate insulating layer ($SiO_2$ layer)), and an auxiliary capacitance electrode connected to the CS bus line. Typically, the same common voltage as the counter electrode 924 is supplied from the CS bus line.

Factors responsible for lowering the voltage (effective voltage) applied to the liquid crystal capacitance Clc are (1) those based on a CR time constant which is a product of a capacitance value $C_{Clc}$ of the liquid crystal capacitance Clc and a resistance value R. and (2) interfacial polarization due to ionic impurities included in the liquid crystal material and/or the orientation polarization of liquid crystal molecules. Among these, the contribution of the CR time constant of the liquid crystal capacitance Clc is large, and the CR time constant can be increased by providing an auxiliary capacitance CS electrically connected in parallel to the liquid crystal capacitance Clc. Note that a volume resistivity of the liquid crystal layer 930 that serves as the dielectric layer of the liquid crystal capacitance Clc exceeds the order of $10^{12}$ Ω·cm in the case of widely used nematic liquid crystal materials.

A display signal supplied to the pixel electrode 914 is a display signal that is supplied to the source bus line SL connected to the TFT 912 when the TFT 912 selected by a scanning signal supplied from the gate driver GD to the gate bus line GL is turned on. Accordingly, the TFTs 912 connected to a particular gate bus line GL are simultaneously turned on, and at that time, corresponding display signals are supplied from the source bus lines SL connected to the respective TFTs 912 of the pixels P in that row. By performing this operation sequentially from the first row (for example, the uppermost row of a display surface) to the mth row (for example, the lowermost row of the display surface), one image (frame) is written in the display region DR composed of m rows of pixels and is displayed. Assuming that the pixels P are arranged in a matrix of m rows and n columns, at least n source bus lines SL are provided in total such that at least one source bus line SL corresponds to each pixel column.

Such scanning is referred to as line-sequential scanning, a time between one pixel row being selected and the next pixel row being selected is called a horizontal scan period, (1H), and a time between a particular row being selected and then being selected a second time is called a vertical scanning period, (1V), or a frame. Note that, in general, 1V (or 1 frame) is obtained by adding the blanking period to the period m·H for selecting all m pixel rows.

For example, when an input video signal is an NTSC signal, 1V (=1 frame) of an existing LCD panel is 1/60 of a second (16.7 milliseconds). The NTSC signals are interlaced signals, the frame frequency is 30 Hz, and the field frequency is 60 Hz, but in LCD panels, since it is necessary to supply display signals to all the pixels in each field, they are driven with 1V=(1/60) second (driven at 60 Hz). Note that, in recent years, to improve the video display characteristics, there are LCD panels driven at double speed drive (120 Hz drive, 1V=(1/120) second)), and some LCD panels are driven at quad speed (240 Hz drive, 1V=(1/240) second)) for 3D displays.

When a DC voltage is applied to the liquid crystal layer 930, the effective voltage decreases and the luminance of the pixel P decreases. Since the above-mentioned interface polarization and/or the orientation polarization contribute to the decrease in the effective voltage, it is difficult for the auxiliary capacitance CS to prevent the decrease in the effective voltage completely. For example, when a display signal corresponding to a particular intermediate gray scale is written into every pixel in every frame, the luminance fluctuates for each frame and is observed as flicker. In addition, when a DC voltage is applied to the liquid crystal layer 930 for an extended period of time, electrolysis of the liquid crystal material may occur. Furthermore, impurity ions segregate at one side of the electrode, so that the effective voltage may not be applied to the liquid crystal layer and the liquid crystal molecules may not move. To prevent this, the LCD panel 900a is subjected to so-called AC driving. Typically, frame-reversal driving is performed in which the polarity of the display signal is inverted every frame (every vertical scanning period). For example, in existing LCD panels, the polarity inversion is performed every 1/60 second (a polarity inversion period is 30 Hz).

In addition, dot inversion driving, line reversal driving, or the like is performed in order to uniformly distribute the pixels having different polarities of applied voltages even within one frame. This is because it is difficult to completely match the magnitude of the effective voltage applied to the liquid crystal layer between a positive polarity and a negative polarity. For example, in a case where the volume resistivity of the liquid crystal material exceeds the order of $10^{12}$ Ω·cm, flicker is hardly recognizable in a case where the dot inversion or line reversal driving is performed every 1/60 second.

The scanning signal and the display signal in the LCD panel 900a is supplied from the gate driver GD and the source driver SD to the gate bus line GL and the source bus line SL, respectively, on the basis of the signals supplied from the control circuit CNTL to the gate driver GD and the source driver SD. For example, the gate driver GD and the source driver SD are each connected to corresponding terminals provided on the TFT substrate 910. The gate driver GD and the source driver SD may be mounted on the frame region FR of the TFT substrate 910 as a driver IC, for example, or may be monolithically formed in the frame region FR of the TFT substrate 910.

The counter electrode 924 of the counter substrate 920 is electrically connected to a terminal (not illustrated) of the TFT substrate 910 with a conductive portion (not illustrated) known as a transfer therebetween. The transfer is formed, for example, so as to overlap with the sealing portion, or alternatively so as to impart conductivity to a part of the sealing portion. This is done to narrow the frame region FR. A common voltage is directly or indirectly supplied to the counter electrode 924 from the control circuit CNTL. Typically, the common voltage is also supplied to the CS bus line as described above.

Basic Structure of Scanning Antenna

By controlling the voltage applied to each liquid crystal layer of each antenna unit corresponding to the pixels of the LCD panel and changing the effective dielectric constant M ($\varepsilon_M$) of the liquid crystal layer for each antenna unit, a scanning antenna equipped with an antenna unit that uses the anisotropy (birefringence index) of a large dielectric constant M ($\varepsilon_M$) of a liquid crystal material forms a two-dimensional pattern by antenna units with different electrostatic capacitances (corresponding to displaying of an image by an LCD). An electromagnetic wave (for example, a microwave) emitted from an antenna or received by an antenna is given a phase difference depending on the electrostatic capacitance of each antenna unit, and gains a strong directivity in a particular direction depending on the two-dimensional pattern formed by the antenna units having different electrostatic capacitances (beam scanning). For example, an electromagnetic wave emitted from an antenna is obtained by integrating, with consideration for the phase difference provided by each antenna unit, spherical waves obtained as a result of input electromagnetic waves entering each antenna unit and being scattered by each antenna unit. It can be considered that each antenna unit functions as a "phase shifter". For a description of the basic structure and operating principles of a scanning antenna that uses a liquid crystal material, refer to PTL 1 to PTL 4 as well as NPL 1 and NPL 2. NPL 2 discloses the basic structure of a scanning antenna in which spiral slots are arranged. For reference, the entire contents of the disclosures of PTL 1 to PTL 4 as well as NPL 1 and NPL 2 are incorporated herein.

Note that although the antenna units in the scanning antenna according to the embodiments of the disclosure are similar to the pixels of the LCD panel, the structure of the antenna units is different from the structure of the pixel of the LCD panel, and the arrangement of the plurality of antenna units is also different from the arrangement of the pixels in the LCD panel. A basic structure of the scanning antenna according to the embodiments of the disclosure will be described with reference to FIG. 1, which illustrates a scanning antenna 1000 of a first embodiment to be described in detail later. Although the scanning antenna 1000 is a radial in-line slot antenna in which slots are concentrically arranged, the scanning antennas according to the embodiments of the disclosure are not limited to this. For example, the arrangement of the slots may be any of various known arrangements. In particular, for the arrangement of the slots and/or antenna units, the entire disclosure of PTL 5 is incorporated herein by reference in its entirety.

Figure 1:
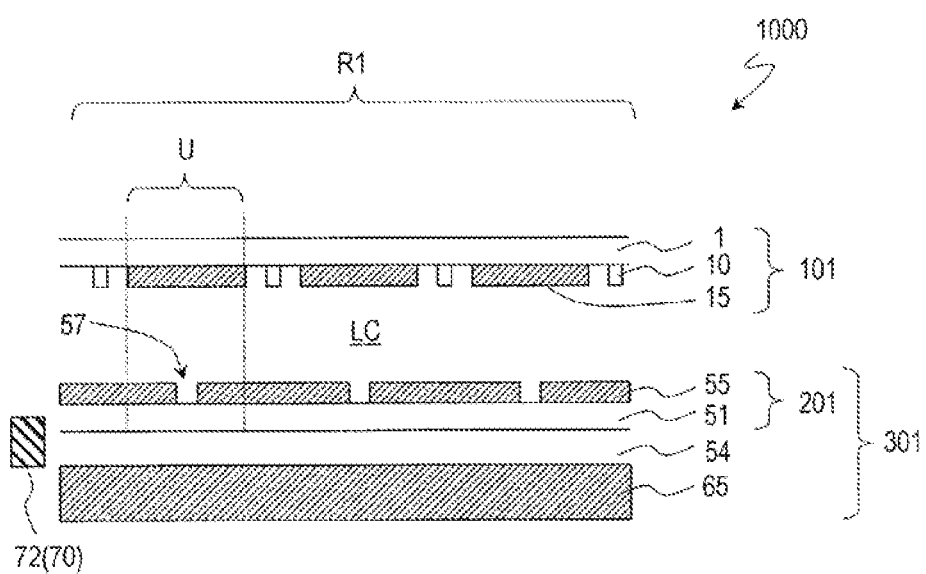
FIG. 1 is a cross-sectional view schematically illustrating a portion of a scanning antenna 1000 according to a first embodiment.

FIG. 1 is a cross-sectional view schematically illustrating a portion of the scanning antenna 1000 of the present embodiment, and schematically illustrates a part of the cross-section along the radial direction from a power feed pin 72 (see FIG. 2B) provided near the center of the concentrically arranged slots.

The scanning antenna 1000 includes a TFT substrate 101, a slot substrate 201, a liquid crystal layer LC provided therebetween, and a reflective conductive plate 65 opposing the slot substrate 201 with an air layer 54 interposed between the slot substrate 201 and the reflective conductive plate 65. The scanning antenna 1000 transmits and receives microwaves from a side closer to the TFT substrate 101.

The TFT substrate 101 includes a dielectric substrate 1 such as a glass substrate, a plurality of patch electrodes 15, and a plurality of TFTs 10 formed on the dielectric substrate 1. Each patch electrode 15 is connected to a corresponding TFT 10. Each TFT 10 is connected to a gate bus line and a source bus line.

The slot substrate 201 includes a dielectric substrate 51 such as a glass substrate and a slot electrode 55 formed on a side of the dielectric substrate 51 closer to the liquid crystal layer LC. The slot electrode 55 includes a plurality of slots 57.

The reflective conductive plate 65 is disposed opposing the slot substrate 201 with the air layer 54 interposed between the reflective conductive plate 65 and the slot substrate 201. In place of the air layer 54, a layer formed of a dielectric (for example, a fluorine resin such as polytetrafluoroethylene (PTFE)) having a small dielectric constant M for microwaves can be used. The slot electrode 55, the reflective conductive plate 65, and the dielectric substrate 51 and the air layer 54 therebetween function as a waveguide 301.

Figure 17:
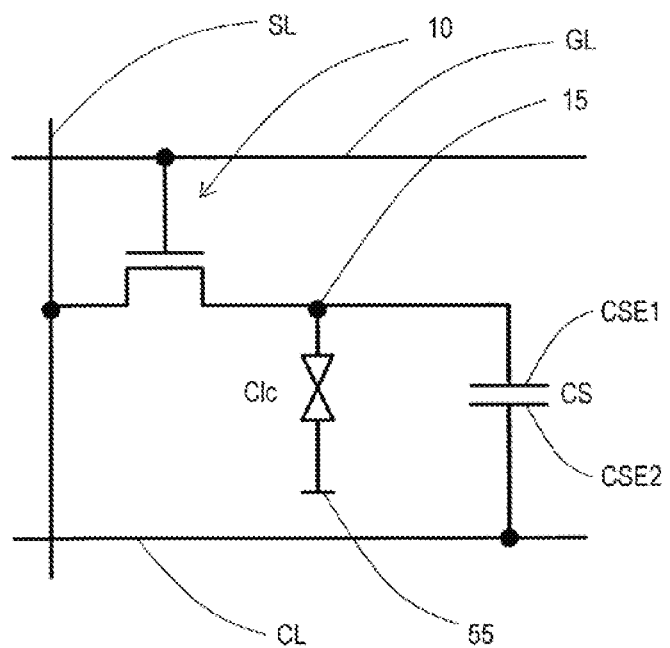
FIG. 17 is a diagram illustrating an equivalent circuit of one antenna unit in a scanning antenna according to an embodiment of the disclosure.

The patch electrode 15, the portion of the slot electrode 55 including the slot 57, and the liquid crystal layer LC therebetween constitute an antenna unit U. In each antenna unit U, one patch electrode 15 is opposed to a portion of the slot electrode 55 including one slot 57 with a liquid crystal layer LC interposed therebetween, thereby constituting the liquid crystal capacitance. The structure in which the patch electrode 15 and the slot electrode 55 oppose each other with the liquid crystal layer LC interposed therebetween is similar to the structure illustrated in FIG. 41A and FIG. 41B in which the pixel electrode 914 and the counter electrode 924 of the LCD panel 900a oppose each other with the liquid crystal layer 930 interposed therebetween. That is, the antenna unit U of the scanning antenna 1000 and the pixel P of the LCD panel 900a have a similar configuration. In addition, the antenna unit has a configuration similar to the pixel P in the LCD panel 900a in that the antenna unit has an auxiliary capacitance electrically connected in parallel with the liquid crystal capacitance (see FIG. 13A and FIG. 17). However, the scanning antenna 1000 has many differences from the LCD panel 900a.

First, the performance required for the dielectric substrates 1 and 51 of the scanning antenna 1000 is different from the performance required for the substrate of the LCD panel.

Generally, transparent substrates that are transparent to visible light are used for LCD panels. For example, glass substrates or plastic substrates are used. In reflective LCD panels, since the substrate on the back side does not need transparency, a semiconductor substrate may be used in some cases. In contrast to this, it is preferable for the dielectric substrates 1 and 51 used for the antennas to have small dielectric losses with respect to microwaves (where the dielectric tangent with respect to microwaves is denoted as $\tan \delta_M$). The $\tan \delta_M$ of each of the dielectric substrates 1 and 51 is preferably approximately less than or equal to 0.03, and more preferably less than or equal to 0.01. Specifically, a glass substrate or a plastic substrate can be used. Glass substrates are superior to plastic substrates with respect to dimensional stability and heat resistance, and are suitable for forming circuit elements such as TFTs, a wiring line, and electrodes using LCD technology. For example, in a case where the materials forming the waveguide are air and glass, as the dielectric loss of glass is greater, from the viewpoint that thinner glass can reduce the waveguide loss, it is preferable for the thickness to be less than or equal to 400 µm, and more preferably less than or equal to 300 µm. There is no particular lower limit, provided that the glass can be handled such that it does not break in the manufacturing process.

The conductive material used for the electrode is also different. In many cases, an ITO film is used as a transparent conductive film for pixel electrodes and counter electrodes of LCD panels. However, ITO has a large $\tan \delta_M$ with respect to microwaves, and as such cannot be used as the conductive layer in an antenna. The slot electrode 55 functions as a wall for the waveguide 301 together with the reflective conductive plate 65. Accordingly, to suppress the transmission of microwaves in the wall of the waveguide 301, it is preferable that the thickness of the wall of the waveguide 301, that is, the thickness of the metal layer (Cu layer or Al layer) be large. It is known that in a case where the thickness of the metal layer is three times the skin depth, electromagnetic waves are attenuated to 1/20 (−26 dB), and in a case where the thickness is five times the skin depth, electromagnetic waves are attenuated to about 1/150 (−43 dB). Accordingly, in a case where the thickness of the metal layer is five times the skin depth, the transmittance of electromagnetic waves can be reduced to 1%. For example, for a microwave of 10 GHz, in a case where a Cu layer having a thickness of greater than or equal to 3.3 µm and an Al layer having a thickness of greater than or equal to 4.0 µm are used, microwaves can be reduced to 1/150. In addition, for a microwave of 30 GHz, in a case where a Cu layer having a thickness of greater than or equal to 1.9 µm and an Al layer having a thickness of greater than or equal to 2.3 µm are used, microwaves can be reduced to 1/150. In this way, the slot electrode 55 is preferably formed of a relatively thick Cu layer or Al layer. There is no particular upper limit for the thickness of the Cu layer or the Al layer, and the thicknesses can be set appropriately in consideration of the time and cost of film formation. The usage of a Cu layer provides the advantage of being thinner than the case of using an Al layer. Relatively thick Cu layers or Al layers can be formed not only by the thin film deposition method used in LCD manufacturing processes, but also by other methods such as bonding Cu foil or Al foil to the substrate. The thickness of the metal layer, for example, ranges from 2 µm to 30 µm. When the thin film deposition methods are used, the thickness of the metal layer is preferably less than or equal to 5 µm. Note that aluminum plates, copper plates, or the like having a thickness of several mm can be used as the reflective conductive plate 65, for example.

Since the patch electrode 15 does not configure the waveguide 301 like the slot electrode 55, a Cu layer or an Al layer can be used that have a smaller thickness than that of the slot electrode 55. However, the patch electrode 15 preferably has a low resistance in order to avoid loss resulting from the oscillation of free electrons near the slot 57 of the slot electrode 55 changing to heat when inducing oscillation of free electrons in the patch electrode 15. From the viewpoint of mass production, an Al layer is preferably used rather than a Cu layer, and the thickness of the Al layer is preferably from 0.3 to 2 µm, for example.

In addition, an arrangement pitch of the antenna units U is considerably different from that of a pixel pitch. For example, considering an antenna for microwaves of 12 GHz (Ku band), the wavelength λ is 25 mm, for example. Then, as described in PTL 4, since the pitch of the antenna unit U is less than or equal to λ/4 and/or less than or equal to λ/5, the arrangement pitch becomes less than or equal to 6.25 mm and/or less than or equal to 5 mm. This is ten times greater than the pixel pitch of the LCD panel. Accordingly, the length and width of the antenna unit U are also roughly ten times greater than the pixel length and width of the LCD panel.

Of course, the arrangement of the antenna units U may be different from the arrangement of the pixels in the LCD panel. Herein, although an example is illustrated in which the antenna units U are arranged in concentric circles (for example, refer to JP 2002-217640 A), the present disclosure is not limited thereto, and the antenna units may be arranged in a spiral shape as described in NPL 2, for example. Furthermore, the antenna units may be arranged in a matrix as described in PTL 4.

The properties required for the liquid crystal material of the liquid crystal layer LC of the scanning antenna 1000 are different from the properties required for the liquid crystal material of the LCD panel. In the LCD panel, a change in a refractive index of the liquid crystal layer of the pixels allows a phase difference to be provided to the polarized visible light (wavelength of from 380 nm to 830 nm) such that the polarization state is changed (for example, the change in the refractive index allows the polarization axis direction of linearly polarized light to be rotated or the degree of circular polarization of circularly polarized light to be changed), whereby display is performed. In contrast, in the scanning antenna 1000 according to the embodiment, the phase of the microwave excited (re-radiated) from each patch electrode is changed by changing the electrostatic capacitance value of the liquid crystal capacitance of the antenna unit U. Accordingly, the liquid crystal layer preferably has a large anisotropy ($\Delta\varepsilon_M$) of the dielectric constant M ($\varepsilon_M$) for microwaves, and tan $\delta_M$ is preferably small. For example, the $\Delta\varepsilon_M$ of greater than or equal to 4 and tan $\delta_M$ of less than or equal to 0.02 (values of 19 GHz in both cases) described in SID 2015 DIGEST pp. 824-826 written by M. Witteck et al, can be suitably used. In addition, it is possible to use a liquid crystal material having a $\Delta\varepsilon_M$ of greater than or equal to 0.4 and tan $\delta_M$ of less than or equal to 0.04 as described in POLYMERS 55 vol. August issue pp. 599-602 (2006), written by Kuki.

In general, the dielectric constant of a liquid crystal material has a frequency dispersion, but the dielectric anisotropy $\Delta\varepsilon_M$ for microwaves has a positive correlation with the refractive index anisotropy $\Delta n$ with respect to visible light. Accordingly, it can be said that a material having a large refractive index anisotropy $\Delta n$ with respect to visible light is preferable as a liquid crystal material for an antenna unit for microwaves. The refractive index anisotropy $\Delta n$ of the liquid crystal material for LCDs is evaluated by the refractive index anisotropy for light having a wavelength of 550 nm. Here again, when a $\Delta n$ (birefringence index) is used as an index for light having a wavelength of 550 nm, a nematic liquid crystal having a $\Delta n$ of greater than or equal to 0.3, preferably greater than or equal to 0.4, can be used for an antenna unit for microwaves. $\Delta n$ has no particular upper limit. However, since liquid crystal materials having a large $\Delta n$ tend to have a strong polarity, there is a possibility that reliability may decrease. From the viewpoint of reliability, $\Delta n$ is preferably less than or equal to 0.4. The thickness of the liquid crystal layer is, for example, from 1 μm to 500 μm.

Hereinafter, the structure and manufacturing method of the scanning antenna according to the embodiments of the disclosure will be described in more detail.

First Embodiment

Figure 2A:
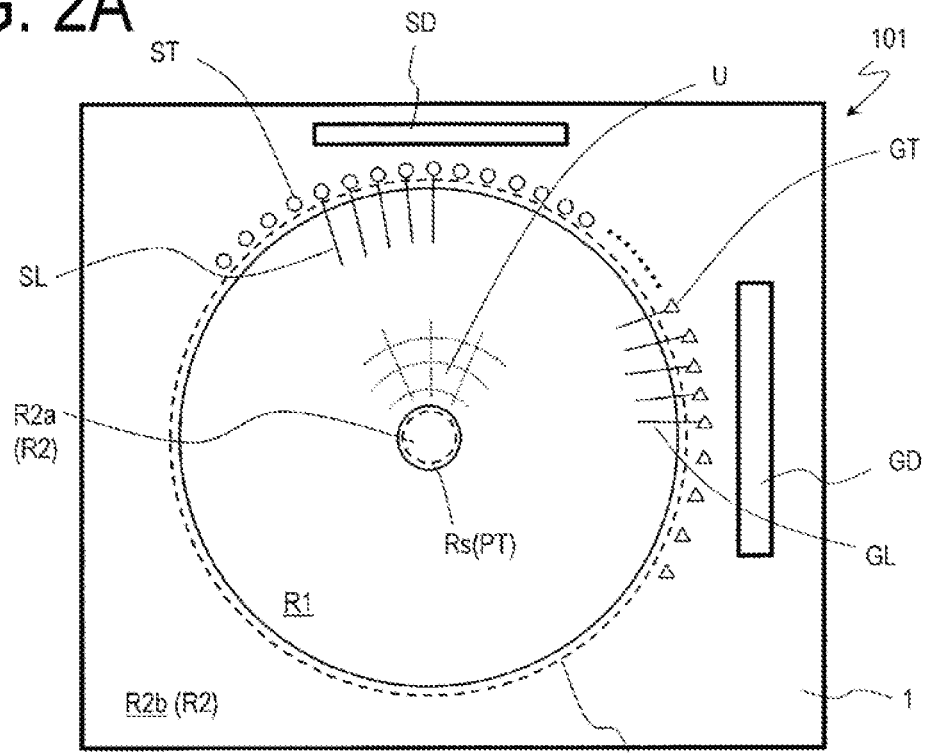
FIG. 2A and FIG. 2B are schematic plan views illustrating a TFT substrate 101 and a slot substrate 201 in the scanning antenna 1000, respectively.
Figure 2B:
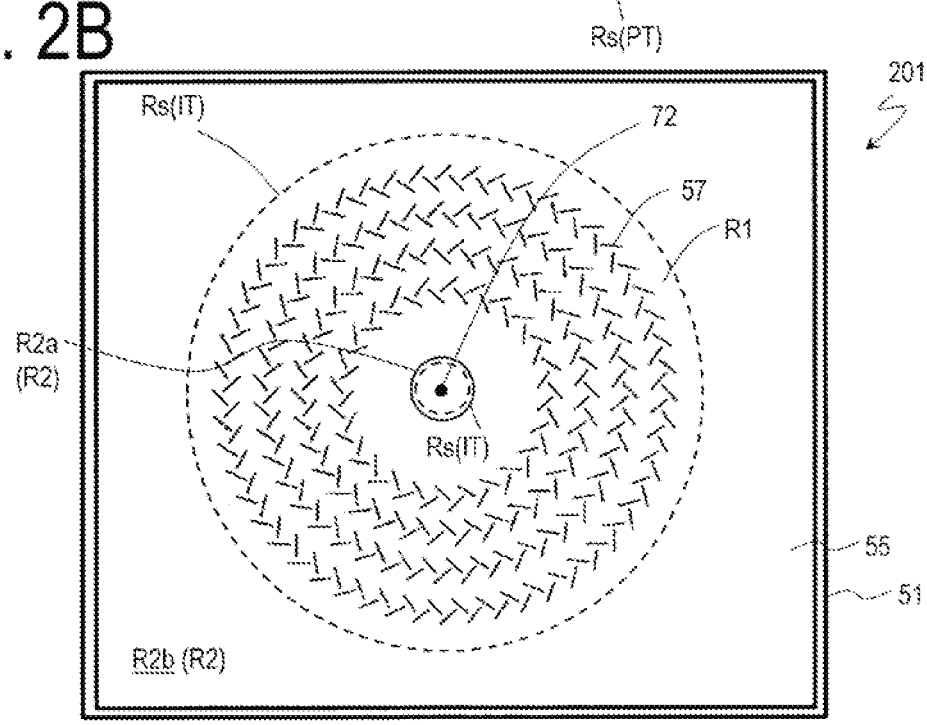

First, a description is given with reference to FIG. 1 and FIGS. 2A and 2B. FIG. 1 is a schematic partial cross-sectional view of the scanning antenna 1000 near the center thereof as described above, and FIG. 2A and FIG. 2B are schematic plan views illustrating the TFT substrate 101 and the slot substrate 201 in the scanning antenna 1000, respectively.

The scanning antenna 1000 includes a plurality of antenna units U arranged two-dimensionally. In the scanning antenna 1000 exemplified here, the plurality of antenna units are arranged concentrically. In the following description, the region of the TFT substrate 101 and the region of the slot substrate 201 corresponding to the antenna unit U will be referred to as "antenna unit region", and be denoted with the same reference numeral U as the antenna unit. In addition, as illustrated in FIG. 2A and FIG. 2B, in the TFT substrate 101 and the slot substrate 201, a region defined by the plurality of two-dimensionally arranged antenna unit regions is referred to as "transmission and/or reception region R1", and a region other than the transmission and/or reception region R1 is called a "non-transmission and/or reception region R2". A terminal section, a drive circuit, and the like are provided in the non-transmission and/or reception region R2.

FIG. 2A is a schematic plan view illustrating the TFT substrate 101 in the scanning antenna 1000.

In the illustrated example, the transmission and/or reception region R1 has a donut-shape when viewed from a normal direction of the TFT substrate 101. The non-transmission and/or reception region R2 includes a first non-transmission and/or reception region R2a located at the center of the transmission and/or reception region R1 and a second non-transmission and/or reception region R2b located at the periphery of the transmission and/or reception region R1. An outer diameter of the transmission and/or reception region R1, for example, is from 200 mm to 1500 mm, and is configured according to a data traffic volume or the like.

A plurality of gate bus lines GL and a plurality of source bus lines SL supported on the dielectric substrate 1 are provided in the transmission and/or reception region R1 of the TFT substrate 101, and the antenna unit regions U are defined by these wiring lines. The antenna unit regions U are, for example, arranged concentrically in the transmission and/or reception region R1. Each of the antenna unit regions U includes a TFT and a patch electrode electrically connected to the TFT. The source electrode of the TFT is electrically connected to the source bus line SL, and the gate electrode is electrically connected to the gate bus line GL. In addition, a drain electrode is electrically connected to the patch electrode.

In the non-transmission and/or reception region R2 (R2a, R2b), a seal region Rs is disposed surrounding the transmission and/or reception region R1. A sealing material (not illustrated) is applied to the seal region Rs. The sealing material bonds the TFT substrate 101 and the slot substrate 201 to each other, and also encloses liquid crystals between these substrates 101, 201.

A gate terminal section GT, the gate driver GD, a source terminal section ST, and the source driver SD are provided outside the sealing region Rs in the non-transmission and/or reception region R2. Each of the gate bus lines GL is connected to the gate driver GD with the gate terminal section GT therebetween. Each of the source bus lines SL is connected to the source driver SD with the source terminal section ST therebetween. Note that, in this example, although the source driver SD and the gate driver GD are formed on the dielectric substrate 1, one or both of these drivers may be provided on another dielectric substrate.

Also, a plurality of transfer terminal sections PT are provided in the non-transmission and/or reception region R2. The transfer terminal section PT is electrically connected to the slot electrode 55 (FIG. 2B) of the slot substrate 201. In the present specification, the connection section between the transfer terminal section PT and the slot electrode 55 is referred to as a "transfer section". As illustrated in drawings, the transfer terminal section PT (transfer section) may be disposed in the seal region Rs. In this case, a resin containing conductive particles may be used as the sealing material. In this way, liquid crystals are sealed between the TFT substrate 101 and the slot substrate 201, and an electrical connection can be secured between the transfer terminal section PT and the slot electrode 55 of the slot substrate 201. In this example, although the transfer terminal section PT is disposed in both the first non-transmission and/or reception region R2a and the second non-transmission and/or reception region R2b, the transfer terminal section PT may be disposed in only one of them.

Note that the transfer terminal section PT (transfer section) need not be disposed in the seal region Rs. For example, the transfer terminal unit PT may be disposed outside the seal region Rs in the non-transmission and/or reception region R2.

FIG. 2B is a schematic plan view illustrating the slot substrate 201 in the scanning antenna 1000, and illustrates the surface of the slot substrate 201 closer to the liquid crystal layer LC.

In the slot substrate 201, the slot electrode 55 is formed on the dielectric substrate 51 extending across the transmission and/or reception region R1 and the non-transmission and/or reception region R2.

In the transmission and/or reception region R1 of the slot substrate 201, a plurality of slots 57 are formed in the slot electrode 55. The slot 57 is formed corresponding to the antenna unit region U on the TFT substrate 101. For the plurality of slots 57 in the illustrated example, a pair of slots 57 extending in directions substantially orthogonal to each other are concentrically disposed so that a radial inline slot antenna is configured. Since the scanning antenna 1000 includes slots that are substantially orthogonal to each other, the scanning antenna 1000 can transmit and receive circularly polarized waves.

A plurality of terminal sections IT of the slot electrode 55 are provided in the non-transmission and/or reception region R2. The terminal section IT is electrically connected to the transfer terminal section PT (FIG. 2A) of the TFT substrate 101. In this example, the terminal section IT is disposed within the seal region Rs, and is electrically connected to the corresponding transfer terminal section PT by a sealing material containing conductive particles.

In addition, the power feed pin 72 is disposed on a rear surface side of the slot substrate 201 in the first non-transmission and/or reception region R2a. The power feed pin 72 allows microwaves to be inserted into the waveguide 301 constituted by the slot electrode 55, the reflective conductive plate 65, and the dielectric substrate 51. The power feed pin 72 is connected to a power feed device 70. Power feeding is performed from the center of the concentric circle in which the slots 57 are arranged. The power feed method may be either a direct coupling power feed method or an electromagnetic coupling method, and a known power feed structure can be utilized.

While FIGS. 2A and 2B illustrate an example in which the seal region Rs is provided so as to surround a relatively narrow region including the transmission and/or reception region R1, the seal region Rs is not limited thereto. In particular, the seal region Rs provided to the outer side of the transmission and/or reception region may be provided at or near the sides of the dielectric substrate 1 and/or the dielectric substrate 51, for example, to create a certain distance or greater from the transmission and/or reception region R1. Of course, the terminal section and the driving circuit, for example, provided to the non-transmission and/or reception region R2 may be formed on the outer side (that is, the side on which the liquid crystal layer is not present) of the seal region Rs. With the seal region Rs formed in a position a certain distance or greater from the transmission and/or reception region R1, it is possible to suppress a decrease in antenna characteristics caused by the effects of impurities (ionic impurities, in particular) contained in the sealing member (curing resin, in particular).

Figure 3A:
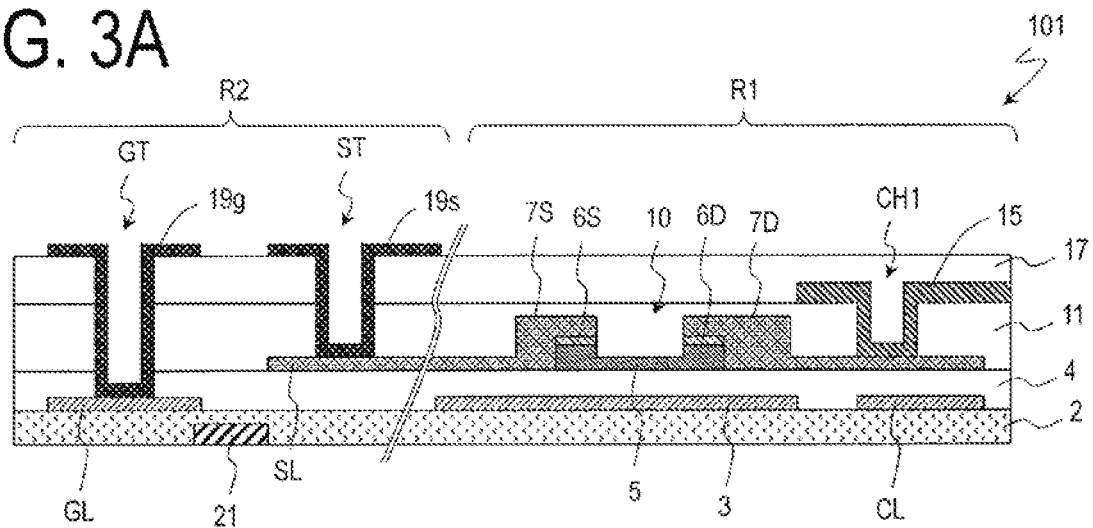
FIG. 3A and FIG. 3B are a cross-sectional view and a plane view schematically illustrating an antenna unit region U of the TFT substrate 101, respectively.
Figure 3B:
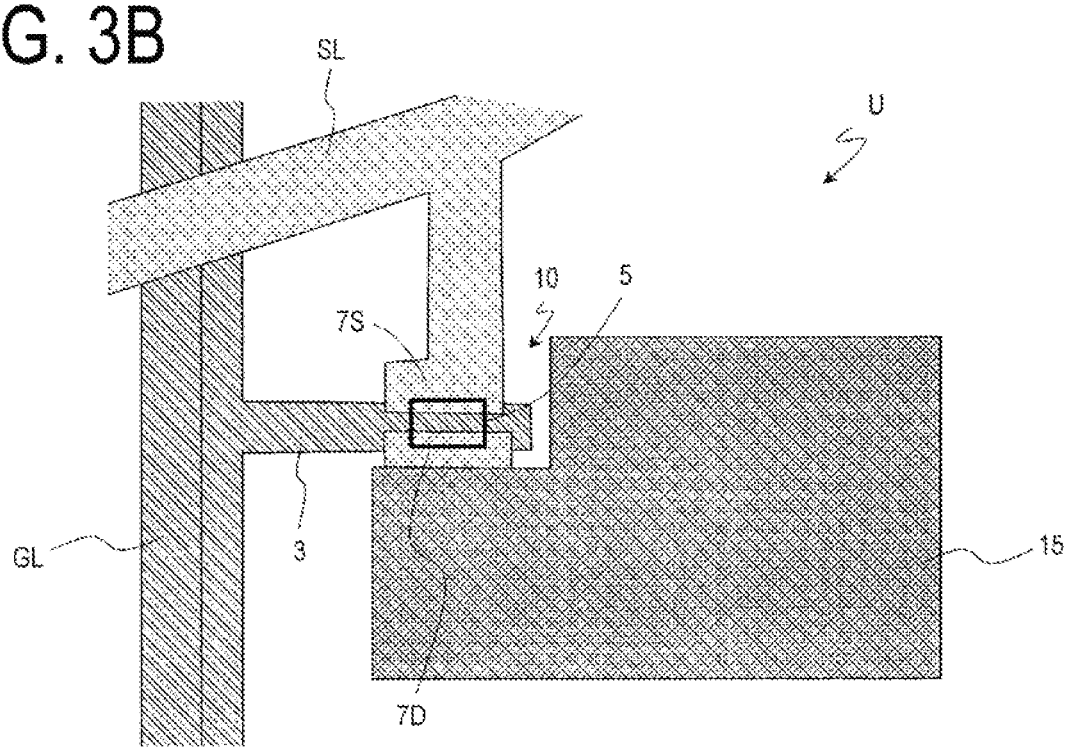

In the following, each component of the scanning antenna 1000 will be described in detail with reference to drawings.
Structure of TFT Substrate 101
Antenna Unit Region U FIG. 3A and FIG. 3B are a cross-sectional view and a plane view schematically illustrating the antenna unit region U of the TFT substrate 101, respectively.

Each of the antenna unit regions U includes a dielectric substrate (not illustrated), a TFT 10 supported on the dielectric substrate, a first insulating layer 11 covering the TFT 10, a patch electrode 15 formed on the first insulating layer 11 and electrically connected to the TFT 10, and a second insulating layer 17 covering the patch electrode 15. The TFT 10 is disposed, for example, at or near an intersection of the gate bus line GL and the source bus line SL.

The TFT 10 include a gate electrode 3, an island-shaped semiconductor layer 5, a gate insulating layer 4 disposed between the gate electrode 3 and the semiconductor layer 5, a source electrode 7S, and a drain electrode 7D. The structure of the TFT 10 is not particularly limited to a specific structure. In this example, the TFT 10 is a channel etch-type TFT having a bottom gate structure.

The gate electrode 3 is electrically connected to the gate bus line GL, and a scanning signal is supplied via the gate bus line GL. The source electrode 7S is electrically connected to the source bus line SL, and a data signal is supplied via the source bus line SL. The gate electrode 3 and the gate bus line GL may be formed of the same conductive film (gate conductive film). The source electrode 7S, the drain electrode 7D, and the source bus line SL may be formed from the same conductive film (source conductive film). The gate conductive film and the source conductive film are, for example, metal films. In the present specification, layers formed using a gate conductive film may be referred to as "gate metal layers", and layers formed using a source conductive film may be referred to as "source metal layers".

The semiconductor layer 5 is disposed overlapping with the gate electrode 3 with the gate insulating layer 4 interposed therebetween. In the illustrated example, a source contact layer 6S and a drain contact layer 6D are formed on the semiconductor layer 5. The source contact layer 6S and the drain contact layer 6D are disposed on both sides of a region where a channel is formed in the semiconductor layer 5 (channel region). The semiconductor layer 5 may be an intrinsic amorphous silicon (i-a-Si) layer, and the source contact layer 6S and the drain contact layer 6D may be n+ type amorphous silicon (n+-a-Si) layers.

The source electrode 7S is provided in contact with the source contact layer 6S and is connected to the semiconductor layer 5 with the source contact layer 6S interposed therebetween. The drain electrode 7D is provided in contact with the drain contact layer 6D and is connected to the semiconductor layer 5 with the drain contact layer 6D interposed therebetween.

The first insulating layer 11 includes a contact hole CH1 that at least reaches the drain electrode 7D of the TFT 10.

The patch electrode 15 is provided on the first insulating layer 11 and within the contact hole CH1, and is in contact with the drain electrode 7D in the contact hole CH1. The patch electrode 15 includes a metal layer. The patch electrode 15 may be a metal electrode formed only from a metal layer. The material of the patch electrode 15 may be the same as that of the source electrode 7S and the drain electrode 7D. However, a thickness of the metal layer in the patch electrode 15 (a thickness of the patch electrode 15 when the patch electrode 15 is a metal electrode) is set to be greater than thicknesses of the source electrode 7S and the drain electrode 7D. The thickness of the metal layer in the patch electrode 15 in the case of being formed using an Al layer is set to, for example, greater than or equal to 0.3 µm.

A CS bus line CL may be provided using the same conductive film as that of the gate bus line GL. The CS bus line CL may be disposed overlapping with the drain electrode (or extended portion of the drain electrode) 7D with the gate insulating layer 4 interposed therebetween, and may constitute the auxiliary capacity CS having the gate insulating layer 4 as a dielectric layer.

An alignment mark (for example, a metal layer) 21 and a base insulating film 2 covering the alignment mark 21 may be formed at a position closer to the dielectric substrate than a position of the gate bus line GL. The alignment mark 21 is used as follows. When manufacturing m TFT substrates from one glass substrate, in a case where the number of photomasks is n (where n<m), for example, it is necessary to perform each exposure process multiple times. In this way, when the number (n) of photomasks is less than the number (m) of TFT substrates 101 manufactured from one glass substrate 1, the alignment mark 21 can be used for alignment of the photomasks. The alignment marks 21 may be omitted.

In the present embodiment, the patch electrode 15 is formed on a layer different from the source metal layer. This provides the advantages described below.

Since the source metal layer is typically formed using a metal film, it is conceivable to form a patch electrode in the source metal layer. However, the patch electrode preferably has a low resistance, to the extent that the electron oscillation is not inhibited, and is formed of, for example, an Al layer having a relatively thicker thickness of 0.3 µm or greater. From the viewpoint of antenna performance, a thicker patch electrode is preferred. Nevertheless, while dependent on the TFT configuration as well, when a patch electrode having a thickness exceeding 1 µm, for example, is formed in the source metal layer, the problem of not achieving the desired patterning accuracy may occur. For example, a problem may arise in which the gap (corresponding to the channel length of the TFT) between the source electrode and the drain electrode cannot be controlled at high accuracy. In contrast, in the present embodiment, since the patch electrode 15 is formed separately from the source metal layer, the thickness of the source metal layer and the thickness of the patch electrode 15 can be controlled independently. This allows the controllability for forming the source metal layer to be secured and a patch electrode 15 having a desired thickness to be formed.

In the present embodiment, the thickness of the patch electrode 15 can be set with a high degree of freedom separately from the thickness of the source metal layer. Note that since the size of the patch electrode 15 needs not be controlled as strictly as the source bus line SL or the like, it is acceptable for the line width shift (deviation from the design value) to be increased by thickening the patch electrode 15. A case that the thickness of the patch electrode 15 is equal to the thickness of the source metal layer is not excluded.

The patch electrode 15 may include a Cu layer or an Al layer as a main layer. A performance of the scanning antenna correlates with an electric resistance of the patch electrode 15, and a thickness of the main layer is set so as to obtain a desired resistance. In terms of the electric resistance, there is a possibility that the thickness of the patch electrode 15 can be made thinner in the Cu layer than in the Al layer.

Figure 4A:
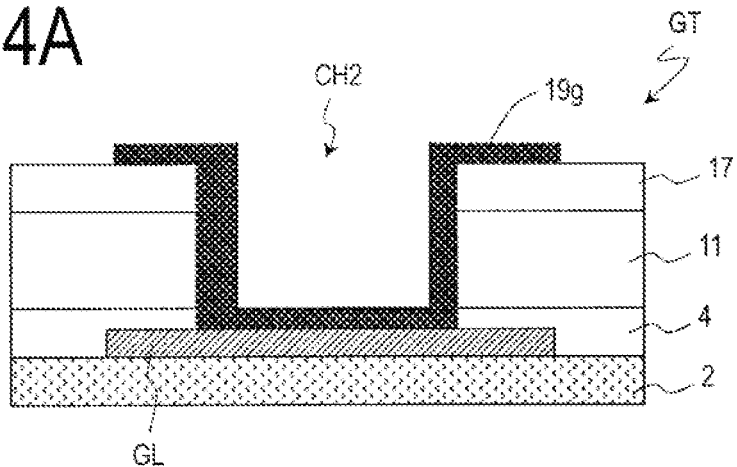
FIG. 4A to FIG. 4C are cross-sectional views schematically illustrating a gate terminal section GT, a source terminal section ST, and a transfer terminal section PT of the TFT substrate 101, respectively.
Figure 4B:
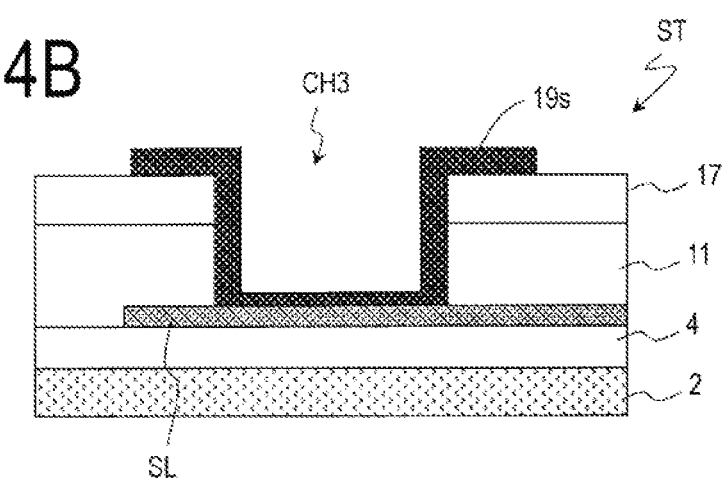
Figure 4C:
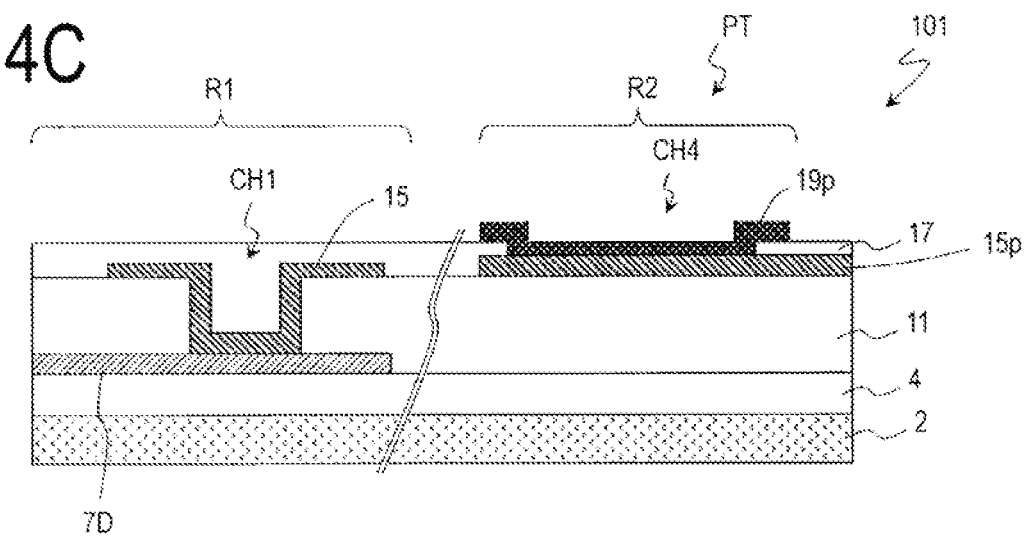

Gate Terminal Section GT, Source Terminal Section ST, and Transfer Terminal Section PT FIG. 4A to FIG. 4C are cross-sectional views schematically illustrating the gate terminal section GT, the source terminal section ST, and the transfer terminal section PT, respectively.

The gate terminal section GT includes the gate bus line GL formed on the dielectric substrate, an insulating layer covering the gate bus line GL, and a gate terminal upper connection section 19g. The gate terminal upper connection section 19g is in contact with the gate bus line GL within a contact hole CH2 formed in the insulating layer. In this example, the insulating layer covering the gate bus line GL includes the gate insulating layer 4, the first insulating layer 11 and the second insulating layer 17 in that order from the dielectric substrate side. The gate terminal upper connection section 19g is, for example, a transparent electrode formed of a transparent conductive film provided on the second insulating layer 17.

The source terminal section ST includes the source bus line SL formed on the dielectric substrate (here, on the gate insulating layer 4), an insulating layer covering the source bus line SL, and a source terminal upper connection section 19s. The source terminal upper connection section 19s is in contact with the source bus line SL within a contact hole CH3 formed in the insulating layer. In this example, the insulating layer covering the source bus line SL includes the first insulating layer 11 and the second insulating layer 17. The source terminal upper connection section 19s is, for example, a transparent electrode formed of a transparent conductive film provided on the second insulating layer 17.

The transfer terminal section PT include a patch connection section 15p formed on the first insulating layer 11, the second insulating layer 17 covering the patch connection section 15p, and a transfer terminal upper connection section 19p. The transfer terminal upper connection section 19p is in contact with the patch connection section 15p within a contact hole CH4 formed in the second insulating layer 17. The patch connection section 15p is formed of the same conductive film as that of the patch electrode 15. The transfer terminal upper connection section (also referred to as an upper transparent electrode) 19p is, for example, a transparent electrode formed of a transparent conductive film provided on the second insulating layer 17. In the present embodiment, the upper connection sections 19g, 19s, and 19p for the respective terminal sections are formed of the same transparent conductive film.

In the present embodiment, it is advantageous that the contact holes CH2, CH3, and CH4 of the respective terminal sections can be simultaneously formed by the etching process after the formation of the second insulating layer 17. The detailed manufacturing process thereof will be described later.

Manufacturing Method of TFT Substrate 101

Figure 5:
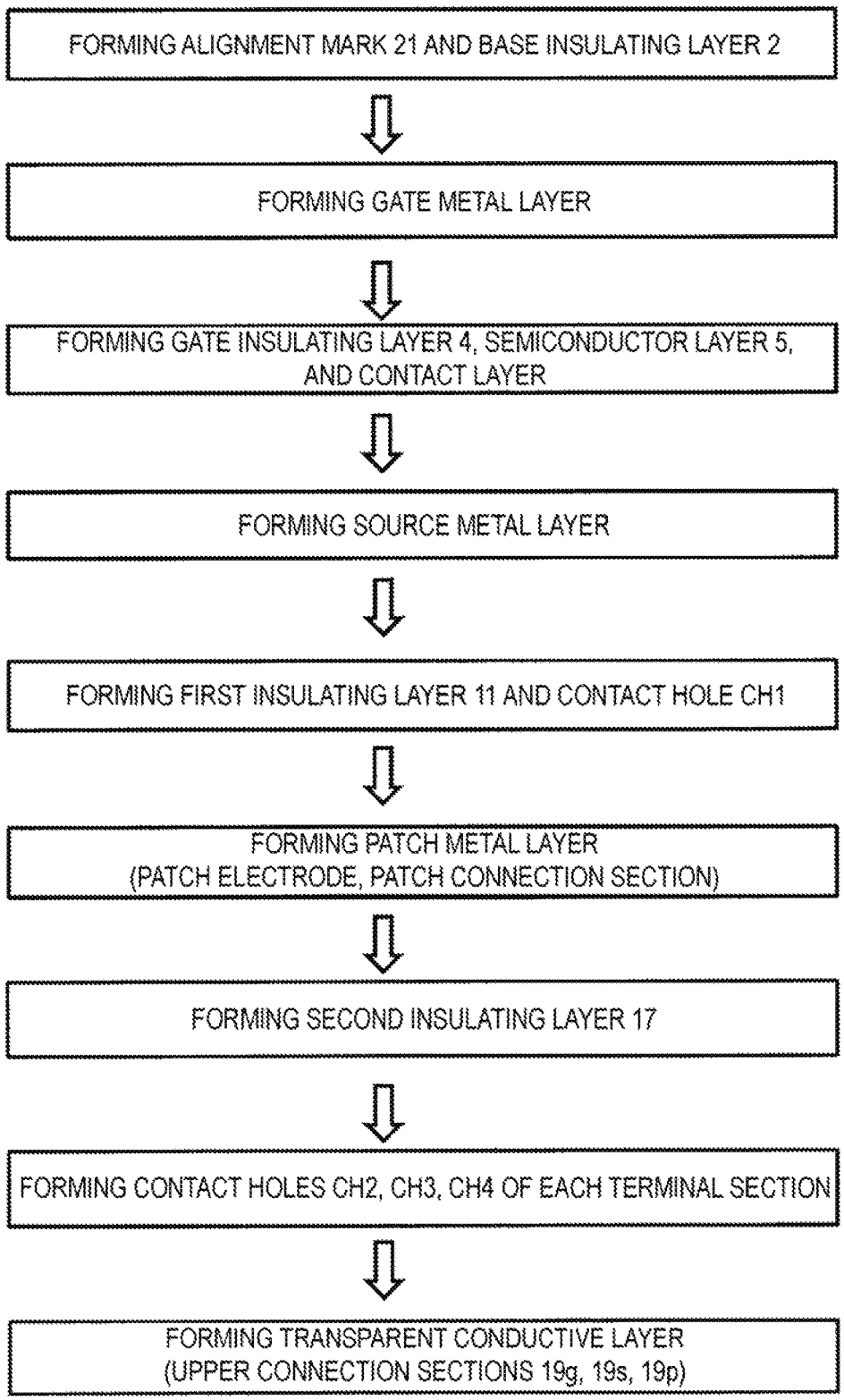
FIG. 5 is a diagram illustrating an example of a manufacturing process of the TFT substrate 101.

As an example, the TFT substrate 101 can be manufactured by the following method. FIG. 5 is a diagram exemplifying the manufacturing process of the TFT substrate 101.

First, a metal film (for example, a Ti film) is formed on a dielectric substrate and patterned to form the alignment mark 21. A glass substrate, a plastic substrate (resin substrate) having heat resistance, or the like can be used as the dielectric substrate, for example. Next, the base insulating film 2 is formed so as to cover the alignment marks 21. An $SiO_2$ film is used as the base insulating film 2.

Subsequently, a gate metal layer including the gate electrode 3 and the gate bus line GL is formed on the base insulating film 2.

The gate electrode 3 can be formed integrally with the gate bus line GL. Here, a not-illustrated gate conductive film (with a thickness of greater than or equal to 50 nm and less than or equal to 500 nm) is formed on the dielectric substrate by a sputtering method or the like. Next, the gate conductive film is patterned to obtain the gate electrode 3 and the gate bus line GL. The material of the gate conductive film is not particularly limited to a specific material. A film containing a metal such as aluminum (Al), tungsten (W), molybdenum (Mo), tantalum (Ta), chromium (Cr), titanium (Ti), or copper (Cu), an alloy thereof, or alternatively a metal nitride thereof can be appropriately used. Here, as a gate conductive film, a layered film is formed by layering MoN (having a thickness of 50 nm, for example), Al (having a thickness of 200 nm, for example), and MoN (having a thickness of 50 nm, for example) in this order.

Next, the gate insulating layer 4 is formed so as to cover the gate metal layer. The gate insulating layer 4 can be formed by a CVD method or the like. As the gate insulating layer 4, a silicon oxide ($SiO_2$) layer, a silicon nitride (SiNx) layer, a silicon oxynitride (SiOxNy; x>y) layer, a silicon nitride oxide (SiNxOy; x>y) layer, or the like may be used as appropriate. The gate insulating layer 4 may have a layered structure. Here, a SiNx layer (having a thickness of 410 nm, for example) is formed as the gate insulating layer 4.

Next, the semiconductor layer 5 and a contact layer are formed on the gate insulating layer 4. Here, an intrinsic amorphous silicon film (with a thickness of 125 nm, for example) and an $n^+$ type amorphous silicon film (with a thickness of 65 nm, for example) are formed in this order and patterned to obtain an island-shaped semiconductor layer 5 and a contact layer. The semiconductor film used for the semiconductor layer 5 is not limited to an amorphous silicon film. For example, an oxide semiconductor layer may be formed as the semiconductor layer 5. In this case, it is not necessary to provide a contact layer between the semiconductor layer 5 and the source/drain electrodes.

Next, a source conductive film (having a thickness of greater than or equal to 50 nm and less than or equal to 500 nm, for example) is formed on the gate insulating layer 4 and the contact layer, and patterned to form a source metal layer including the source electrode 7S, the drain electrode 7D, and the source bus line SL. At this time, the contact layer is also etched, and the source contact layer 6S and the drain contact layer 6D separated from each other are formed.

The material of the source conductive film is not particularly limited to a specific material. A film containing a metal such as aluminum (Al), tungsten (W), molybdenum (Mo), tantalum (Ta), chromium (Cr), titanium (Ti), or copper (Cu), an alloy thereof, or alternatively a metal nitride thereof can be appropriately used. Here, as a source conductive film, a layered film is formed by layering MoN (having a thickness of 30 nm, for example), Al (having a thickness of 200 nm, for example), and MoN (having a thickness of 50 nm, for example) in this order. Instead, as a source conductive film, a layered film may be formed by layering Ti (having a thickness of 30 nm, for example), MoN (having a thickness of 30 nm, for example), Al (having a thickness of 200 nm, for example), and MoN (having a thickness of 50 nm, for example) in this order.

Here, for example, a source conductive film is formed by a sputtering method and the source conductive film is patterned by wet etching (source/drain separation). Thereafter, a portion of the contact layer located on the region that will serve as the channel region of the semiconductor layer 5 is removed by dry etching, for example, to form a gap portion, and the source contact layer 6S and the drain contact layer 6D are separated. At this time, in the gap portion, the area around the surface of the semiconductor layer 5 is also etched (overetching).

Note that, when a layered film in which a Ti film and an Al film are layered in this order is used as a source conductive film, for example, after patterning the Al film by wet etching using, for example, an aqueous solution of phosphoric acid, acetic acid, and nitric acid, the Ti film and the contact layer ($n^+$ type amorphous silicon layer) 6 may be simultaneously patterned by dry etching. Alternatively, it is also possible to collectively etch the source conductive film and the contact layer. However, in the case of simultaneously etching the source conductive film or the lower layer thereof and the contact layer 6, it may be difficult to control the distribution of the etching amount of the semiconductor layer 5 (the amount of excavation of the gap portion) of the entire substrate. In contrast, as described above, in a case where etching is performed in an etching step separate from the formation of the source/drain separation and the gap portion formation, the etching amount of the gap portion can be more easily controlled.

Next, the first insulating layer 11 is formed so as to cover the TFT 10. In this example, the first insulating layer 11 is disposed so as to be in contact with the channel region of the semiconductor layer 5. In addition, the contact hole CH1 that at least reaches the drain electrode 7D is formed in the first insulating layer 11 by a known photolithographic method.

The first insulating layer 11 may be an inorganic insulating layer such as a silicon oxide ($SiO_2$) film, a silicon nitride (SiNx) film, a silicon oxynitride (SiOxNy; x>y) film, or a silicon nitride oxide (SiNxOy; x>y) film, for example. Here, as the first insulating layer 11, a SiNx layer having a thickness of 330 nm, for example, is formed by a CVD method.

Next, a patch conductive film is formed on the first insulating layer 11 and within the contact hole CH1, and this is subsequently patterned. In this way, the patch electrode 15 is formed in the transmission and/or reception region R1, and the patch connection section 15p is formed in the non-transmission and/or reception region R2. The patch electrode 15 is in contact with the drain electrode 7D within the contact hole CH1. Note that, in the present specification, the layer including the patch electrode 15 and the patch connection section 15p formed from the patch conductive film may be referred to as a "patch metal layer" in some cases.

The same material as that of the gate conductive film or the source conductive film can be used as the material of the patch conductive film. However, the patch conductive film is set to be thicker than the gate conductive film and the source conductive film. This allows the sheet resistance of the patch electrode to reduce. And thus, the loss resulting from the oscillation of free electrons in the patch electrode changing to heat can be reduced. A suitable thickness of the patch conductive film is, for example, greater than or equal to 0.3 μm. When the thickness is thinner, the sheet resistance is 0.10 Ω/sq or greater, and may result in the problem of greater loss. The thickness of the patch conductive film is, for example, less than or equal to 3 μm, and more preferably less than or equal to 2 μm. In a case where the thickness becomes thicker than this, warping of the substrate may occur. When the warping is significant, problems such as transport problems, substrate chipping, or substrate cracking may occur.

Here, as a patch conductive film, a layered film (MoN/Al/MoN) is formed by layering MoN (having a thickness of 50 nm, for example), Al (having a thickness of 1000 nm, for example), and MoN (having a thickness of 50 nm, for example) in this order. Instead, a layered film (MoN/Al/MoN/Ti) may be formed by layering Ti (having a thickness of 50 nm, for example), MoN (having a thickness of 50 nm, for example), Al (having a thickness of 2000 nm, for example), and MoN (having a thickness of 50 nm, for example) in this order. Alternatively, instead, a layered film (MoN/Al/MoN/Ti) may be formed by layering Ti (having a thickness of 50 nm, for example), MoN (having a thickness of 50 nm, for example), Al (having a thickness of 500 nm, for example), and MoN (having a thickness of 50 nm, for example) in this order. Alternatively, a layered film (Ti/Cu/Ti) in which a Ti film, a Cu film, and a Ti film are layered in this order, or a layered film (Cu/Ti) in which a Ti film and a Cu film are layered in this order may be used.

Next, the second insulating layer (having a thickness of greater than or equal to 100 am and less than or equal to 300 nm) 17 is formed on the patch electrode 15 and the first insulating layer 11. The second insulating layer 17 is not particularly limited to a specific film, and, for example, a silicon oxide ($SiO_2$) film, a silicon nitride (SiNx) film, a silicon oxynitride (SiOxNy; x>y) film, a silicon nitride oxide (SiNxOy; x>y) film, or the like can be used as appropriate. Here, as the second insulating layer 17, for example, a SiNx layer having a thickness of 200 nm is formed.

Thereafter, the inorganic insulating films (the second insulating layer 17, the first insulating layer 11, and the gate insulating layer 4) are etched collectively by dry etching using a fluorine-based gas, for example. During the etching, the patch electrode 15, the source bus line SL, and the gate bus line GL each function as an etch stop. In this way, the contact hole CH2 that at least reaches the gate bus line GL is formed in the second insulating layer 17, the first insulating layer 11, and the gate insulating layer 4, and the contact hole CH3 that at least reaches the source bus line SL is formed in the second insulating layer 17 and the first insulating layer 11. In addition, the contact hole CH4 that at least reaches the patch connection section 15p is formed in the second insulating layer 17.

In this example, since the inorganic insulating films are etched collectively, side surfaces of the second insulating layer 17, first insulating layer 11, and gate insulating layer 4 are aligned on a side wall of the obtained contact hole CH2, and the side walls of the second insulating layer 17 and first insulating layer 11 are aligned on a side wall of the contact hole CH3. Note that, in the present embodiment, the expression that "the side surfaces of different two or more layers are aligned" within the contact hole does not only refer to when the side surfaces exposed in the contact hole in these layers are flush in the vertical direction, but also includes cases where inclined surfaces such as continuous tapered shapes are formed. Such a structure can be obtained, for example, by etching these layers using the same mask, or alternatively by using one of these layers as a mask to etch the other layer.

Next, a transparent conductive film (having a thickness of greater than or equal to 50 nm and less than or equal to 200 nm) is formed on the second insulating layer 17 and within the contact holes CH2, CH3, and CH4 by a sputtering method, for example. An indium tin oxide (ITO) film, an IZO film, a zinc oxide (ZnO) film or the like can be used as the transparent conductive film. Here, an ITO film having a thickness of, for example, 100 nm is used as the transparent conductive film.

Next, the transparent conductive film is patterned to form the gate terminal upper connection section 19g, the source terminal upper connection section 19s, and the transfer terminal upper connection section 19p. The gate terminal upper connection section 19g, the source terminal upper connection section 19s, and the transfer terminal upper connection section 19p are used for protecting the electrodes or wiring lines exposed at each terminal section. In this way, the gate terminal section GT, the source terminal section ST, and the transfer terminal section PT are obtained.

Structure of Slot Substrate 201

Next, the structure of the slot substrate 201 will be described in greater detail.

Figure 6:
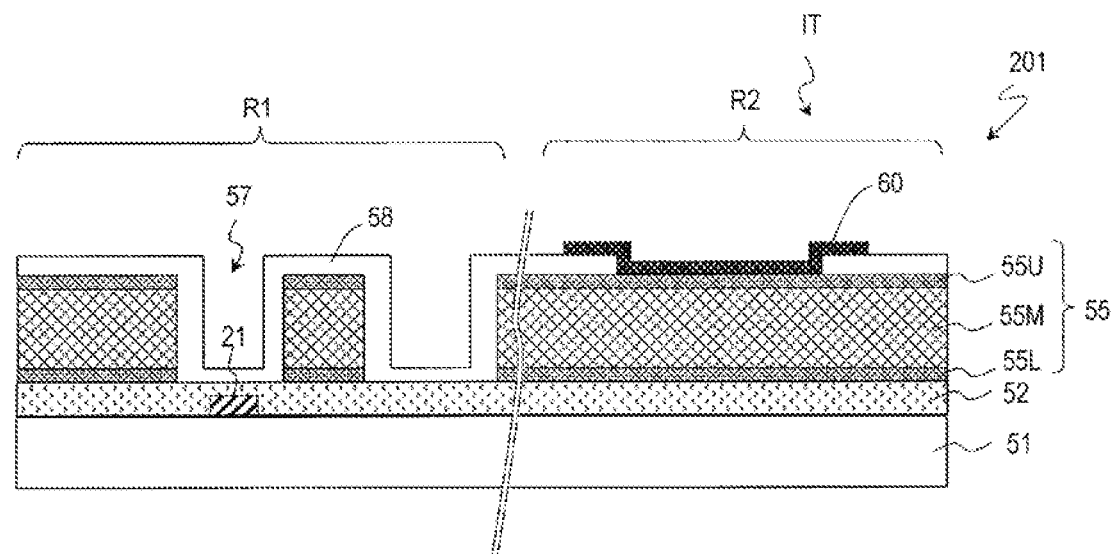
FIG. 6 is a cross-sectional view schematically illustrating an antenna unit region U and a terminal section IT in the slot substrate 201.

FIG. 6 is a cross-sectional view schematically illustrating the antenna unit region U and the terminal section IT in the slot substrate 201.

The slot substrate 201 includes the dielectric substrate 51 having a front surface and a rear surface, a third insulating layer 52 formed on the front surface of the dielectric substrate 51, the slot electrode 55 formed on the third insulating layer 52, and a fourth insulating layer 58 covering the slot electrode 55. A reflective conductive plate 65 is disposed opposing the rear surface of the dielectric substrate 51 with the dielectric layer (air layer) 54 interposed therebetween. The slot electrode 55 and the reflective conductive plate 65 function as walls of the waveguide 301.

In the transmission and/or reception region R1, a plurality of slots 57 are formed in the slot electrode 55. The slot 57 is an opening that opens through the slot electrode 55. In this example, one slot 57 is disposed in each antenna unit region U.

The fourth insulating layer 58 is formed on the slot electrode 55 and within the slot 57. The material of the fourth insulating layer 58 may be the same as the material of the third insulating layer 52. By covering the slot electrode 55 with the fourth insulating layer 58, the slot electrode 55 and the liquid crystal layer LC are not in direct contact with each other, so that the reliability can be enhanced. In a case where the slot electrode 55 is formed of a Cu layer, Cu may elute into the liquid crystal layer LC in some cases. In addition, in a case where the slot electrode 55 is formed of an Al layer by using a thin film deposition technique, the Al layer may include a void. The fourth insulating layer 58 can prevent the liquid crystal material from entering the void of the Al layer. Note that in a case where the slot electrode 55 is formed by bonding an aluminum foil as the Al layer on the dielectric substrate 51 with an adhesive and patterning it, the problem of voids can be avoided.

The slot electrode 55 includes a main layer 55M such as a Cu layer or an Al layer. The slot electrode 55 may have a layered structure that includes the main layer 55M, as well as an upper layer 55U and a lower layer 55L disposed sandwiching the main layer 55M therebetween. A thickness of the main layer 55M may be set in consideration of the skin effect depending on the material, and may be, for example, greater than or equal to 2 μm and less than or equal to 30 μm. The thickness of the main layer 55M is typically greater than the thickness of the upper layer 55U and the lower layer 55L.

In the illustrated example, the main layer 55M is a Cu layer, and the upper layer 55U and the lower layer 55L are Ti layers. By disposing the lower layer 55L between the main layer 55M and the third insulating layer 52, the adhesion between the slot electrode 55 and the third insulating layer 52 can be improved. In addition, by providing the upper layer 55U, corrosion of the main layer 55M (e.g., the Cu layer) can be suppressed.

Since the reflective conductive plate 65 constitutes the wall of the waveguide 301, it is desirable that the reflective conductive plate 65 has a thickness that is three times or greater than the skin depth, and preferably five times or greater. An aluminum plate, a copper plate, or the like having a thickness of several millimeters manufactured by a cutting out process can be used as the reflective conductive plate 65.

The terminal section IT is provided in the non-transmission and/or reception region R2. The terminal section IT includes the slot electrode 55, the fourth insulating layer 58 covering the slot electrode 55, and an upper connection section 60. The fourth insulating layer 58 includes an opening that at least reaches the slot electrode 55. The upper connection section 60 is in contact with the slot electrode 55 within the opening. In the present embodiment, the terminal section IT is disposed in the seal region Rs. and is connected to the transfer terminal section on the TFT substrate (transfer section) by a seal resin containing conductive particles.

Transfer Section

Figure 7:
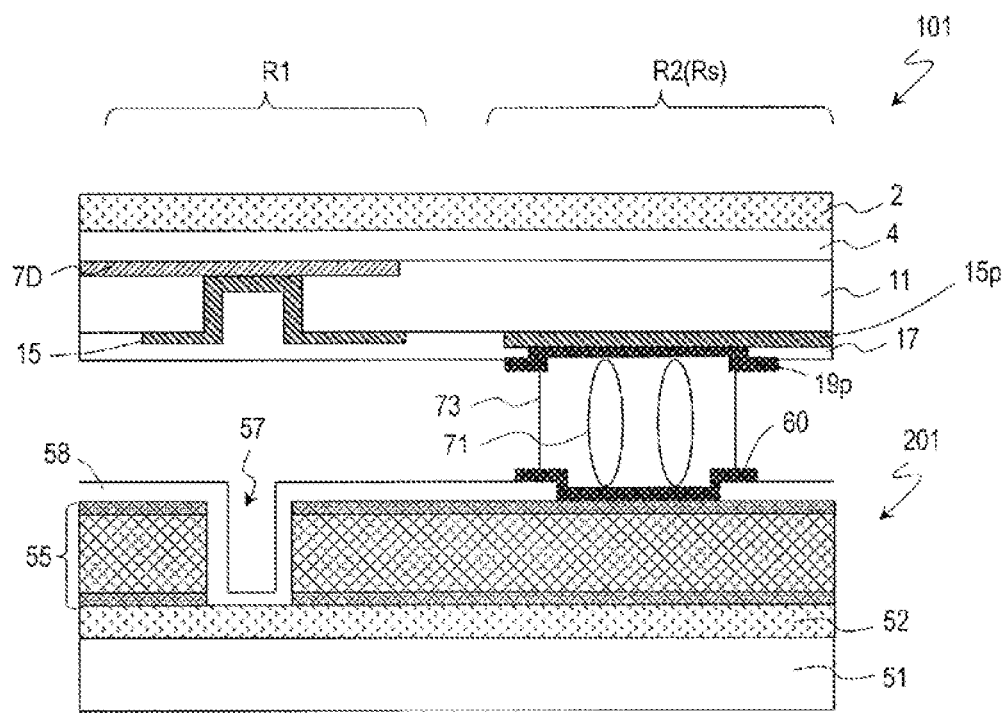
FIG. 7 is a schematic cross-sectional view for illustrating a transfer section in the TFT substrate 101 and the slot substrate 201.

FIG. 7 is a schematic cross-sectional view for illustrating the transfer section connecting the transfer terminal section PT of the TFT substrate 101 and the terminal section IT of the slot substrate 201. In FIG. 7, the same reference numerals are attached to the same components as those in FIG. 1 to FIG. 4C.

In the transfer section, the upper connection section 60 of the terminal section IT is electrically connected to the transfer terminal upper connection section 19p of the transfer terminal section PT in the TFT substrate 101. In the present embodiment, the upper connection section 60 and the transfer terminal upper connection section 19p are connected with a resin (sealing resin) 73 (also referred to as a sealing portion 73) including conductive beads 71 therebetween.

Each of the upper connection sections 60 and 19p is a transparent conductive layer such as an ITO film or an IZO film, and there is a possibility that an oxide film is formed on the surface thereof. When an oxide film is formed, the electrical connection between the transparent conductive layers cannot be ensured, and the contact resistance may increase. In contrast, in the present embodiment, since these transparent conductive layers are bonded with a resin including conductive beads (for example, Au beads) 71 therebetween, even in a case where a surface oxide film is formed, the conductive beads pierce (penetrate) the surface oxide film, allowing an increase in contact resistance to be suppressed. The conductive beads 71 may penetrate not only the surface oxide film but also penetrate the upper connection sections 60 and 19p which are the transparent conductive layers, and directly contact the patch connection section 15p and the slot electrode 55.

The transfer section may be disposed at both a center portion and a peripheral portion (that is, inside and outside of the donut-shaped transmission and/or reception region R1 when viewed from the normal direction of the scanning antenna 1000) of the scanning antenna 1000, or alternatively may be disposed at only one of them. The transfer section may be disposed in the seal region Rs in which the liquid crystals are sealed, or may be disposed outside the seal region Rs (opposite to the liquid crystal layer).

Manufacturing Method of Slot Substrate 201

The slot substrate 201 can be manufactured by the following method, for example.

First, the third insulating layer (having a thickness of 200 nm, for example) 52 is formed on the dielectric substrate. A substrate such as a glass substrate or a resin substrate having a high transmittance to electromagnetic waves (the dielectric constant $\varepsilon_M$ and the dielectric loss tan $\delta_M$ are small) can be used as the dielectric substrate. The dielectric substrate is preferably thin in order to suppress the attenuation of the electromagnetic waves. For example, after forming the constituent elements such as the slot electrode 55 on the front surface of the glass substrate by a process to be described later, the glass substrate may be thinned from the rear side. This allows the thickness of the glass substrate to be reduced to 500 μm or less, for example.

When a resin substrate is used as the dielectric substrate, constituent elements such as TFTs may be formed directly on the resin substrate, or may be formed on the resin substrate by a transfer method. In a case of the transfer method, for example, a resin film (for example, a polyimide film) is formed on the glass substrate, and after the constituent elements are formed on the resin film by the process to be described later, the resin film on which the constituent elements are formed is separated from the glass substrate. Generally, the dielectric constant $\varepsilon_M$ and the dielectric loss tan $\delta_M$ of resin are smaller than those of glass. The thickness of the resin substrate is, for example, from 3 μm to 300 μm. Besides polyimide, for example, a liquid crystal polymer can also be used as the resin material.

The third insulating layer 52 is not particularly limited to a specific film, and, for example, a silicon oxide ($SiO_2$) film, a silicon nitride (SiNx) film, a silicon oxynitride (SiOxNy; x>y) film, a silicon nitride oxide (SiNxOy; x>y) film, or the like can be used as appropriate.

Next, a metal film is formed on the third insulating layer 52, and this is patterned to obtain the slot electrode 55 including the plurality of slots 57. As the metal film, a Cu film (or Al film) having a thickness of from 2 μm to 5 μm may be used. Here, a layered film obtained by layering a Ti film, a Cu film, and a Ti film in this order is used. Instead, a layered film may be formed by layering Ti (having a thickness of 50 nm, for example) and Cu (having a thickness of 5000 nm, for example) in this order.

Thereafter, the fourth insulating layer (having a thickness of 100 nm or 200 nm, for example) 58 is formed on the slot electrode 55 and within the slot 57. The material of the fourth insulating layer 58 may be the same as the material of the third insulating layer. Subsequently, in the non-transmission and/or reception region R2, an opening that at least reaches the slot electrode 55 is formed in the fourth insulating layer 58.

Next, a transparent conductive film is formed on the fourth insulating layer 58 and within the opening of the fourth insulating layer 58, and is patterned to form the upper connection section 60 in contact with the slot electrode 55 within the opening. In this way, the terminal section IT is obtained.

Material and Structure of TFT 10

In the present embodiment, a TFT including a semiconductor layer 5 as an active layer is used as a switching element disposed in each pixel. The semiconductor layer 5 is not limited to an amorphous silicon layer, and may be a polysilicon layer or an oxide semiconductor layer.

In a case where an oxide semiconductor layer is used, the oxide semiconductor included in the oxide semiconductor layer may be an amorphous oxide semiconductor or a crystalline oxide semiconductor including a crystalline portion. Examples of the crystalline oxide semiconductor include a polycrystalline oxide semiconductor, a microcrystalline oxide semiconductor, or a crystalline oxide semiconductor having a c-axis oriented substantially perpendicular to the layer surface.

The oxide semiconductor layer may have a layered structure of two or more layers. In cases where the oxide semiconductor layer has a layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. In addition, the oxide semiconductor layer may include a plurality of amorphous oxide semiconductor layers. In cases where the oxide semiconductor layer has a two-layer structure including an upper layer and a lower layer, an energy gap of the oxide semiconductor included in the upper layer is preferably greater than an energy gap of the oxide semiconductor included in the lower layer. However, when the different in the energy gap between these layers is relatively small, the energy gap of the lower layer oxide semiconductor may be larger than the energy gap of the upper layer oxide semiconductor.

JP 2014-007399 A, for example, describes materials, structures, film formation methods, and the configuration of oxide semiconductor layers having layered structures for amorphous oxide semiconductors and each of the above described crystalline oxide semiconductors. For reference, the entire contents of JP 2014-007399 A are incorporated herein.

The oxide semiconductor layer may include, for example, at least one metal element selected from In, Ga, and Zn. In the present embodiment, the oxide semiconductor layer includes, for example, an In—Ga—Zn—O based semiconductor (for example, indium gallium zinc oxide). Here, the In—Ga—Zn—O based semiconductor is a ternary oxide of In (indium), Ga (gallium), and Zn (zinc), and the ratio (composition ratio) of In, Ga, and Zn is not particularly limited to a specific value. For example, the ratio includes In:Ga:Zn=2:2:1, In:Ga:Zn=1:1:1, or In:Ga:Zn=1:1:2. Such an oxide semiconductor layer can be formed from an oxide semiconductor film including an In—Ga—Zn—O based semiconductor.

The In—Ga—Zn—O based semiconductor may be an amorphous semiconductor or a crystalline semiconductor. A crystalline In—Ga—Zn—O based semiconductor in which the c-axis is oriented substantially perpendicular to the layer surface is preferable as the crystalline In—Ga—Zn—O based semiconductor.

Note that the crystal structure of the crystalline In—Ga—Zn—O based semiconductor is disclosed in, for example, the above-mentioned JP 2014-007399 A, JP 2012-134475 A, and JP 2014-209727 A. For reference, the entire contents of JP 2012-134475 A and 2014-209727 A are incorporated herein. Since a TFT including an In—Ga—Zn—O based semiconductor layer has high mobility (more than 20 times in comparison with a-Si TFTs) and low leakage current (less than 1/100th in comparison with a-Si TFTs), such a TFT can suitably be used as a driving TFT (for example, a TFT included in a drive circuit provided in the non-transmission and/or reception region) and a TFT provided in each antenna unit region.

In place of the In—Ga—Zn—O based semiconductor, the oxide semiconductor layer may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of In (indium), Sn (tin), and Zn (zinc). Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), a Mg—Zn—O based semiconductor, an In—Ga—Sn—O based semiconductor, an In—Ga—O based semiconductor, a Zr—In—Zn—O based semiconductor, an Hf—In—Zn—O based semiconductor, an Al—Ga—Zn—O based semiconductor, or a Ga—Zn—O based semiconductor.

In the example illustrated in FIG. 3A and FIG. 3B, the TFT 10 is a channel etch type TFT having a bottom gate structure. The channel etch type TFT does not include an etch stop layer formed on the channel region, and a lower face of an end portion of each of the source and drain electrodes, which is closer to the channel, is provided so as to be in contact with an upper face of the semiconductor layer. The channel etch type TFT is formed by, for example, forming a conductive film for a source/drain electrode on a semiconductor layer and performing source/drain separation. In the source/drain separation process, the surface portion of the channel region may be etched.

Note that the TFT 10 may be an etch stop type TFT in which an etch stop layer is formed on the channel region. In the etch stop type TFT, the lower face of an end portion of each of the source and drain electrodes, which is closer to the channel, is located, for example, on the etch stop layer. The etch stop type TFT is formed as follows; after forming an etch stop layer covering the portion that will become the channel region in a semiconductor layer, for example, a conductive film for the source and drain electrodes is formed on the semiconductor layer and the etch stop layer, and source/drain separation is performed.

In addition, although the TFT 10 has a top contact structure in which the source and drain electrodes are in contact with the upper face of the semiconductor layer, the source and drain electrodes may be disposed to be in contact with the lower face of the semiconductor layer (a bottom contact structure). Furthermore, the TFT 10 may have a bottom gate structure having a gate electrode on the dielectric substrate side of the semiconductor layer, or a top gate structure having a gate electrode above the semiconductor layer.

Second Embodiment

The scanning antenna of a second embodiment will be described with reference to drawings. The TFT substrate of the scanning antenna of the present embodiment differs from the TFT substrate 101 illustrated in FIG. 2A in that a transparent conductive layer that serves as an upper connection section for each terminal section is provided between the first insulating layer and the second insulating layer of the TFT substrate.

Figure 8A:
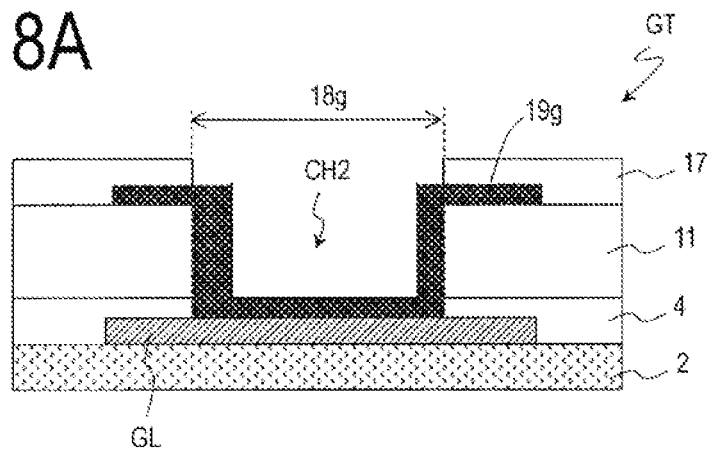
FIG. 8A to FIG. 8C are cross-sectional views illustrating a gate terminal section GT, a source terminal section ST, and a transfer terminal section PT of a TFT substrate 102, respectively, in a second embodiment.
Figure 8B:
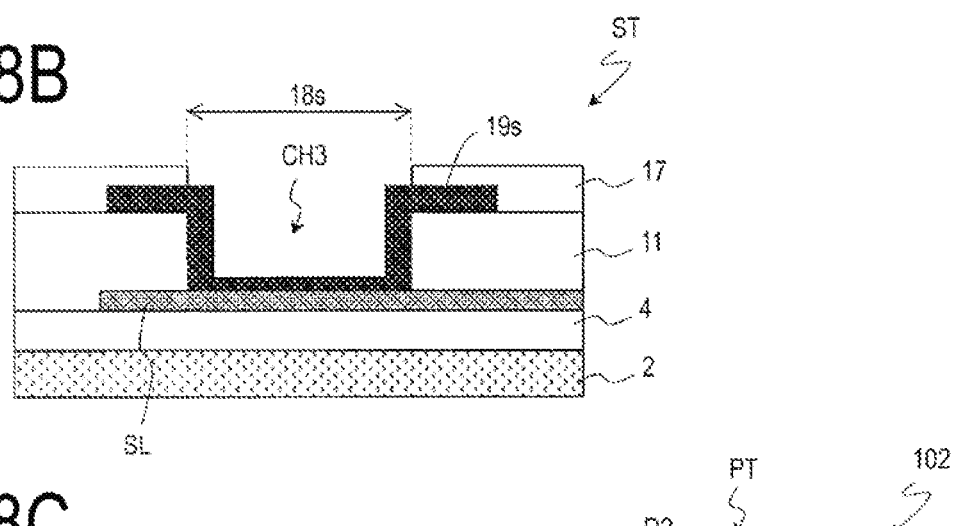
Figure 8C:
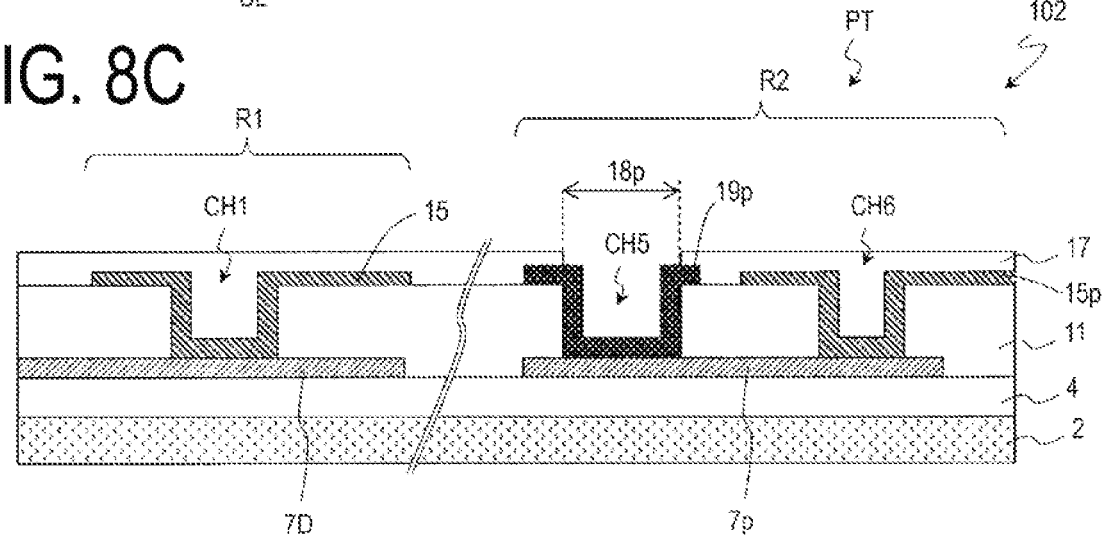

FIG. 8A to FIG. 8C are cross-sectional views illustrating the gate terminal section GT, the source terminal section ST, and the transfer terminal section PT, respectively, of a TFT substrate 102 in the present embodiment. Constituent elements similar to those in FIG. 4A to FIG. 4C are denoted by the same reference numerals, and the description thereof is omitted. Since the cross-sectional structure of the antenna unit region U is similar to that of the above-described embodiments (FIG. 3A and FIG. 3B), the illustration and description thereof will be omitted.

The gate terminal section GT in the present embodiment includes the gate bus line GL formed on a dielectric substrate, the insulating layer covering the gate bus line GL, and the gate terminal upper connection section 19g. The gate terminal upper connection section 19g is in contact with the gate bus line GL within the contact hole CH2 formed in the insulating layer. In this example, the insulating layer covering the gate bus line GL includes the gate insulating layer 4 and the first insulating layer 11. The second insulating layer 17 is formed on the gate terminal upper connection section 19g and the first insulating layer 11. The second insulating layer 17 includes an opening 18g exposing a part of the gate terminal upper connection section 19g. In this example, the opening 18g of the second insulating layer 17 may be disposed so as to expose the entire contact hole CH2.

The source terminal section ST includes the source bus line SL formed on the dielectric substrate (here, on the gate insulating layer 4), the insulating layer covering the source bus line SL, and the source terminal upper connection section 19s. The source terminal upper connection section 19s is in contact with the source bus line SL within the contact hole CH3 formed in the insulating layer. In this example, the insulating layer covering the source bus line SL includes only the first insulating layer 11. The second insulating layer 17 extends over the source terminal upper connection section 19s and the first insulating layer 11. The second insulating layer 17 includes an opening 18s exposing a part of the source terminal upper connection section 19s. The opening 18s of the second insulating layer 17 may be disposed so as to expose the entire contact hole CH3.

The transfer terminal section PT includes a source connection wiring line 7p formed from the same conductive film (source conductive film) as that of the source bus line SL, the first insulating layer 11 extending over the source connection wiring line 7p, the transfer terminal upper connection section 19p and the patch connection section 15p formed on the first insulating layer 11.

Contact holes CH5 and CH6 are provided in the first insulating layer 11 to expose the source connection wiring line 7p. The transfer terminal upper connection section 19p is disposed on the first insulating layer 11 and within the contact hole CH5, and is in contact with the source connection wiring line 7p within the contact hole CH5. The patch connection section 15p is disposed on the first insulating layer 11 and within the contact hole CH6, and is in contact with the source connection wiring line 7p within the contact hole CH6. The transfer terminal upper connection section 19p is a transparent electrode formed of a transparent conductive film. The patch connection section 15p is formed of the same conductive film as that of the patch electrode 15.

Note that the upper connection sections 19g, 19s, and 19p of the respective terminal sections may be formed of the same transparent conductive film.

The second insulating layer 17 extends over the transfer terminal upper connection section 19p, the patch connection section 15p, and the first insulating layer 11. The second insulating layer 17 includes an opening 18p exposing a part of the transfer terminal upper connection section 19p. In this example, the opening 18p of the second insulating layer 17 is disposed so as to expose the entire contact hole CH5. In contrast, the patch connection section 15p is covered with the second insulating layer 17.

In this way, in the present embodiment, the source connection wiring line 7p formed in the source metal layer electrically connects the transfer terminal upper connection section 19p of the transfer terminal section PT and the patch connection section 15p. Although not illustrated in drawings, similar to the above-described embodiment, the transfer terminal upper connection section 19p is connected to the slot electrode of the slot substrate 201 by a sealing resin containing conductive particles.

In the previously described embodiment, the contact holes CH1 to CH4 having different depths are collectively formed after the formation of the second insulating layer 17. For example, while the relatively thick insulating layers (the gate insulating layer 4, the first insulating layer 11 and the second insulating layer 17) are etched in the gate terminal section GT, only the second insulating layer 17 is etched in the transfer terminal section PT. Accordingly, there is a possibility that the conductive film (for example, a patch electrode conductive film) that serves as the base of the shallow contact holes is considerably damaged during etching.

In contrast, in the present embodiment, the contact holes CH1 to CH3, CH5, and CH6 are formed prior to formation of the second insulating layer 17. Since these contact holes are formed only in the first insulating layer 11 or in the layered film of the first insulating layer 11 and the gate insulating layer 4, the difference in depth of the collectively formed contact holes can be reduced more than in the previous embodiment. Accordingly, damage to the conductive film that serves as the base of the contact holes can be reduced. In particular, when an Al film is used for the patch electrode conductive film, since a favorable contact cannot be obtained in a case where the ITO film and the Al film are brought into direct contact with each other, a cap layer such as a MoN layer may be formed on the Al film in some cases. In these cases, there is the advantage that the thickness of the cap layer need not be increased to compensate for damage during etching.

Manufacturing Method of TFT Substrate 102

Figure 9:
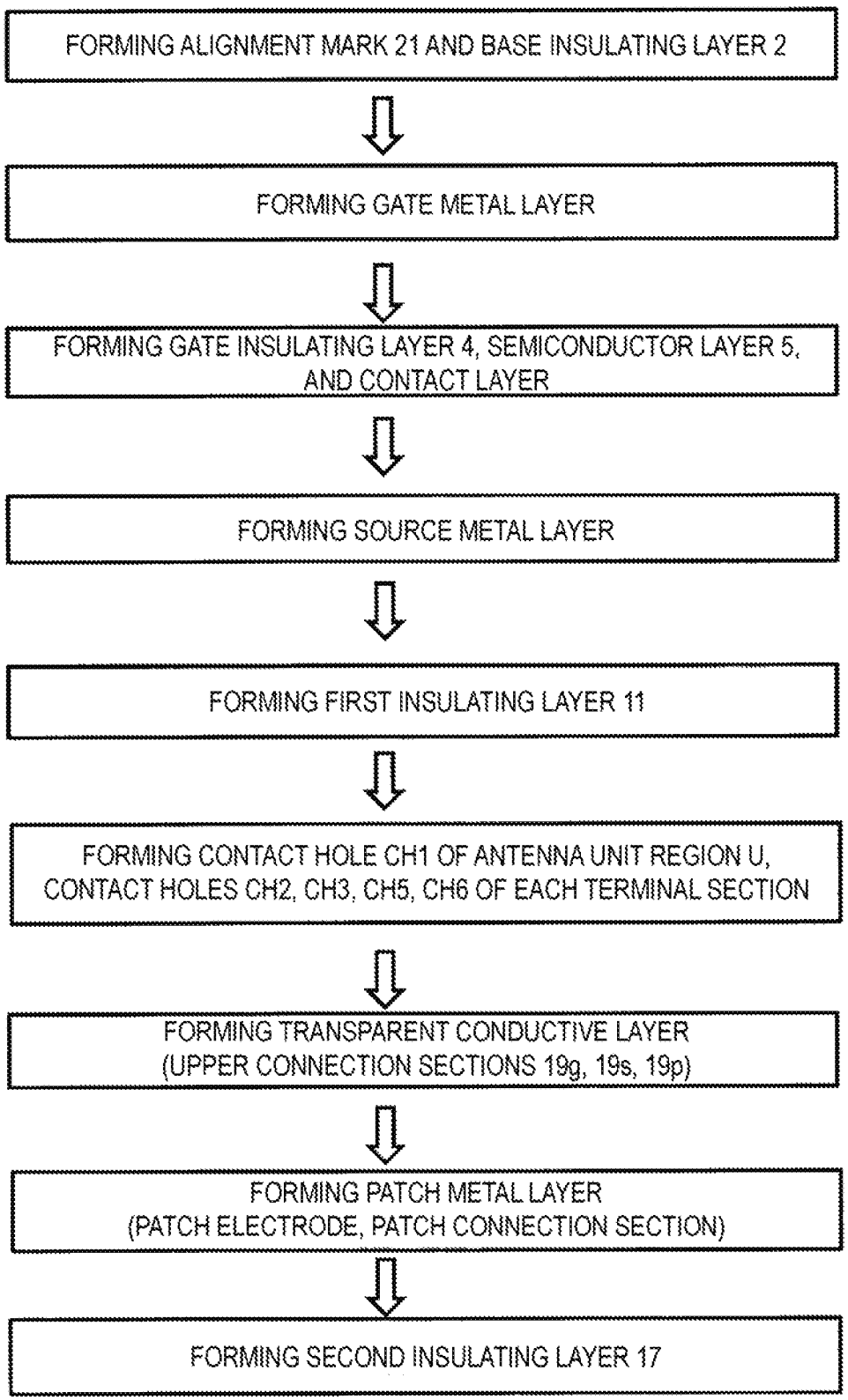
FIG. 9 is a diagram illustrating an example of a manufacturing process of the TFT substrate 102.

The TFT substrate 102 is manufactured by the following method, for example, FIG. 9 is a diagram illustrating an example of a manufacturing process of the TFT substrate 102. Note that in the following description, in cases where the material, thickness, formation method, or the like of each layer are the same as that of the TFT substrate 101 described above, the description thereof is omitted.

First, an alignment mark, a base insulating layer, a gate metal layer, a gate insulating layer, a semiconductor layer, a contact layer, and a source metal layer are formed on a dielectric substrate in the same manner as in the TFT substrate 101 to obtain a TFT. In the step of forming the source metal layer, in addition to the source and drain electrodes and the source bus line, the source connection wiring line 7p is also formed from the source conductive film.

Next, the first insulating layer 11 is formed so as to cover the source metal layer. Subsequently, the first insulating layer 11 and the gate insulating layer 4 are collectively etched to form the contact holes CH1 to CH3, CH5, and CH6. During etching, each of the source bus line SL and the gate bus line GL functions as an etch stop. In this way, in the transmission and/or reception region R1, the contact hole CH1 that at least reaches the drain electrode of the TFT is formed in the first insulating layer 11. In addition, in the non-transmission and/or reception region R2, the contact hole CH2 that at least reaches the gate bus line GL is formed in the first insulating layer 11 and the gate insulating layer 4, and the contact hole CH3 that at least reaches the source bus line SL and contact holes CH5 and CH6 that at least reach the source connection wiring line 7p are formed in the first insulating layer 11. The contact hole CH5 may be disposed in the seal region Rs and the contact hole CH6 may be disposed outside the seal region Rs. Alternatively, both may be disposed outside the seal region Rs.

Next, a transparent conductive film is formed on the first insulating layer 11 and within the contact holes CH1 to CH3, CH5, and CH6, and patterned. In this way, the gate terminal upper connection section 19g in contact with the gate bus line GL within the contact hole CH2, the source terminal upper connection section 19s in contact with the source bus line SL within the contact hole CH3, and the transfer terminal upper connection section 19p in contact with the source connection wiring line 7p within the contact hole CH5 are formed.

Next, a patch electrode conductive film is formed on the first insulating layer 11, the gate terminal upper connection section 19g, the source terminal upper connection section 19s, the transfer terminal upper connection section 19p, and within the contact holes CH1 and CH6 and patterned. In this way, the patch electrode 15 in contact with the drain electrode 7D within the contact hole CH1 is formed in the transmission and/or reception region R1, and the patch connection section 15p in contact with the source connection wiring line 7p within the contact hole CH6 is formed in the non-transmission and/or reception region R2. Patterning of the patch electrode conductive film may be performed by wet etching. Here, an etchant capable of increasing the etching selection ratio between the transparent conductive film (ITO or the like) and the patch electrode conductive film (for example, an Al film) is used. In this way, when patterning the patch electrode conductive film, the transparent conductive film can function as an etch stop. Since the portions of the source bus line SL, the gate bus line GL, and the source connection wiring line 7p exposed by the contact holes CH2, CH3, and CH5 are covered with an etch stop (transparent conductive film), they are not etched.

Subsequently, the second insulating layer 17 is formed. Thereafter, the second insulating layer 17 is patterned by, for example, dry etching using a fluorine-based gas. In this way, the opening 18g exposing the gate terminal upper connection section 19g, the opening 18s exposing the source terminal upper connection section 19s, and the opening 18p exposing the transfer terminal upper connection section 19p are provided in the second insulating layer 17. In this manner, the TFT substrate 102 is obtained.

Third Embodiment

The scanning antenna of a third embodiment will be described with reference to drawings. The TFT substrate in the scanning antenna of the present embodiment differs from the TFT substrate 102 illustrated in FIGS. 8A to 8C in that the upper connection section made of a transparent conductive film is not provided in the transfer terminal section.

Figure 10A:
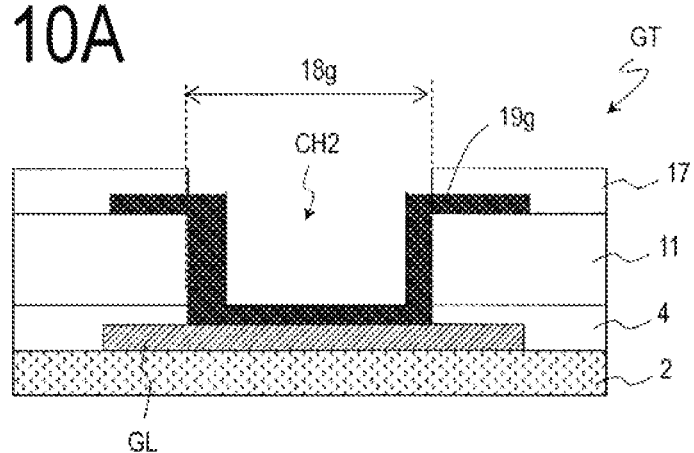
FIG. 10A to FIG. 10C are cross-sectional views illustrating a gate terminal section GT, a source terminal section ST, and a transfer terminal section PT of a TFT substrate 103, respectively, in a third embodiment.
Figure 10B:
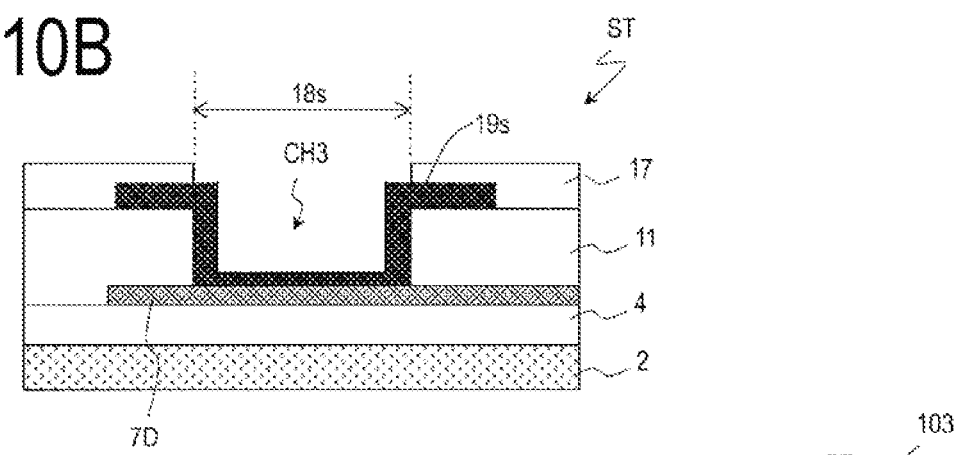
Figure 10C:
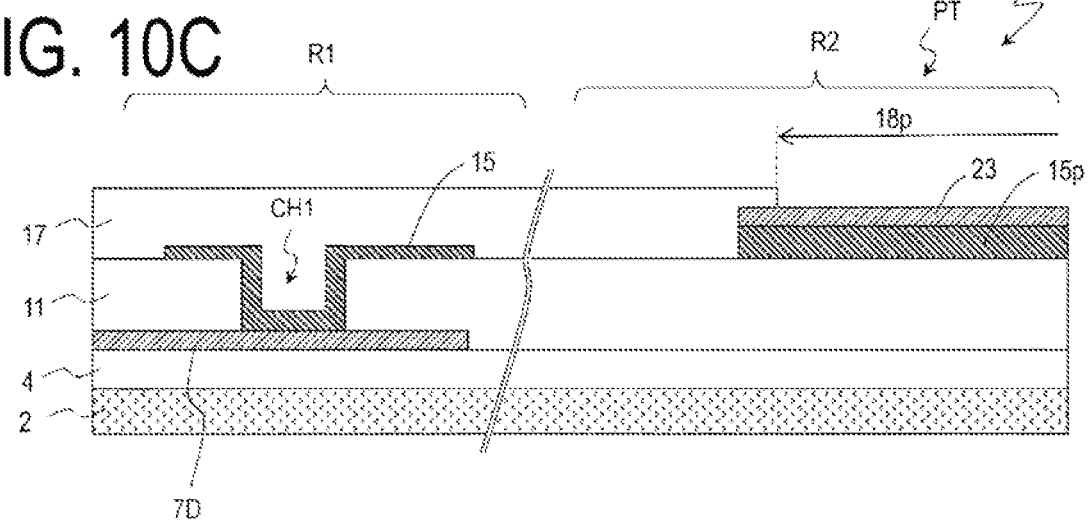

FIG. 10A to FIG. 10C are cross-sectional views illustrating the gate terminal section GT, the source terminal section ST, and the transfer terminal section PT, respectively, of a TFT substrate 103 in the present embodiment. Constituent elements similar to those in FIG. 8A to FIG. 8C are denoted by the same reference numerals. Since the structure of the antenna unit region U is similar to that of the above-described embodiments (FIG. 3A and FIG. 3B), the illustration and description thereof will be omitted.

The structures of the gate terminal section GT and the source terminal section ST are similar to the structures of the gate terminal section and the source terminal section of the TFT substrate 102 illustrated in FIG. 8A and FIG. 8B.

The transfer terminal section PT includes the patch connection section 15p formed on the first insulating layer 11 and a protective conductive layer 23 layered on the patch connection section 15p. The second insulating layer 17 extends over the protective conductive layer 23 and includes an opening 18p exposing a part of the protective conductive layer 23. In contrast, the patch electrode 15 is covered with the second insulating layer 17.

Manufacturing Method of TFT Substrate 103

Figure 11:
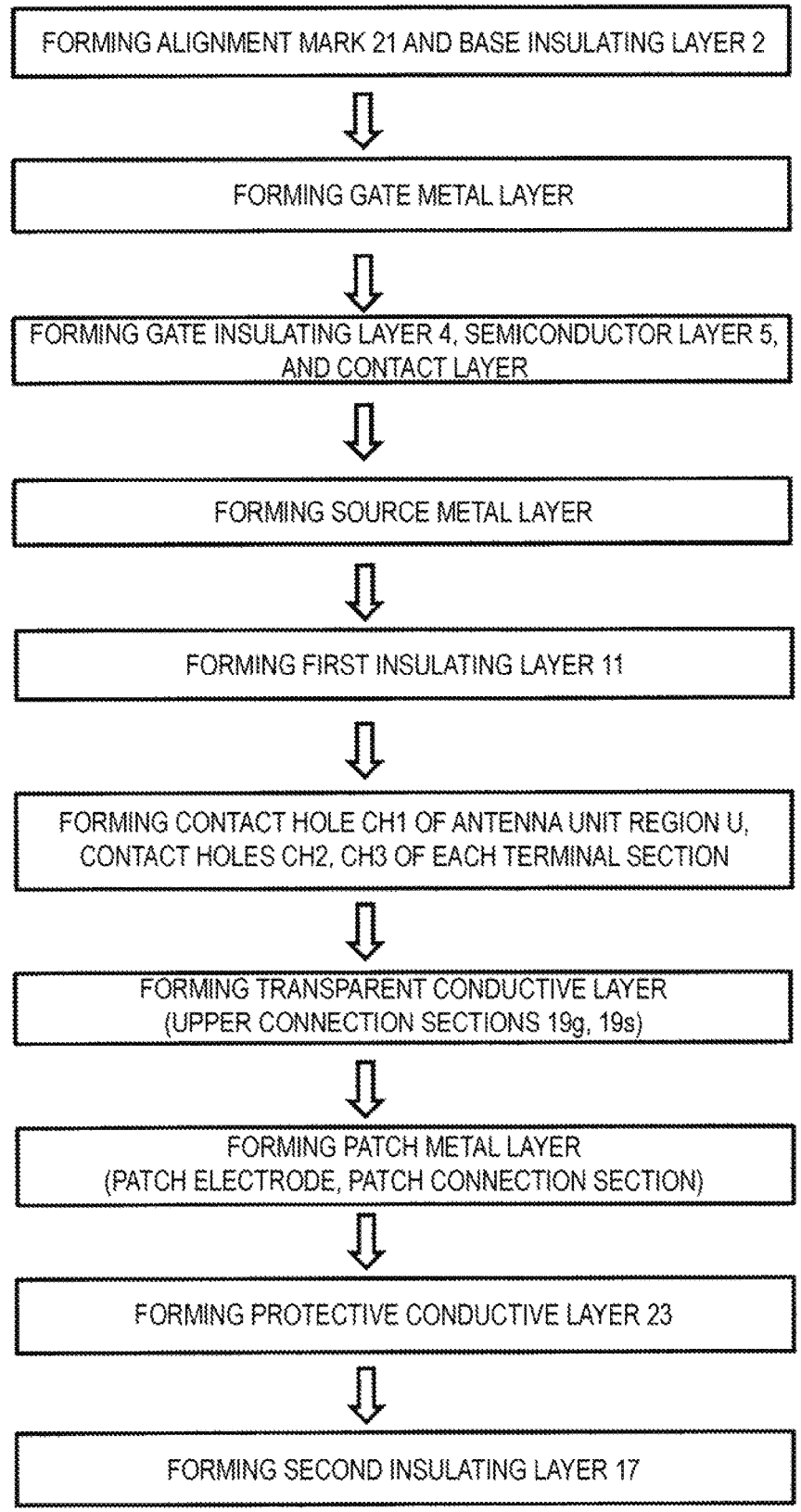
FIG. 11 is a diagram illustrating an example of a manufacturing process of the TFT substrate 103.

The TFT substrate 103 is manufactured by the following method, for example. FIG. 11 is a diagram illustrating an example of a manufacturing process of the TFT substrate 103. Note that in the following description, in cases where the material, thickness, formation method, or the like of each layer are the same as that of the TFT substrate 101 described above, the description thereof is omitted.

First, an alignment mark, a base insulating layer, a gate metal layer, a gate insulating layer, a semiconductor layer, a contact layer, and a source metal layer are formed on a dielectric substrate in the same manner as in the TFT substrate 101 to obtain a TFT.

Next, the first insulating layer 11 is formed so as to cover the source metal layer. Subsequently, the first insulating layer 11 and the gate insulating layer 4 are collectively etched to form the contact holes CH1 to CH3. During etching, each of the source bus line SL and the gate bus line GL functions as an etch stop. In this way, the contact hole CH1 that at least reaches the drain electrode of the TFT is formed in the first insulating layer 11, the contact hole CH2 that at least reaches the gate bus line GL is formed in the first insulating layer 11 and the gate insulating layer 4, and the contact hole CH3 that at least reaches the source bus line SL is formed in the first insulating layer 11. No contact hole is formed in the region where the transfer terminal section is formed.

Next, a transparent conductive film is formed on the first insulating layer 11 and within the contact holes CH1, CH2, and CH3, and patterned. In this way, the gate terminal upper connection section 19g in contact with the gate bus line GL within the contact hole CH2 and the source terminal upper connection section 19s in contact with the source bus line SL within the contact hole CH3 are formed. In the region where the transfer terminal section is formed, the transparent conductive film is removed.

Next, a patch electrode conductive film is formed on the first insulating layer 11, on the gate terminal upper connection section 19g and the source terminal upper connection section 19s, and within the contact hole CH1, and patterned. In this way, the patch electrode 15 in contact with the drain electrode 7D within the contact hole CH1 is formed in the transmission and/or reception region R1, and the patch connection section 15p is formed in the non-transmission and/or reception region R2. Similar to the previous embodiments, an etchant capable of ensuring an etching selection ratio between the transparent conductive film (ITO or the like) and the patch electrode conductive film is used for patterning the patch electrode conductive film.

Subsequently, the protective conductive layer 23 is formed on the patch connection section 15p. A Ti layer, an ITO layer, and an indium zinc oxide (IZO) layer (having a thickness of greater than or equal to 50 nm and less than or equal to 100 nm, for example), or the like can be used as the protective conductive layer 23. Here, a Ti layer (having a thickness of 50 nm, for example) is used as the protective conductive layer 23. Note that the protective conductive layer may be formed on the patch electrode 15.

Next, the second insulating layer 17 is formed. Thereafter, the second insulating layer 17 is patterned by, for example, dry etching using a fluorine-based gas. In this way, the opening 18g exposing the gate terminal upper connection section 19g, the opening 18s exposing the source terminal upper connection section 19s, and the opening 18p exposing the protective conductive layer 23 are provided in the second insulating layer 17. In this manner, the TFT substrate 103 is obtained.

Structure of Slot Substrate 203

Figure 12:
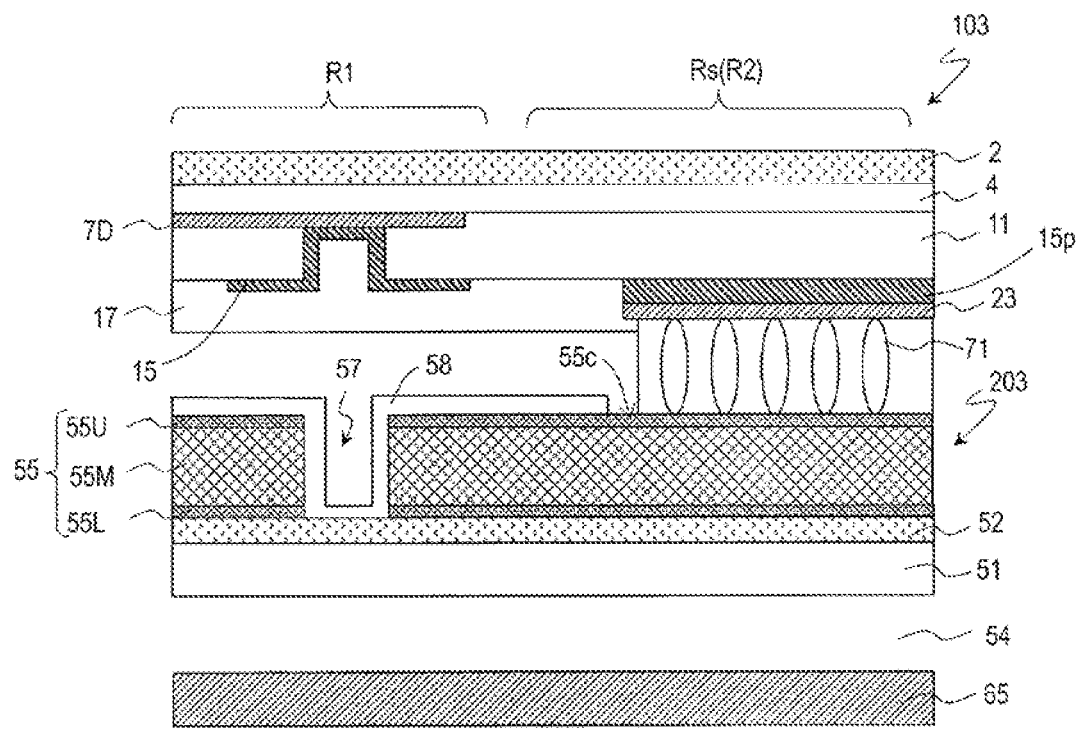
FIG. 12 is a schematic cross-sectional view for illustrating a transfer section in the TFT substrate 103 and a slot substrate 203.

FIG. 12 is a schematic cross-sectional view for illustrating a transfer section that connects the transfer terminal section PT of the TFT substrate 103 and a terminal section IT of a slot substrate 203 in the present embodiment. In FIG. 12, the same reference numerals are attached to the same constituent elements as those in the embodiments described above.

First, the slot substrate 203 in this embodiment will be described. The slot substrate 203 includes the dielectric substrate 51, the third insulating layer 52 formed on the front surface of the dielectric substrate 51, the slot electrode 55 formed on the third insulating layer 52, and the fourth insulating layer 58 covering the slot electrode 55. The reflective conductive plate 65 is disposed opposing the rear surface of the dielectric substrate 51 with the dielectric layer (air layer) 54 interposed therebetween. The slot electrode 55 and the reflective conductive plate 65 function as walls of the waveguide 301.

The slot electrode 55 has a layered structure in which a Cu layer or an Al layer is the main layer 55M. In the transmission and/or reception region R1, a plurality of slots 57 are formed in the slot electrode 55. The structure of the slot electrode 55 in the transmission and/or reception region R1 is the same as the structure of the slot substrate 201 described above with reference to FIG. 6.

The terminal section IT is provided in the non-transmission and/or reception region R2. The terminal section IT includes an opening exposing the front surface of the slot electrode 55 provided in the fourth insulating layer 58. The exposed area of the slot electrode 55 serves as a contact surface 55c. As described above, in the present embodiment, the contact surface 55c of the slot electrode 55 is not covered with the fourth insulating layer 58.

In the transfer section, the protective conductive layer 23 covering the patch connection section 15p of the TFT substrate 103 and the contact surface 55c of the slot electrode 55 of the slot substrate 203 are connected with a resin (sealing resin) containing the conductive beads 71 therebetween.

As in the above-described embodiments, the transfer section in the present embodiment may be disposed at both the central portion and the peripheral portion of the scanning antenna, or may be disposed in only one of them. In addition, the transfer section may be disposed within the seal region Rs or may be disposed outside the seal region Rs (opposite to the liquid crystal layer).

In the present embodiment, no transparent conductive film is provided on the transfer terminal PT and the contact surface of the terminal section IT. Accordingly, the protective conductive layer 23 and the slot electrode 55 of the slot substrate 203 can be connected with a sealing resin containing conductive particles therebetween.

Furthermore, in the present embodiment, since the difference in the depth of the collectively formed contact holes is small in comparison with the first embodiment (FIG. 3A to FIG. 4C), the damage to the conductive film that serves as the base of the contact holes can be reduced.

Manufacturing Method of Slot Substrate 203

The slot substrate 203 is manufactured as follows. Since the material, the thickness, and the formation method of each layer are the same as those of the slot substrate 201, the description thereof is omitted.

First, the third insulating layer 52 and the slot electrode 55 are formed on the dielectric substrate in the same manner as the slot substrate 201, and a plurality of slots 57 are formed in the slot electrode 55. Next, the fourth insulating layer 58 is formed on the slot electrode 55 and within the slot. Subsequently, the opening 18p is formed in the fourth insulating layer 58 so as to expose a region that will become the contact surface of the slot electrode 55. In this way, the slot substrate 203 is manufactured.

Internal Heater Structure

As described above, it is preferable that the dielectric anisotropy $\Delta\varepsilon_M$ of the liquid crystal material used for the antenna unit of the antenna be large. However, the viscosity of liquid crystal materials (nematic liquid crystals) having large dielectric anisotropies $\Delta\varepsilon_M$ is high, and the slow response speed may lead to problems. In particular, as the temperature decreases, the viscosity increases. The environmental temperature of a scanning antenna mounted on a moving body (for example, a ship, an aircraft, or an automobile) fluctuates. Accordingly, it is preferable that the temperature of the liquid crystal material can be adjusted to a certain extent, for example 30° C. or higher, or 45° C. or higher. The set temperature is preferably set such that the viscosity of the nematic liquid crystal material is about 10 cP (centipoise) or less.

In addition to the above structure, the scanning antenna according to the embodiments of the disclosure preferably has an internal heater structure. A resistance heating type heater that uses Joule heat is preferable as the internal heater. The material of the resistive film for the heater is not particularly limited to a specific material, but a conductive material having relatively high specific resistance such as ITO or IZO can be utilized, for example. In addition, to adjust the resistance value, a resistive film may be formed with thin lines or meshes made of a metal (e.g., nichrome, titanium, chromium, platinum, nickel, aluminum, and copper). Thin lines or meshes made of ITO and IZO may be also used. The resistance value may be set according to the required calorific value.

For example, to set the heat generation temperature of the resistive film to 30° C. for an area (roughly 90000 mm$^2$) of a circle having a diameter of 340 mm with 100 V AC (60 Hz), the resistance value of the resistive film should be set to 139Ω, the current should be set to 0.7 A, and the power density should be set to 800 W/m$^2$. To set the heat generation temperature of the resistive film to 45° C. for the same area with 100 V AC (60 Hz), the resistance value of the resistive film should be set to 82Ω, the current should be set to 1.2 A, and the power density should be set to 1350 W/m².

Figure 13A:
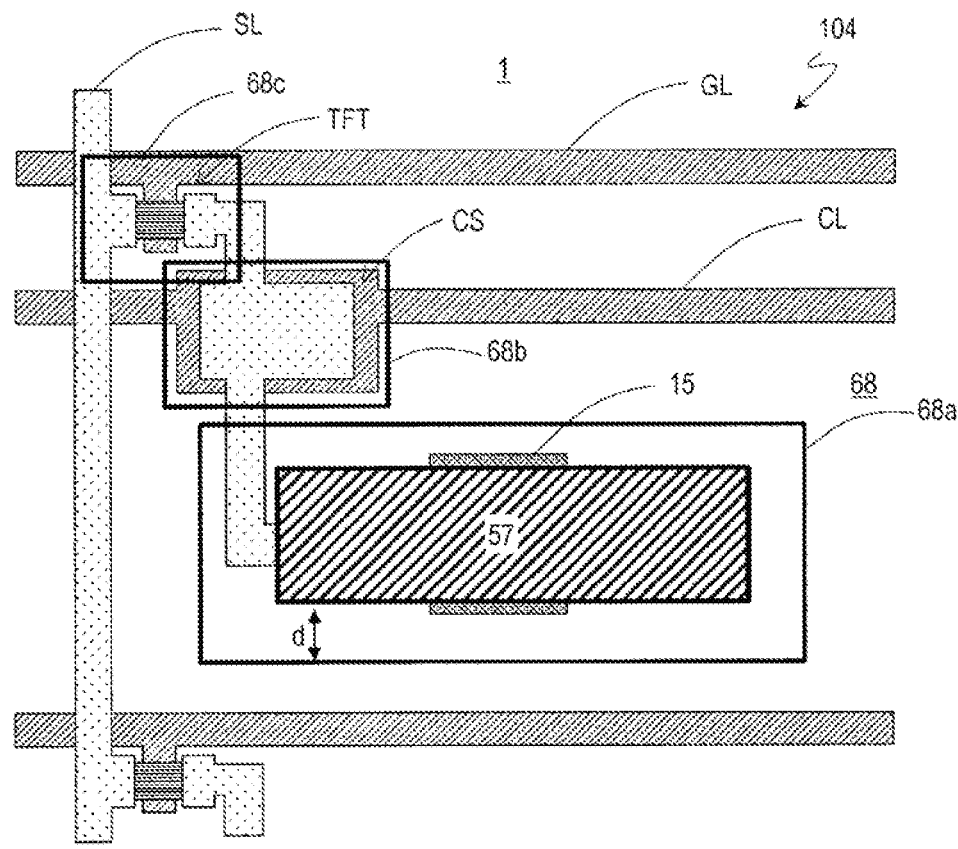
FIG. 13A is a schematic plan view of a TFT substrate 104 including a heater resistive film 68.

The resistive film for the heater may be provided anywhere as long as it does not affect the operation of the scanning antenna, but to efficiently heat the liquid crystal material, the resistive film is preferably provided near the liquid crystal layer. For example, as illustrated in a TFT substrate 104 illustrated in FIG. 13A, a resistive film 68 may be formed on almost the entire surface of the dielectric substrate 1. FIG. 13A is a schematic plan view of the TFT substrate 104 including the heater resistive film 68. The resistive film 68 is covered with, for example, the base insulating film 2 illustrated in FIG. 3A. The base insulating film 2 is formed to have a sufficient dielectric strength.

The resistive film 68 preferably has openings 68a, 68b, and 68c. When the TFT substrate 104 and the slot substrate are bonded to each other, the slots 57 are positioned to oppose the patch electrodes 15. At this time, the opening 68a is disposed such that the resistive film 68 is not present within an area having a distance d from an edge of the slot 57. The distance d is 0.5 mm, for example. In addition, it is also preferable to dispose the opening 68b under the auxiliary capacitance CS and to dispose the opening 68c under the TFT.

Figure 13B:
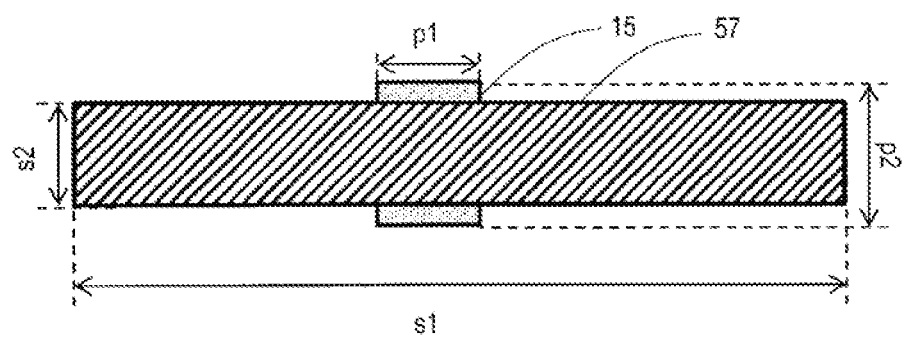
FIG. 13B is a schematic plan view for illustrating sizes of a slot 57 and a patch electrode 15.

Note that the size of the antenna unit U is, for example, 4 mm×4 mm. In addition, as illustrated in FIG. 13B, a width s2 of the slot 57 is 0.5 mm, a length s1 of the slot 57 is 3.3 mm, a width p2 of the patch electrode 15 in a width direction of the slot 57 is 0.7 mm, and a width p1 of the patch electrode 15 in a length direction of the slot 57 is 0.5 mm. Note that the size, shape, arrangement relationships, and the like of the antenna unit U, the slot 57, and the patch electrode 15 are not limited to the examples illustrated in FIG. 13A and FIG. 13B.

To further reduce the influence of the electric field from the heater resistive film 68, a shield conductive layer may be formed. The shield conductive layer is formed, for example, on the base insulating film 2 over almost the entire surface of the dielectric substrate 1. While the shield conductive layer need not include the openings 68a and 68b like in the resistive film 68, the opening 68c is preferably provided therein. The shield conductive layer is formed of, for example, an aluminum layer, and is set to ground potential.

In addition, the resistive film preferably has a distribution of the resistance value so that the liquid crystal layer can be uniformly heated. A temperature distribution of the liquid crystal layer is preferably such that a difference between a maximum temperature and a minimum temperature (temperature fluctuation) is, for example, less than or equal to 15° C. When the temperature fluctuation exceeds 15° C., there are cases that phase difference modulation varies within the plane, and good quality beam formation cannot be achieved. Furthermore, when the temperature of the liquid crystal layer approaches the Tni point (for example, 125° C.), $\Delta\varepsilon_M$ becomes small, which is not preferable.

With reference to FIG. 14A, FIG. 14B, and FIG. 15A to FIG. 15C, the distribution of the resistance value in the resistive film will be described. FIG. 14A, FIG. 14B, and FIG. 15A to FIG. 15C illustrate schematic structures of resistance heating structures 80a to 80e and a current distribution. The resistance heating structure includes a resistive film and a heater terminal.

Figure 14A:
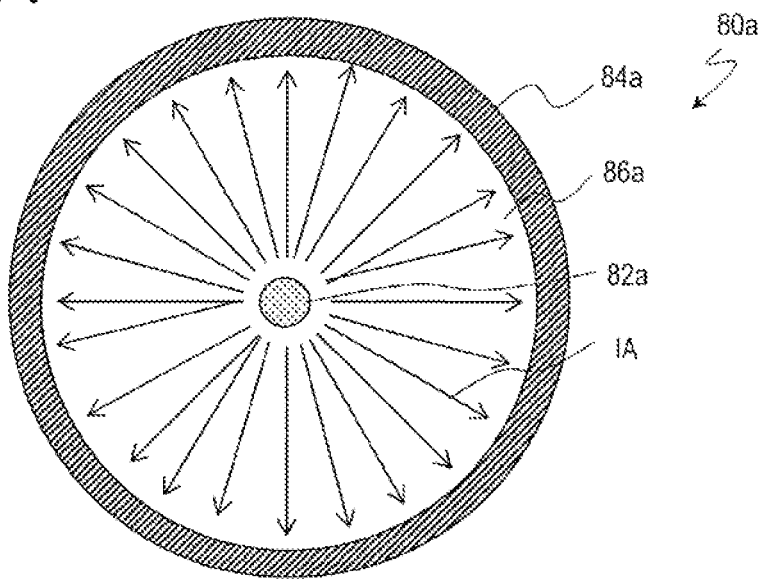
FIG. 14A and FIG. 14B are diagrams illustrating a schematic structure and current distribution of resistance heating structures 80a and 80b, respectively.

The resistance heating structure 80a illustrated in FIG. 14A includes a first terminal 82a, a second terminal 84a, and a resistive film 86a connected thereto. The first terminal 82a is disposed at the center of the circle, and the second terminal 84a is disposed along the entire circumference. Here, the circle corresponds to the transmission and/or reception region R1. When a DC voltage is applied between the first terminal 82a and the second terminal 84a, for example, a current IA flows radially from the first terminal 82a to the second terminal 84a. Accordingly, even though an in-plane resistance value is constant, the resistive film 86a can uniformly generate heat. Of course, the direction of a current flow may be a direction from the second terminal 84a to the first terminal 82a.

Figure 14B:
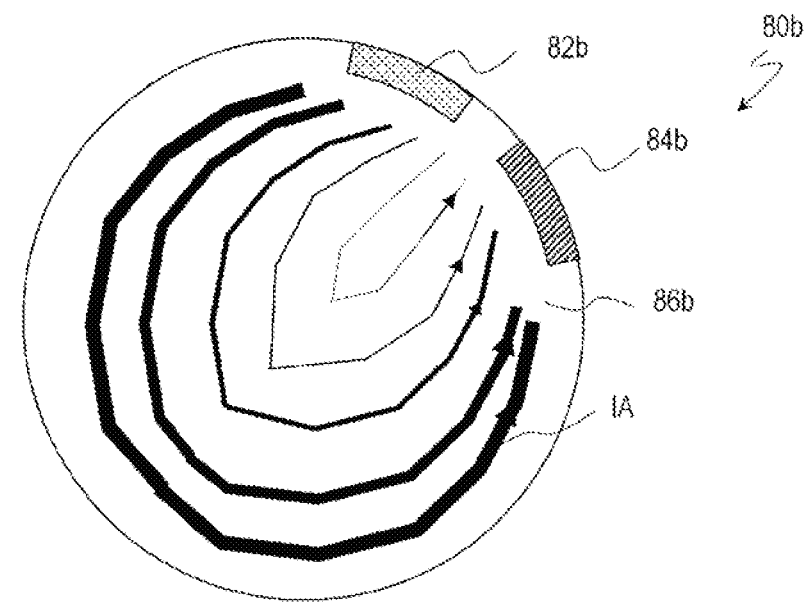

The resistance heating structure 80b illustrated in FIG. 14B includes a first terminal 82b, a second terminal 84b, and a resistive film 86b connected thereto. The first terminal 82b and the second terminal 84b are disposed adjacent to each other along the circumference. A resistance value of the resistive film 86b has an in-plane distribution such that an amount of heat generated per unit area by the current IA flowing between the first terminal 82b and the second terminal 84b in the resistive film 86b is constant. In a case where the resistive film 86b is formed of a thin line, for example, the in-plane distribution of the resistance value of the resistive film 86 may be adjusted by the thickness of the thin line and the density of the thin line.

Figure 15A:
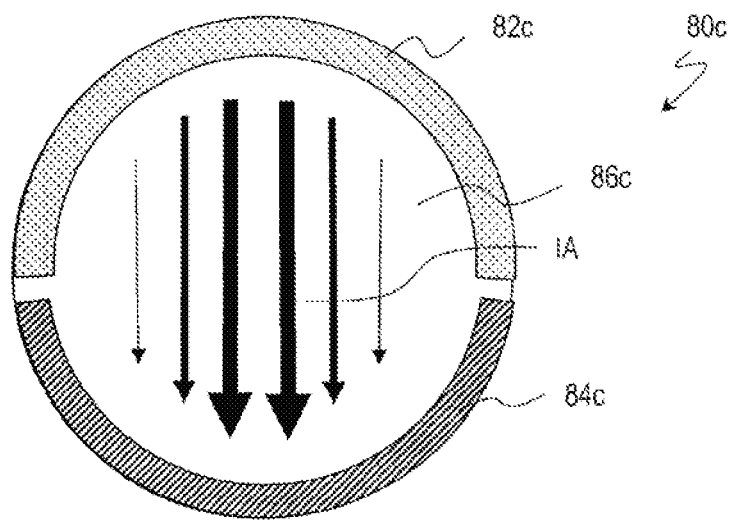
FIG. 15A to FIG. 15C are diagrams illustrating a schematic structure and current distribution of resistance heating structures 80c to 80e, respectively.

The resistance heating structure 80c illustrated in FIG. 15A includes a first terminal 82c, a second terminal 84c, and a resistive film 86c connected thereto. The first terminal 82c is disposed along the circumference of the upper half of the circle, and the second terminal 84c is disposed along the circumference of the lower half of the circle. When the resistive film 86c is constituted by thin lines extending vertically between the first terminal 82c and the second terminal 84c, for example, a thickness and a density of the thin lines near the center are adjusted such that the amount of heat generated per unit area by the current IA is constant in the plane.

Figure 15B:
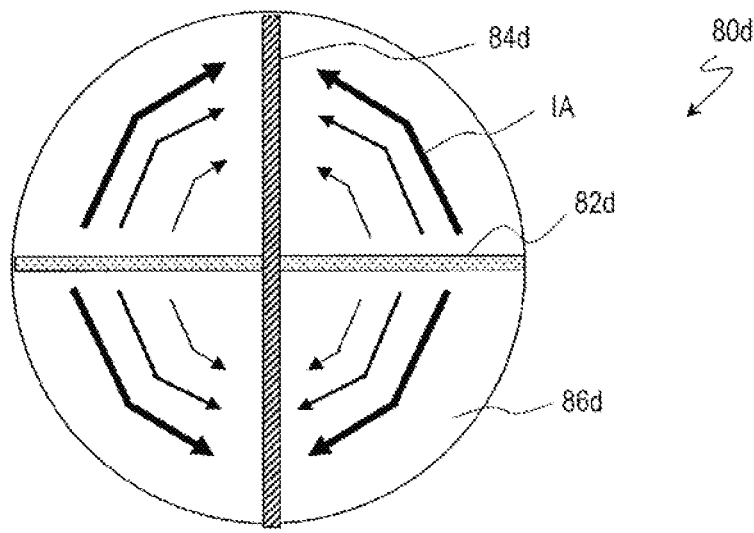

The resistance heating structure 80d illustrated in FIG. 15B includes a first terminal 82d, a second terminal 84d, and a resistive film 86d connected thereto. The first terminal 82d and the second terminal 84d are provided so as to extend in the vertical direction and the horizontal direction, respectively, along the diameter of the circle. Although simplified in drawings, the first terminal 82d and the second terminal 84d are electrically insulated from each other.

Figure 15C:
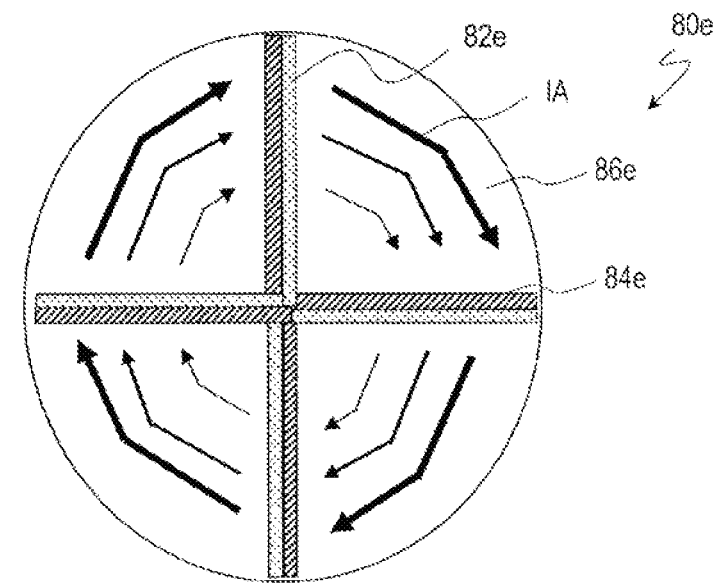

In addition, the resistance heating structure 80e illustrated in FIG. 15C includes a first terminal 82e, a second terminal 84e, and a resistive film 86e connected thereto. Unlike the resistance heating structure 80d, both the first terminal 82e and the second terminal 84e of the resistance heating structure 80e include four portions extending from the center of the circle in four directions upward, downward, left, and right. The portions of the first terminal 82e and the second terminal 84e that form a 90 degree angle with each other are disposed such that the current IA flows clockwise.

In both of the resistance heating structure 80d and the resistance heating structure 80e, the thin line closer to the circumference is adjusted to be thick and have a higher density, for example, so that the closer to the circumference the more the current IA increases, and the amount of heat generated per unit area becomes uniform within the plane.

Such an internal heater structure may automatically operate, for example, when it is detected that the temperature of the scanning antenna has fallen below a preset temperature. Of course, it may also operate in response to the operation of a user.

External Heater Structure

Instead of the internal heater structure described above, or in addition to the internal heater structure, the scanning antenna according to the embodiments of the disclosure may include an external heater structure. A resistance heating type heater that uses Joule heat is preferable as the external heater although various known heaters can be used. Assume that a part generating heat in the heater is a heater section. In the following description, an example in which a resistive film is used as the heater section is described. In the following description also, the resistive film is denoted by the reference numeral 68.

Figure 16A:
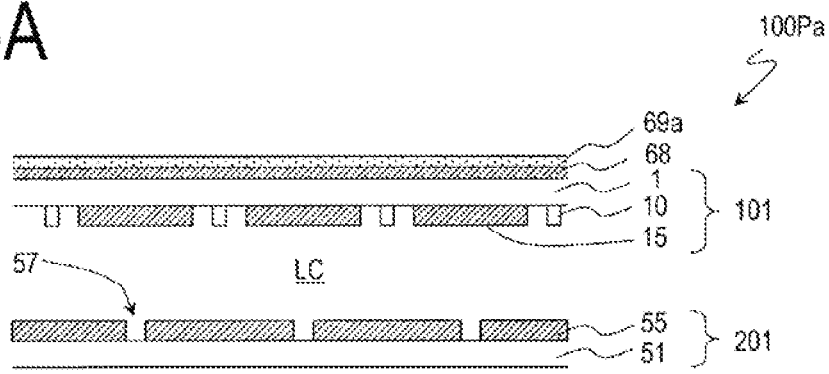
FIG. 16A is a schematic cross-sectional view of a liquid crystal panel 100Pa including the heater resistive film 68.
Figure 16B:
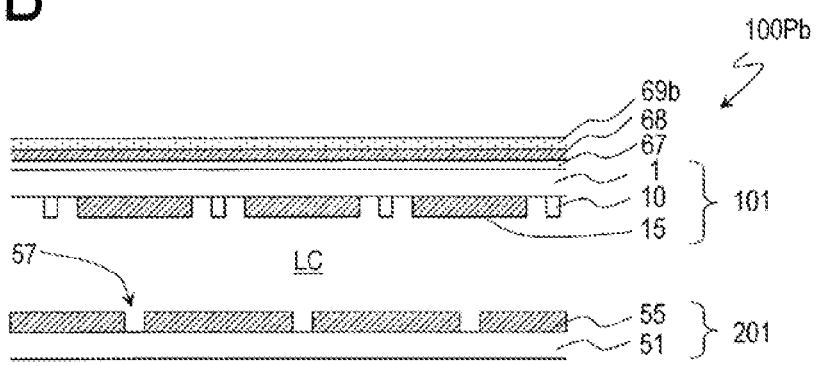
FIG. 16B is a schematic cross-sectional view of a liquid crystal panel 100Pb including the heater resistive film 68.

For example, the heater resistive film 68 is preferably disposed as in a liquid crystal panel 100Pa or 100Pb illustrated in FIGS. 16A and 16B. Here, the liquid crystal panels 100Pa and 100Pb include the TFT substrate 101, slot substrate 201, and liquid crystal layer LC provided therebetween in the scanning antenna 1000 illustrated in FIG. 1, and further includes a resistance heating structure including the resistive film 68 on an outer side of the TFT substrate 101. The resistive film 68 may be formed on a side of the dielectric substrate 1 of the TFT substrate 101 closer to the liquid crystal layer LC. However, such a configuration complicates a manufacturing process of the TFT substrate 101, and thus the resistive film 68 is preferably disposed on the outer side of the TFT substrate 101 (opposite to the liquid crystal layer LC).

The liquid crystal panel 100Pa illustrated in FIG. 16A includes the heater resistive film 68 formed on an outer surface of the dielectric substrate 1 of the TFT substrate 101 and a protective layer 69a covering the heater resistive film 68. The protective layer 69a may be omitted. The scanning antenna is housed in a case made of plastic, for example, and therefore, the resistive film 68 is not directly contacted by the user.

The resistive film 68 can be formed on the outer surface of the dielectric substrate 1 by use of, for example, a known thin film deposition technique (e.g., sputtering, CVD), a coating method, or a printing method. The resistive film 68 is patterned as needed. Patterning is performed through a photolithographic process, for example.

The material of the heater resistive film 68 is not particularly limited to a specific material as described above for the internal heater structure, but a conductive material having relatively high specific resistance such as ITO or IZO can be utilized, for example. In addition, to adjust the resistance value, the resistive film 68 may be formed with thin lines or meshes made of a metal (e.g., nichrome, titanium, chromium, platinum, nickel, aluminum, and copper). Thin lines or meshes made of ITO and IZO may be also used. The resistance value may be set according to the required calorific value.

The protective layer 69a is made of an insulating material and formed to cover the resistive film 68. The protective layer 69a may not be formed on a portion where the resistive film 68 is patterned and the dielectric substrate 1 is exposed. The resistive film 68 is patterned so as not to decrease the antenna performance as described later. In a case where a presence of the material forming the protective layer 69a causes the antenna performance to decrease, the patterned protective layer 69a is preferably used similar to the resistive film 68.

The protective layer 69a may be formed by any of a wet process and a dry process. For example, a liquid curable resin (or precursor of resin) or a solution is applied on the surface of the dielectric substrate 1 on which the resistive film 68 is formed, and thereafter, the curable resin is cured to form the protective layer 69a. The liquid resin or the resin solution is applied to the surface of the dielectric substrate 1 to have a predetermined thickness by various coating methods (e.g., using a slot coater, a spin coater, a spray) or various printing methods. After that, the resultant substrate is subjected to room temperature curing, thermal curing, or light curing depending on a kind of the resin to form the protective layer 69a which is an insulating resin film. The insulating resin film may be patterned by a photolithographic process, for example.

A curable resin material is preferably used as a material for forming the protective layer 69a. The curable resin material includes those of a thermal curing type resin material and a light curing type resin material. The thermal curing type includes a thermal cross-linking type and a thermal polymerization type.

Examples of the resin material of thermal cross-linking type include a combination of an epoxy-based compound (e.g., an epoxy resin) and amine-based compound, a combination of an epoxy-based compound and a hydrazide-based compound, a combination of an epoxy-based compound and an alcohol-based compound (e.g., including a phenol resin), a combination of an epoxy-based compound and a carboxylic acid-based compound (e.g., including an acid anhydride), a combination of an isocyanate-based compound and an amine-based compound, a combination of an isocyanate-based compound and a hydrazide-based compound, a combination of an isocyanate-based compound and an alcohol-based compound (e.g., including an urethane resin), and a combination of an isocyanate-based compound and a carboxylic acid-based compound. Examples of a cationic polymerization type adhesive include a combination of an epoxy-based compound and a cationic polymerization initiator (a representative cationic polymerization initiator:aromatic sulfonium salt). Examples of the resin material of radical polymerization type include a combination of a monomer and/or an oligomer containing a vinyl group of various acrylic, methacrylic, and urethane modified acrylic (methacrylic) resins and a radical polymerization initiator (a representative radical polymerization initiator: azo-based compound (e.g., azobisisobutyronitrile (AIBN))), and examples of the resin material of ring-opening polymerization type include an ethylene oxide-based compound, an ethyleneimine-based compound, and a siloxane-based compound. In addition, examples of the resin material may also include a maleimide resin, a combination of a maleimide resin and an amine, a combination of maleimide and a methacrylic compound, a bismaleimide-triazine resin, and a polyphenylene ether resin. Moreover, polyimide can be preferably used. Note that "polyimide" including polyamic acid that is a precursor of polyimide is used. Polyimide is used in combination with an epoxy-based compound or an isocyanate-based compound, for example.

In terms of a heat resistance, a chemical stability, and mechanical characteristics, the thermal curing type resin material is preferably used. Particularly, the resin material containing an epoxy resin or a polyimide resin is preferable, and in terms of the mechanical characteristics (in particular, a mechanical strength) and a hygroscopicity, the resin material containing a polyimide resin is preferable. A polyimide resin and an epoxy resin may be mixed to be used. A polyimide resin and/or an epoxy resin may be mixed with a thermoplastic resin and/or an elastomer. Furthermore, rubber-modified polyimide resin and/or epoxy resin may be mixed. A thermoplastic resin or an elastomer can be mixed to improve flexibility or toughness. Even when the rubber-modified resin is used, the same effect can be obtained.

A cross-linking reaction and/or a polymerization reaction of the light curing type material is caused by an ultraviolet light or a visible light, and the light curing type material cures. The light curing type includes a radical polymerization type and a cationic polymerization type, for example. Representative examples of the radical polymerization type material include a combination of an acrylic resin (epoxy modified acrylic resin, urethane modified acrylic resin, silicone modified acrylic resin) and a photopolymerization initiator. Examples of an ultraviolet radical polymerization initiator include an acetophenone type initiator and a benzophenone type initiator. Examples of a visible light radical polymerization initiator include a benzylic type initiator and a thioxanthone type initiator. Representative examples of a cationic polymerization type material include a combination of an epoxy-based compound and a photo cationic polymerization initiator. Examples of a photo cationic polymerization initiator include an iodonium salt-based compound. A resin material having both light curing and thermal curing characteristics can be used also.

The liquid crystal panel 100Pb illustrated in FIG. 16B is different from the liquid crystal panel 100Pa in that the liquid crystal panel 100Pb further includes an adhesive layer 67 between the resistive film 68 and the dielectric substrate 1. Moreover, the liquid crystal panel 100Pb is different from the liquid crystal panel 100Pa in that the protective layer 69b is formed using a polymer film or glass plate fabricated in advance.

For example, the liquid crystal panel 100Pb including the protective layer 69b formed of a polymer film is manufactured as below.

First, an insulating polymer film that will become the protective layer 69b is prepared. Examples of a polymer film include a polyester film made of polyethylene terephthalate, polyethylene naphthalate or the like, and a film made of super engineering plastic such as polyphenylene sulfone, polyimide, or polyamide. A thickness of the polymer film (that is, a thickness of the protective layer 69b) is greater than or equal to 5 μm and less than or equal to 200 μm, for example.

The resistive film 68 is formed on one surface of this polymer film. The resistive film 68 can be formed by the above method. The resistive film 68 may be patterned, and the polymer film may be also patterned as needed.

The polymer film on which the resistive film 68 is formed (that is, a member integrally formed of the protective layer 69b and the resistive film 68) is bonded to the dielectric substrate 1 with an adhesive. Examples of the adhesive include the same curable resin as the curable resin used to form the protective layer 69a described above. Furthermore, a hot-melt type resin material (adhesive) can be used. The hot-melt type resin material contains a thermoplastic resin as a main component, and melts by heating and solidifies by cooling. Examples of the hot-melt type resin material include polyolefin-based (e.g., polyethylene, polypropylene), polyamide-based, and ethylene vinyl acetate-based resins. A reactive urethane-based hot-melt resin material (adhesive) is also available. In terms of adhesive and durability, the reactive urethane-based resin is preferable.

The adhesive layer 67 may be patterned similar to the resistive film 68 and the protective layer (polymer film) 69b. However, the adhesive layer 67 needs only fix the resistive film 68 and the protective layer 69b to the dielectric substrate 1, and may be smaller than the resistive film 68 and the protective layer 69b.

In place of the polymer film, the glass plate may be also used to form the protective layer 69b. A manufacturing process may be the same as the case using the polymer film. A thickness of the glass plate is preferably less than or equal to 1 mm and further preferably less than or equal to 0.7 mm. A lower limit of the thickness of the glass plate is not specifically specified, but in terms of handling, the thickness of the glass plate is preferably greater than or equal to 0.3 mm.

In the liquid crystal panel 100Pb illustrated in FIG. 16B, the resistive film 68 formed on the protective layer (polymer film or glass plate) 69b is fixed to the dielectric substrate 1 via the adhesive layer 67, but the resistive film 68 needs only be disposed in contact with the dielectric substrate 1 and the resistive film 68 and the protective layer 69b are not necessarily fixed (bonded) to the dielectric substrate 1. In other words, the adhesive layer 67 may be omitted. For example, the polymer film on which the resistive film 68 is formed (that is, a member integrally formed of the protective layer 69b and the resistive film 68) may be disposed such that the resistive film 68 is brought into contact with the dielectric substrate 1 and is pressed against the dielectric substrate 1 with the case housing the scanning antenna. For example, since the thermal contact resistance possibly increases when the polymer film on which the resistive film 68 is formed is merely disposed only, the polymer film is preferably pressed against the dielectric substrate to decrease the thermal contact resistance. Using such a configuration allows the member integrally formed of the resistive film 68 and the protective layer (polymer film or glass plate) 69b to be detachable.

Note that in a case where the resistive film 68 (and the protective layer 69b) is patterned as described later, the resistive film 68 (and the protective layer 69b) is preferably fixed to the dielectric substrate 1 to a degree not to shift in a position with respect to the TFT substrate so that the antenna performance does not decrease.

The heater resistive film 68 may be provided anywhere as long as it does not affect the operation of the scanning antenna, but to efficiently heat the liquid crystal material, the resistive film is preferably provided near the liquid crystal layer. Therefore, the heater resistive film 68 is preferably provided on the outer side of the TFT substrate 101 as illustrated in FIGS. 16A and 16B. In addition, the resistive film 68 directly provided on the outer side of the dielectric substrate 1 of the TFT substrate 101 as illustrated in FIG. 16A is preferable, because an energy efficiency is higher, and controllability of the temperature is higher than those in a case in which the resistive film 68 is provided on the outer side of the dielectric substrate 1 with the adhesive layer 67 therebetween as illustrated in FIG. 16B.

For example, the resistive film 68 may be formed on almost the entire surface of the dielectric substrate 1 of the TFT substrate 104 illustrated in FIG. 13A. The resistive film 68 preferably includes the openings 68a, 68b, and 68c as described for the internal heater structure.

The protective layers 69a and 69b may be formed on the entire surface to cover the resistive film 68. As described above, in a case where the protective layer 69a or 69b has an adverse effect on antenna characteristics, openings corresponding to the openings 68a, 68b, and 68c of the resistive film 68 may be provided. In this case, the openings of the protective layer 69a or 69b are formed inside the openings 68a, 68b, and 68c of the resistive film 68.

To further reduce the influence of the electric field from the heater resistive film 68, a shield conductive layer may be formed. The shield conductive layer is formed on the side of the resistive film 68 closer to the dielectric substrate 1 with an insulating film therebetween, for example. The shield conductive layer is formed on almost the entire surface of the dielectric substrate 1. While the shield conductive layer need not include the openings 68a and 68b like in the resistive film 68, the opening 68c is preferably provided therein. The shield conductive layer is formed of, for example, an aluminum layer, and is set to ground potential. In addition, the resistive film preferably has a distribution of the resistance value so that the liquid crystal layer can be uniformly heated. These structures are similar to the structures of the internal heater structure described above.

The resistive film needs only heat the liquid crystal layer LC in the transmission and/or reception region R1, and may be provided on an area corresponding to the transmission and/or reception region R1 as an example described above. However, the structure of the resistive film is not limited to this structure. For example, as illustrated in FIG. 2A, in a case where the TFT substrate 101 has an outline capable of defining a rectangular area encompassing the transmission and/or reception region R1, the resistive film may be provided on an area corresponding to the rectangular area encompassing the transmission and/or reception region R1. Of course, the outline of the resistive film is not limited to a rectangle, and may be any shape encompassing the transmission and/or reception region R1.

In the above example, the resistive film is disposed on the outer side of the TFT substrate 101, but the resistive film may be disposed on an outer side of the slot substrate 201 (opposite to the liquid crystal layer LC). In this case also, the resistive film may be formed directly on the dielectric substrate 51 similar to the liquid crystal panel 100Pa in FIG. 16A, or the resistive film formed on the protective layer (polymer film or glass plate) with the adhesive layer therebetween may be fixed to the dielectric substrate 51 similar to the liquid crystal panel 100Pb in FIG. 16B. Alternatively, the protective layer on which the resistive film is formed without the adhesive layer (that is, the member integrally formed of the protective layer and the resistive film) may be disposed such that the resistive film is in contact with the dielectric substrate 51. For example, since the thermal contact resistance possibly increases in a case where the polymer film on which the resistive film is formed is merely disposed only, the polymer film is preferably pressed against the dielectric substrate 51 to decrease the thermal contact resistance. Using such a configuration allows the member integrally formed of the resistive film and the protective layer (polymer film or glass plate) to be detachable. Note that in a case where the resistive film (and the protective layer) is patterned, the resistive film (and the protective layer) is preferably fixed to the dielectric substrate to a degree not to shift in a position with respect to the slot substrate so that the antenna performance does not decrease.

In a case where the resistive film is disposed on the outer side of the slot substrate 201, openings are preferably provided in the resistive film at positions corresponding to the slots 57. The resistive film has preferably a thickness enough to transmit microwaves.

Here, the example in which the resistive film is used as the heater section is described, but other than the example, a nichrome line (e.g., winding wire), an infrared light heater section, and the like may be used as the heater section, for example. In the cases like these also, the heater section is preferably disposed not to decrease the antenna performance.

Such an external heater structure may automatically operate, for example, when it is detected that the temperature of the scanning antenna has fallen below a preset temperature. Of course, it may also operate in response to the operation of a user.

As a temperature control device for making the external heater structure automatically operate, various known thermostats can be used, for example. For example, a thermostat using bimetal may be connected between one of two terminals connected with the resistive film and a power source. Of course, a temperature control device may be used which supplies current to the external heater structure from the power source to prevent the temperature from falling below a preset temperature by use of a temperature sensor.

Driving Method

Since an antenna unit array of the scanning antenna according to the embodiments of the disclosure has a structure similar to that of an LCD panel, line sequential driving is performed in the same manner as an LCD panel. However, in a case where existing driving methods for LCD panels are applied, the following problems may occur. Problems that may occur in the scanning antenna will be described with reference to the equivalent circuit diagram of one antenna unit of the scanning antenna illustrated in FIG. 17.

First, as mentioned above, since the specific resistance of liquid crystal materials having large dielectric anisotropies $\Delta\varepsilon_M$ (birefringence $\Delta n$ with respect to visible light) in the microwave range is low, in a case where driving methods for LCD panels are applied as is, the voltage applied to the liquid crystal layer cannot be sufficiently maintained. Then, the effective voltage applied to the liquid crystal layer decreases, and the electrostatic capacitance value of the liquid crystal capacitance does not reach the target value.

In this way, when the voltage applied to the liquid crystal layer deviates from the predetermined value, the direction in which the gain of the antenna becomes maximum deviates from the intended direction. Then, for example, communication satellites cannot be accurately tracked. To prevent this, an auxiliary capacitance CS is provided electrically in parallel with the liquid crystal capacitance Clc, and the capacitance value C-Ccs of the auxiliary capacitance CS is sufficiently increased. The capacitance value C-Ccs of the auxiliary capacitance CS is preferably set appropriately such that the voltage retention rate of the liquid crystal capacitance Clc is, for example, at least 30% or greater, and more preferably at least 55% or greater. The capacitance value C-Ccs of the auxiliary capacitance CS depends on the surface areas of the electrode CSE1 and the electrode CSE2 as well as the thickness and dielectric constant of the dielectric layer between the electrode CSE1 and the electrode CSE2. Typically, the same voltage as that of the patch electrode 15 is supplied to the electrode CSE1, and the same voltage as that of the slot electrode 55 is supplied to the electrode CSE2.

In addition, when a liquid crystal material having a low specific resistance is utilized, a voltage reduction due to the interface polarization and/or the orientation polarization also occurs. To prevent the voltage drop due to these polarizations, it is conceivable to apply a sufficiently high voltage in anticipation of the voltage drop. However, when a high voltage is applied to a liquid crystal layer having a low specific resistance, a dynamic scattering effect (DS effect) may occur. The DS effect is caused by a convection of ionic impurities in the liquid crystal layer, and the dielectric constant CM of the liquid crystal layer approaches an average value $((\varepsilon_M // + 2\varepsilon_M \perp)/3)$. Also, to control the dielectric constant $\varepsilon_M$ of the liquid crystal layer in multiple stages (multiple gray scales), it is not always possible to apply a sufficiently high voltage.

To suppress the above-described DS effect and/or the voltage drop due to the polarization, the polarity inversion period of the voltage applied to the liquid crystal layer may be sufficiently shortened. As is well known, in a case where the polarity inversion period of the applied voltage is shortened, a threshold voltage at which the DS effect occurs becomes higher. Accordingly, the polarity inversion frequency may be determined such that the maximum value of the voltage (absolute value) applied to the liquid crystal layer is less than the threshold voltage at which the DS effect occurs. For the polarity inversion frequency of 300 Hz or greater, even in a case where a voltage with an absolute value of 10 V is applied to a liquid crystal layer having a specific resistance of $1 \times 10^{10}$ Ω·cm and a dielectric anisotropy Δε (@1 kHz) of about −0.6, a good quality operation can be ensured. In addition, in a case where the polarity inversion frequency (typically equal to twice the frame frequency) is 300 Hz or greater, the voltage drop caused by the polarization is also suppressed. From the viewpoint of power consumption and the like, the upper limit of the polarity inversion period is preferably about less than or equal to 5 KHz.

The polarity inversion frequency of the voltage applied to the liquid crystal layer naturally depends on the liquid crystal material (low resistance, in particular). Thus, depending on the liquid crystal material, the problem described above does not occur even when voltage is applied at a polarity inversion period less than 300 Hz. However, the liquid crystal material used in the scanning antenna according to the embodiment of the disclosure has a specific resistance less than that of the liquid crystal material used in an LCD and thus, in general, driving at approximately 60 Hz or greater is preferred.

As described above, since the viscosity of the liquid crystal material depends on the temperature, it is preferable that the temperature of the liquid crystal layer be appropriately controlled. The physical properties and driving conditions of the liquid crystal material described here are values under the operating temperature of the liquid crystal layer. Conversely, the temperature of the liquid crystal layer is preferably controlled such that it can be driven under the above conditions.

An example of a waveform of a signal used for driving the scanning antenna will be described with reference to FIG. 18A to FIG. 18G. Note that FIG. 18D illustrates the waveform of the display signal Vs (LCD) supplied to the source bus line of the LCD panel for comparison.

FIG. 18A illustrates the waveform of a scanning signal Vg supplied to a gate bus line G-L1, FIG. 18B illustrates the waveform of a scanning signal Vg supplied to a gate bus line G-L2, FIG. 18C illustrates the waveform of a scanning signal Vg supplied to a gate bus line G-L3, FIG. 18E illustrates the waveform of a data signal Vda supplied to the source bus line, FIG. 18F illustrates the waveform of a slot voltage Vidc supplied to the slot electrode of the slot substrate (slot electrode), and FIG. 18G illustrates the waveform of the voltage applied to the liquid crystal layer of each antenna unit.

As illustrates in FIG. 18A to FIG. 18C, the voltage of the scanning signal Vg supplied to the gate bus line sequentially changes from a low level (VgL) to a high level (VgH). VgL and VgH can be appropriately set according to the characteristics of the TFT. For example, VgL=from −5 V to 0 V, and VgH=+20 V. Also, VgL=−20 V and VgH=+20 V are possible. A period from the time when the voltage of the scanning signal Vg of a particular gate bus line switches from the low level (VgL) to the high level (VgH) until the time when the voltage of the next gate bus line switches from VgL to VgH will be referred to as one horizontal scan period (1H). In addition, the period during which the voltage of each gate bus line is at the high level (VgH) will be referred to as a selection period PS. In this selection period PS, the TFTs connected to the respective gate bus lines are turned on, and the current voltage of the data signal Vda supplied to the source bus line is supplied to the corresponding patch electrode. The data signal Vda is, for example, from −15 V to 15 V (an absolute value is 15 V), and, for example, a data signal Vda having different absolute values corresponding to 12 gray scales, or preferably corresponding to 16 gray scales is used.

Here, a case is exemplified where an intermediate voltage is applied to all antenna units. That is, it is assumed that the voltage of the data signal Vda is constant with respect to all antenna units (assumed to be connected to m gate bus lines). This corresponds to the case where the gray levels are displayed on the LCD panel over the whole surface thereof. At this time, dot inversion driving is performed in the LCD panel. That is, in each frame, the display signal voltage is supplied such that the polarities of adjacent pixels (dots) are opposite to each other.

FIG. 18D illustrates the waveform of the display signal of the LCD panel on which the dot inversion driving is performed. As illustrated in FIG. 18D, the polarity of Vs (LCD) is reversed every 1H. The polarity of the Vs (LCD) supplied to a source bus line adjacent to a source bus line supplied with the Vs (LCD) having this waveform is opposite to the polarity of the Vs (LCD) illustrated in FIG. 18D. Furthermore, the polarity of the display signal supplied to all the pixels is inverted for each frame. In the LCD panels, it is difficult to perfectly match the magnitude of the effective voltage applied to the liquid crystal layer between the positive polarity and the negative polarity, and further, the difference in effective voltage becomes a difference in luminance, which is observed as flicker. To make this flicker less noticeable, the pixels (dots) to which voltages of different polarities are applied are spatially dispersed in each frame. Typically, by performing the dot inversion driving, the pixels (dots) having different polarities are arranged in a checkered pattern.

In contrast, in the scanning antenna, the flicker itself is not problematic. That is, it is sufficient for the electrostatic capacitance value of the liquid crystal capacitance to be an intended value, and the spatial distribution of the polarity in each frame is not problematic. Accordingly, from the perspective of low power consumption or the like, it is preferable to reduce the number of times of polarity inversion of the data signal Vda supplied from the source bus line; that is, to lengthen the period of polarity inversion. For example, as illustrated in FIG. 18E, the period of polarity inversion may be set to 10 H (such that polarity inversion occurs every 5 H). Of course, in a case where the number of antenna units connected to each source bus line (typically equal to the number of gate bus lines) is m, the period of polarity inversion of the data signal Vda may be 2 m-H (polarity inversion occurs each m·H). The period of polarity inversion of the data signal Vda may be equal to 2 frames (a polarity inversion occurs each frame).

In addition, the polarity of the data signal Vda supplied from all the source bus lines may be the same. Accordingly, for example, in a particular frame, a positive polarity data signal Vda may be supplied from all the source bus lines, and in the next frame, a negative polarity data signal Vda may be supplied from all the source bus lines.

Alternatively, the polarities of the data signals Vda supplied from the adjacent source bus lines may be opposite to each other. For example, in a particular frame, a positive polarity data signal Vda is supplied from odd-numbered source bus lines, and a negative polarity data signal Vda may be supplied from even-numbered source bus lines. Then, in the next frame, the negative polarity data signal Vda is supplied from the odd-numbered source bus lines, and the positive polarity data signal Vda is supplied from the even-numbered source bus lines. In the LCD panels, such a driving method is referred to as source line inversion driving. In a case where the data signals Vda supplied from adjacent source bus line are made to have opposite polarity, by connecting (short-circuiting) adjacent source bus lines to each other before inverting the polarity of the data signals Vda supplied between frames, it is possible to cancel electric charges stored in the liquid crystal capacitance between adjacent columns. Accordingly, an advantage can be obtained such that the amount of electric charge supplied from the source bus line in each frame can be reduced.

As illustrated in FIG. 18F, the voltage Vidc of the slot electrode is, for example, a DC voltage, and is typically a ground potential. Since the capacitance value of the capacitance (liquid crystal capacitance and auxiliary capacitance) of the antenna units is greater than the capacitance value of the pixel capacitance of the LCD panel (for example, about 30 times in comparison with 20-inch LCD panels), there is no affect from a pull-in voltage due to a parasitic capacitance of the TFT, and even in a case where the voltage Vidc of the slot electrode is the ground potential and the data signal Vda is a positive or negative symmetrical voltage with reference to the ground potential, the voltage supplied to the patch electrode is a positive and negative symmetrical voltage. In the LCD panels, although the positive and negative symmetrical voltages are applied to the pixel electrode by adjusting the voltage (common voltage) of the counter electrode in consideration of the pull-in voltage of the TFT, this is not necessary for the slot voltage of the scanning antenna, and ground potential may be used. Also, although not illustrated in FIG. 18A to FIG. 18G, the same voltage as the slot voltage Vidc is supplied to the CS bus line.

Since the voltage applied to the liquid crystal capacitance of each antenna unit is the voltage of the patch electrode with respect to the voltage Vidc (FIG. 18F) of the slot electrode (that is, the voltage of the data signal Vda illustrated in FIG. 18E), when the slot voltage Vidc is the ground potential, as illustrated in FIG. 18G, the voltage coincides with the waveform of the data signal Vda illustrated in FIG. 18E.

The waveform of the signal used for driving the scanning antenna is not limited to the above example. For example, as described below with reference to FIG. 19A to FIG. 19E and FIG. 20A to FIG. 20E, a Viac having an oscillation waveform may also be used as the voltage of the slot electrode.

For example, signals such as those exemplified in FIG. 19A to FIG. 19E can be used. In FIG. 19A to FIG. 19E, although the waveform of the scanning signal Vg supplied to the gate bus line is omitted, the scanning signal Vg described with reference to FIG. 18A to FIG. 18C is also used here.

Figure 19A:
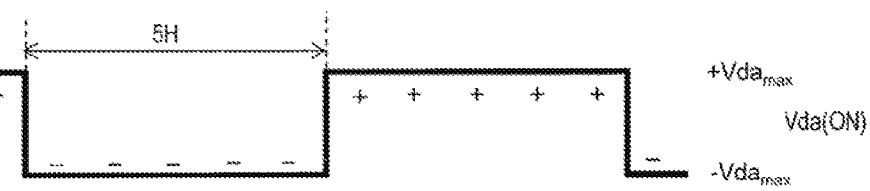
FIG. 19A to FIG. 19E are each a diagram illustrating another example of a waveform of each signal used for driving the scanning antenna according to an embodiment.

As illustrated in FIG. 19A, similar to that illustrated in FIG. 18E, a case where the waveform of the data signal Vda is inverted in polarity at a 10H period (every 5 H) will be exemplified. Here, a case where an amplitude is the maximum value $|Vda_{max}|$ is illustrated as the data signal Vda. As described above, the waveform of the data signal Vda may be inverted in polarity at a two frame period (each frame).

Figure 19B:
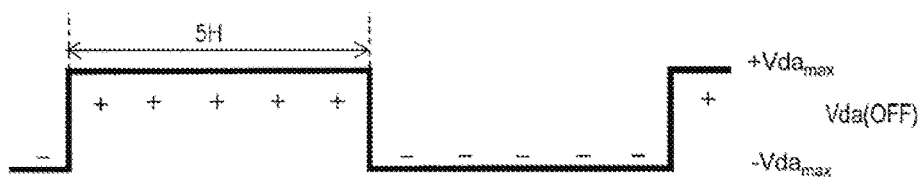
Figure 19C:

Here, as illustrated in FIG. 19C, the voltage Viac of the slot electrode is an oscillation voltage such that the polarity of the voltage Viac of the slot electrode is opposite to the polarity of the data signal Vda (ON), and the oscillation period of the slot electrode is the same as that of data signal Vda (ON). The amplitude of the voltage Viac of the slot electrode is equal to the maximum value $|Vda_{max}|$ of the amplitude of the data signal Vda. That is, the slot voltage Viac is set to a voltage that oscillates between $-Vda_{max}$ and $+Vda_{max}$ with the same period of polarity inversion as that of the data signal Vda (ON) and opposite polarity (the phase differs by 180°).

Figure 19D:
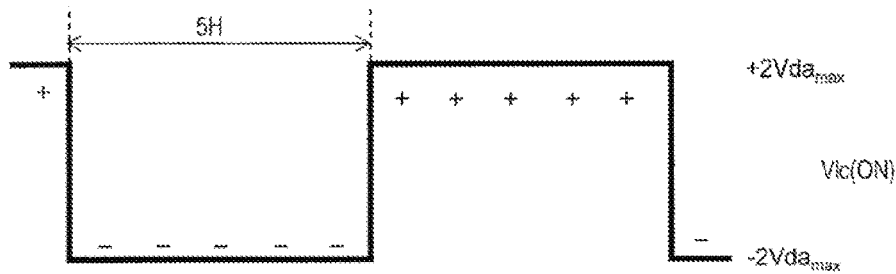

Since a voltage Vlc applied to the liquid crystal capacitance of each antenna unit is the voltage of the patch electrode with respect to the voltage Viac (FIG. 19C) of the slot electrode (that is, the voltage of the data signal Vda (ON) illustrated in FIG. 19A), when the amplitude of the data signal Vda oscillates at $\pm Vda_{max}$, the voltage applied to the liquid crystal capacitance has a waveform that oscillates with an amplitude twice $Vda_{max}$ as illustrated in FIG. 19D. Accordingly, the maximum amplitude of the data signal Vda required to make the maximum amplitude of the voltage Vlc applied to the liquid crystal capacitance $\pm Vda_{max}$ is $\pm Vda_{max}/2$.

Since the maximum amplitude of the data signal Vda can be halved by using such a slot voltage Viac, there is the advantage that a general-purpose driver IC with a breakdown voltage of 20 V or less can be used as a driver circuit for outputting the data signal Vda, for example.

Figure 19E:
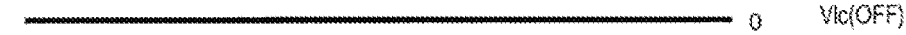

Note that, as illustrated in FIG. 19E, to make the voltage Vlc (OFF) applied to the liquid crystal capacitance of each antenna unit zero, as illustrated in FIG. 19B, it may be preferable for the data signal Vda (OFF) to have the same waveform as that of the slot voltage Viac.

Consider, for example, a case where the maximum amplitude of the voltage Vlc applied to the liquid crystal capacitance is ±15 V. When the Vidc illustrated in FIG. 18F is used as the slot voltage and Vidc=0 V, the maximum amplitude of Vda illustrated in FIG. 18E becomes ±15 V. In contrast, when the Viac illustrated in FIG. 19C is used as the slot voltage and the maximum amplitude of Viac is ±7.5 V, the maximum amplitude of Vda (ON) illustrated in FIG. 19A becomes ±7.5 V.

When the voltage Vlc applied to the liquid crystal capacitance is 0 V, the Vda illustrated in FIG. 18E may be set to 0 V, and the maximum amplitude of the Vda (OFF) illustrated in FIG. 19B may be set to ±7.5 V.

In a case where the Viac illustrated in FIG. 19C is utilized, the amplitude of the voltage Vlc applied to the liquid crystal capacitance is different from the amplitude of Vda, and therefore appropriate conversions are necessary.

Signals such as those exemplified in FIG. 20A to FIG. 20E can also be used. The signals illustrated in FIG. 20A to FIG. 20E are the same as the signals illustrated in FIG. 19A to FIG. 19E in that the voltage Viac of the slot electrode is an oscillation voltage such that the oscillation phase thereof is shifted by 180° from the oscillation phase of the data signal Vda (ON) as illustrated FIG. 20C. However, as illustrated in each of FIG. 20A to FIG. 20C, all of the data signals Vda (ON), Vda (OFF) and the slot voltage Viac are voltages oscillating between 0 V and a positive voltage. The amplitude of the voltage Viac of the slot electrode is equal to the maximum value $|Vda_{max}|$ of the amplitude of the data signal Vda.

When such a signal is utilized, the driving circuit only needs to output a positive voltage, which contributes to cost reduction. As described above, even in a case where a voltage oscillating between 0 V and a positive voltage is used, as illustrated in FIG. 20D, the polarity of the voltage Vlc (ON) applied to the liquid crystal capacitance is inverted. In the voltage waveform illustrated in FIG. 20D, + (positive) indicates that the voltage of the patch electrode is higher than the slot voltage, and − (negative) indicates that the voltage of the patch electrode is lower than the slot voltage. That is, the direction (polarity) of the electric field applied to the liquid crystal layer is reversed similarly to the other examples. The amplitude of the voltage Vlc (ON) applied to the liquid crystal capacitance is $Vda_{max}$.

Figure 20A:
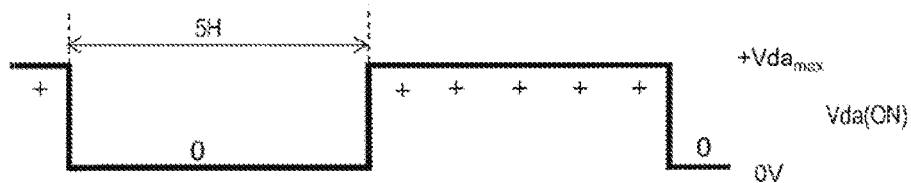
FIG. 20A to FIG. 20E are each a diagram illustrating yet another example of a waveforms of each signal used for driving the scanning antenna according to an embodiment.
Figure 20B:
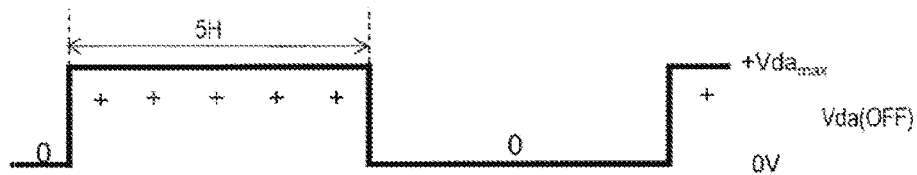
Figure 20C:
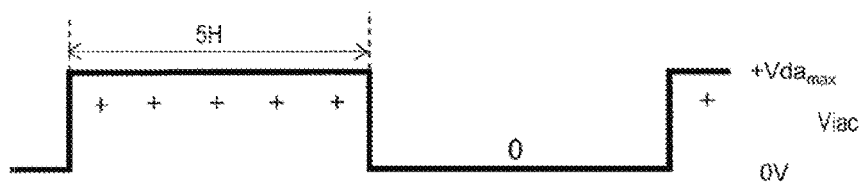
Figure 20D:
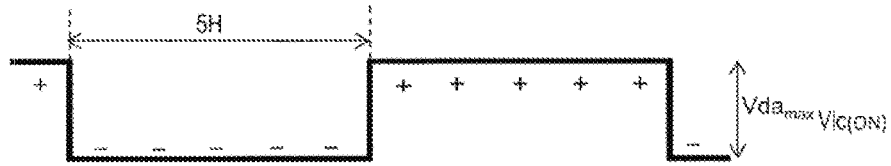
Figure 20E:

Note that, as illustrated in FIG. 20E, to make the voltage Vlc (OFF) applied to the liquid crystal capacitance of each antenna unit zero, as illustrated in FIG. 20B, it may be preferable for the data signal Vda (OFF) to have the same waveform as that of the slot voltage Viac.

The driving method described with reference to FIG. 19A to FIG. 19E and FIG. 20A to FIG. 20E of oscillating (inverting) the voltage Viac of the slot electrodes corresponds to a driving method of inverting the counter voltage in the driving method of LCD panels (sometimes referred to as a "common inversion drive"). In the LCD panels, since the flicker cannot be sufficiently suppressed, the common inversion drive is not utilized. In contrast, in the scanning antennas, since the flicker does not matter, the slot voltage can be reversed. Oscillation (inversion) is performed in each frame, for example (the 5H in FIG. 19A to FIG. 19E and FIG. 20A to FIG. 20E is set to 1 V (vertical scanning period or frame)).

In the above description, although an example of the voltage Viac of the slot electrode is described in which one voltage is applied; that is, an example in which a common slot electrode is provided for all patch electrodes, the slot electrode may be divided corresponding to one row or two or more rows of the patch electrode. Here, a row refers to a set of patch electrodes connected to one gate bus line with a TFT therebetween. By dividing the slot electrode into a plurality of row portions in this way, the polarities of the voltages of the respective portions of the slot electrode can be made independent from each other. For example, in a freely-selected frame, the polarity of the voltage applied to the patch electrodes can be reversed between the patch electrodes connected to adjacent gate bus lines. In this way, it is possible to perform row inversion in which the polarity is inverted not only for each single row (1H inversion) of the patch electrode, but also m row inversion (mH inversion) in which the polarity is inverted for every two or more rows. Of course, row inversion and frame inversion can be combined.

From the viewpoint of simplicity of driving, it is preferable that the polarity of the voltage applied to the patch electrode be the same in any frame, and the polarity be reversed every frame.

Example of Antenna Unit Array and Connection of Gate Bus Line and Source Bus Line In the scanning antenna according to the embodiments of the disclosure, the antenna units are arranged concentrically, for example.

For example, in a case where the antenna units are arranged in m concentric circles, one gate bus line is provided for each circle, for example, such that a total of m gate bus lines is provided. For example, assuming that the outer diameter of the transmission and/or reception region R1 is 800 mm, m is 200, for example. Assuming that the innermost gate bus line is the first one, n (30, for example) antenna units are connected to the first gate bus line and nx (620, for example) antenna units are connected to the mth gate bus line.

In such an arrangement, the number of antenna units connected to each gate bus line is different. In addition, although m antenna units are connected to, among the nx number of source bus lines connected to the nx number of antenna units that constitute the outermost circle, the n number of source bus lines connected to the antenna units that constitute the innermost circle as well, the number of antenna units connected to other source bus lines is less than m.

In this way, the arrangement of antenna units in the scanning antenna is different from the arrangement of pixels (dots) in the LCD panel, and the number of connected antenna units differs depending on the gate bus line and/or source bus line. Accordingly, in a case where the capacitances (liquid crystal capacitances+auxiliary capacitances) of all the antenna units are set to be the same, depending on the gate bus line and/or the source bus line, the electrical loads of the antenna units connected thereto differ. In such a case, there is a problem where variations occur in the writing of the voltage to the antenna unit.

Accordingly, to prevent this, the capacitance value of the auxiliary capacitance is preferably adjusted, or the number of antenna units connected to the gate bus line and/or the source bus line is preferably adjusted, for example, to make the electrical loads of the antenna units connected to the gate bus lines and the source bus lines substantially the same.

Fourth Embodiment

Below, the scanning antenna of a fourth embodiment will be described.

In the TFT substrate used in the scanning antenna of the present embodiment, the patch electrode is formed from the same conductive film as the source electrode.

Figures 21A, 21B, 21C:
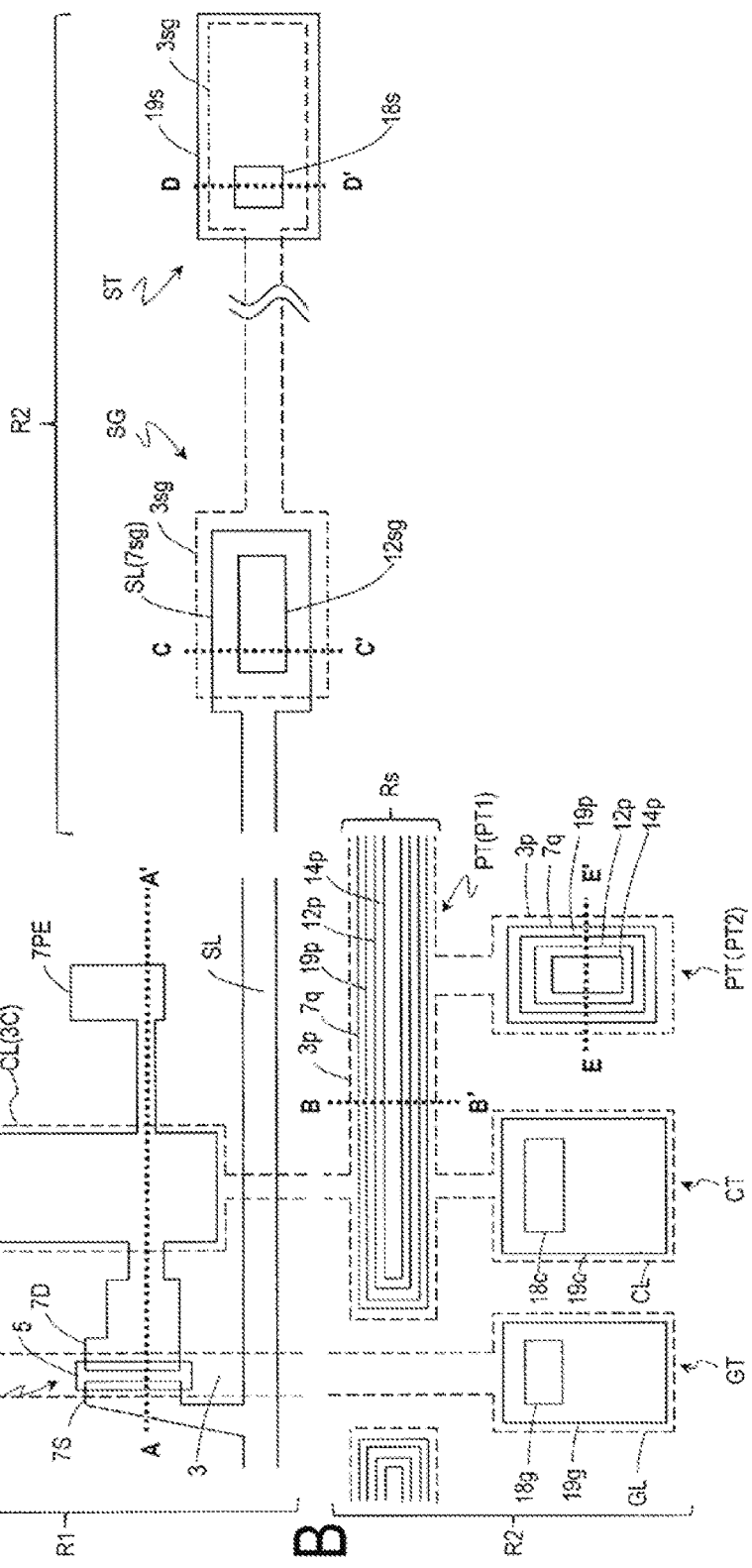
FIG. 21A to FIG. 21C are each a schematic plan view illustrating a TFT substrate 105 of a fourth embodiment.

FIGS. 21A to 21C are each a schematic plan view illustrating a TFT substrate 105 of the present embodiment.

The TFT substrate 105 includes the transmission and/or reception region R1 in which the plurality of antenna unit regions U are arranged, and the non-transmission and/or reception region R2 provided with a terminal section and the like. In the non-transmission and/or reception region R2 (R2a, R2b), a seal region Rs is disposed surrounding the transmission and/or reception region R1. The seal region Rs is positioned between a terminal section region where the terminal section is disposed and the transmission and/or reception region R1.

FIG. 21A illustrates the antenna unit region U of the transmission and/or reception region R1, FIG. 21B illustrates the transfer terminal section PT, the gate terminal section GT, and a CS terminal section CT provided to the non-transmission and/or reception region R2, and FIG. 21C illustrates a source-gate connection section SG and the source terminal section ST provided to the non-transmission and/or reception region R2. The transfer terminal section (also called the transfer section) PT includes a first transfer terminal section PT1 positioned in the seal region Rs, and a second transfer terminal section PT2 provided outward of the seal region Rs. In this example, the first transfer terminal section PT1 extends along the seal region Rs, encompassing the transmission and/or reception region R1.

In general, the gate terminal section GT and the source terminal section ST are provided to each of the gate bus lines and source bus lines, respectively. While FIGS. 21A to 21C illustrate the CS terminal section CT and the second transfer terminal section PT2 aligned with the gate terminal section GT, the number and arrangement of the CS terminal sections CT and the second transfer terminal sections PT2 are each set independently of the gate terminal section GT. Normally, the number of the CS terminal sections CT and the second transfer terminal sections PT2 is less than the number of the gate terminal sections GS, and is suitably set taking into consideration the uniformity of the voltage of the slot electrode and the CS electrode. Further, the second transfer terminal section PT2 may be omitted when the first transfer terminal section PT1 is formed.

FIGS. 22A to 22E are each a schematic cross-sectional view of the TFT substrate 105. FIG. 22A illustrates a cross section of the antenna unit region U along the line A-A' in FIG. 21A, FIG. 22B illustrates a cross section of the transfer terminal section PT along the line B-B' in FIG. 21B, FIG. 22C illustrates a cross section of the source-gate connection section SG along the line C-C' in FIG. 21C, FIG. 22D illustrates a cross section of the source terminal section ST along the line D-D' in FIG. 21C, and FIG. 22E illustrates a cross section of the transfer terminal section PT along the line E-E' in FIG. 21B.

Antenna Unit Region U

As illustrated in FIGS. 21A and 22A, the antenna unit regions U of the TFT substrate 105 each include the gate bus line GL and the source bus line SL formed on the dielectric substrate 1, the TFT 10, the first insulating layer 11 covering the TFT 10, and a patch electrode 7PE.

The TFT 10 includes the gate electrode 3, the island-shaped semiconductor layer 5, the contact layers 6S and 6D, the gate insulating layer 4 disposed between the gate electrode 3 and the semiconductor layer 5, the source electrode 7S, and the drain electrode 7D. The configuration of the TFT 10 is the same as the configuration described above with reference to FIGS. 3A, 3B, and the like. The source electrode 7S of each of the TFTs 10 is connected to the source bus line SL, and the gate electrode 3 is connected to the gate bus line GL.

The patch electrode 7PE is formed from the same conductive film as the source electrode 7S and the drain electrode 7D.

In the TFT substrate 105, because the patch electrode 7PE is formed from the same conductive film as the source electrode 7S and the drain electrode 7D, it is possible to reduce the number of manufacturing steps (the number of photomasks, for example). For example, in the manufacturing process of the TFT substrate 101 in the first embodiment described with reference to FIGS. 3A to 5, seven photomasks are used (excluding the formation of the alignment mark 21). In contrast, the TFT substrate 105 in the present embodiment can be manufactured using six photomasks. The detailed manufacturing process thereof will be described later.

In the present embodiment, the conductive film that includes the source electrode, the drain electrode, and the patch electrode is also called a source conductive film. Further, the layer formed using the source conductive film including the source electrode, the drain electrode, and the patch electrode is also called a source metal layer. In the present embodiment, the source metal layer preferably satisfies the preferred conditions of a metal film that forms a patch electrode already described. For example, the source metal layer of the present embodiment is preferably from 0.3 to 1 µm, inclusive. As described above, while dependent on the TFT configuration as well, a source metal layer having a thickness exceeding 1 µm, for example, may not achieve the desired patterning accuracy. For example, a problem may arise in which the gap (corresponding to the channel length of the TFT) between the source electrode and the drain electrode cannot be controlled at high accuracy. Thus, the thickness of the source metal layer is preferably 1 µm or less.

The source electrode 7S, the drain electrode 7D, and the patch electrode 7PE may be formed by only a low resistance metal layer (a Cu layer, an Al layer, an Ag layer, an Au layer, or a layered structure including any of these, for example), or may include a layered structure including a low resistance metal layer. The layered structure including a low resistance metal layer includes a layer containing a metal having a high melting point above and/or below that of the low resistance metal layer. Note that a "layer containing a metal having a high melting point" refers to a layer formed by titanium (Ti), tungsten (W), molybdenum (Mo), tantalum (Ta), niobium (Nb), an alloy containing these, a nitride of these, or a solid solution of the metals or alloys and the nitride, for example. The low resistance metal layer included in the source electrode 7S, the drain electrode 7D, and the patch electrode 7PE may have a thickness from 0.3 to 0.9 µm, inclusive, for example. When the source electrode 7S, the drain electrode 7D, and the patch electrode 7PE include an Al layer, the Al layer preferably has a thickness from 0.3 to 0.9 µm, inclusive. When the source electrode 7S, the drain electrode 7D, and the patch electrode 7PE include a Cu layer, the Cu layer preferably has a thickness from 0.3 to 0.8 µm, inclusive.

The TFT substrate 105 may further include a CS bus line (an auxiliary capacity line) CL. In this example, the CS bus line CL may be formed using the same conductive film as the gate bus line GL. The CS bus line CL extends substantially in parallel with the gate bus line GL. A part of the CS bus line CL faces a part of a section extending from the drain electrode 7D via the gate insulating layer 4, forming an auxiliary capacity. In this specification, the section of the CS bus line CL serving as a lower electrode of the auxiliary capacity is called the lower capacitance electrode 3C, and the section serving as the upper electrode of the auxiliary capacity of the section of the drain electrode 7D is called the upper capacitance electrode 7C. A width of the lower capacitance electrode 3C may be greater than a width of the CS bus line CL other than the lower capacitance electrode 3C. A width of the upper capacitance electrode 7C may be greater than a width of the section other than the upper capacitance electrode 7C of the section extending from the drain electrode 7D. In this example, the patch electrode 7PE extends from the upper capacitance electrode 7C. Note that the arrangement relationship between the auxiliary capacitance and the patch electrode 7PE is not limited to the illustrated example.

Transfer Terminal Section PT

The first transfer terminal section PT1, as illustrated in FIGS. 21B and 22B, includes a gate connection section 3p supported by the dielectric substrate 1, the gate insulating layer 4 extending over the gate connection section 3p, a source connection section 7q formed on the gate insulating layer 4, the first insulating layer 11 formed on the source connection section 7q, and the transfer upper connection section 19p formed on the first insulating layer 11.

The gate connection section 3p is formed using the same conductive film as the gate bus line GL, and is electrically separated from the gate bus line GL. The gate connection section 3p is connected to the CS bus line CL (integrally formed with the CS bus line). The gate insulating layer 4 includes an opening 12p exposing a part of the gate connection section 3p.

The source connection section 7q is formed using the same conductive film as the source bus line SL, and is electrically separated from the source bus line SL. The source connection section 7q is formed on the gate insulating layer 4 and inside the opening 12p, and is in contact with the gate connection section 3p inside the opening 12p. The first insulating layer 11 includes an opening 14p extending over the source connection section 7q and exposing a part of the source connection section 7q. The transfer upper connection section 19p is formed on the first insulating layer 11 and inside the opening 14p, and is in contact with the source connection section 7q inside the opening 14p. The transfer upper connection section 19p is, for example, connected with a transfer connection section on the slot substrate side by a sealing material containing conductive particles, for example (refer to FIG. 7).

In this example, the gate connection section 3p is disposed between two of the gate bus lines GL adjacent to each other. The two gate connection sections 3p disposed sandwiching the gate bus line GL may be electrically connected via a conductive connection section (not illustrated). The conductive connection section may be formed from the same conductive film as the source bus line, for example.

Note that while here the gate connection section 3p is connected to the transfer upper connection section 19p by one set of the openings 12p and 14p, a plurality of the openings 12p and/or 14p may be provided for one gate connection section 3p.

The gate connection section 3p, when viewed from the normal direction of the dielectric substrate 1, extends outwardly (opposite to the transmission and/or reception region R1) and constitutes the second transfer terminal section PT2.

The second transfer terminal section PT2 is provided on an outer side of the seal region Rs (on the side opposite the transmission and/or reception region R1). The second transfer terminal section PT2, as illustrated in FIG. 22E, has the same cross-sectional structure as the first transfer terminal section PT1 illustrated in FIG. 22B.

In the second transfer upper connection section PT2 as well, the transfer upper connection section 19p may be connected with a transfer connection section on the slot substrate side by a sealing material containing conductive particles, for example.

Source-Gate Connection Section SG

As illustrated in FIGS. 21C and 22C, the source-gate connection section SG electrically connects the source bus line SL and a gate connection wiring line 3sg.

Specifically, the source-gate connection section SG includes the gate connection wiring line 3sg, the gate insulating layer 4 extending over the gate connection wiring line 3sg, and the source bus line SL formed on the gate insulating layer 4.

The gate connection wiring line 3sg is formed using the same conductive film as the gate bus line GL, and is electrically separated from the gate bus line GL. When viewed from the normal direction of the dielectric substrate 1, at least a part of the gate connection wiring line 3sg is disposed so as to not overlap the source bus line SL.

In this specification, the section of the source bus lines SL positioned at the source-gate connection section SG is also called the "source connection section 7sg". A width of the source connection section 7sg may be greater than the width of the source bus line SL.

The gate insulating layer 4 includes an opening 12sg that reaches the gate connection wiring line 3sg.

The source connection section 7sg is disposed on the gate insulating layer 4 and inside the opening 12sg, and is in contact with the gate connection wiring line 3sg inside the opening 12sg. The source-gate connection section SG may further include the first insulating layer 11 covering the source connection section 7sg.

Source Terminal Section ST, Gate Terminal Section GT, and CS Terminal Section CT The source terminal section ST, as illustrated in FIGS. 21C and 22D, includes the gate connection wiring line 3sg extending from the source-gate connection section SG, the gate insulating layer 4 and the first insulating layer 11 covering the gate connection wiring line 3sg, and the source terminal upper connection section 19s. The gate insulating layer 4 and the first insulating layer 11 include the opening 18s at or higher than the gate connection wiring line 3sg. The source terminal upper connection section 19s is disposed on the first insulating layer 11 and inside the opening 18s, and is in contact with the gate connection wiring line 3sg inside the opening 18s.

The gate terminal section GT and the CS terminal section CT, as illustrated in FIG. 21B, may have the same configuration as the source terminal section ST.

In this example, the gate terminal section GT includes the gate bus line GL, the gate insulating layer 4 and the first insulating layer 11 formed on the gate bus line GL, and the gate terminal upper connection section 19g formed on the first insulating layer 11. The gate insulating layer 4 and the first insulating layer 11 include the opening 18g that reaches the gate bus line GL. The gate terminal upper connection section 19g is disposed on the first insulating layer 11 and inside the opening 18g, and is in contact with the gate bus line GL inside the opening 18g.

The CS terminal section CT includes the CS bus line CL, the gate insulating layer 4 and the first insulating layer 11 formed on the CS bus line CL, and a CS terminal upper connection section 19c formed on the first insulating layer 11. The gate insulating layer 4 and the first insulating layer 11 include an opening 18c that reaches the CS bus line CL. The CS terminal upper connection section 19c is disposed on the first insulating layer 11 and inside the opening 18c, and is in contact with the CS bus line CL inside the opening 18c.

Manufacturing Method of TFT Substrate 105

As described above, in the present embodiment, the TFT substrate 105 includes the gate metal layer, the gate insulating layer 4, the source metal layer, the first insulating layer 11, and the transparent conductive layer on the dielectric substrate 1, in this order. The gate metal layer includes the gate bus line GL, the gate electrode 3 of the TFT 10, the gate connection wiring line 3sg, the gate connection section 3p, and the CS bus line CL. The source metal layer includes the source bus line SL, the source electrode 7S and the drain electrode 7D of the TFT 10, the patch electrode 7PE, and the upper capacitance electrode 7C. The transparent conductive layer includes the upper connection sections 19s, 19g, 19c, 19p of each terminal section.

FIGS. 23AA to 23BK are each a process cross-sectional view illustrating an example of the manufacturing method of the TFT substrate 105. These diagrams illustrate cross sections respectively corresponding to FIGS. 22A to 22E. Descriptions of the material, thickness, formation method, and the like of each layer are suitably omitted when the method is the same as that described above with reference to FIG. 5.

First, as illustrated in FIG. 23AA, a gate conductive film 3' is formed on the dielectric substrate 1 by a sputtering method or the like. Here, as the gate conductive film 3', a layered film (MoN/Al) is formed by layering an Al film (having a thickness of 150 am, for example) and an MoN film (having a thickness of 100 nm, for example), in this order.

Next, as illustrated in FIG. 23AB, the gate metal layer including the gate electrode 3, the gate bus line GL, the lower capacitance electrode 3C, the CS bus line CL, the gate connection section 3P, and the gate connection wiring line 3sg is obtained by patterning the gate conductive film 3'. Here, the patterning of the gate conductive film 3' is performed by wet etching.

Subsequently, as illustrated in FIG. 23AC, the gate insulating layer 4, an intrinsic amorphous silicon film 5', and an n+ type amorphous silicon film 6' are formed, in this order, so as to cover the gate metal layer. Here, as the gate insulating layer 4, for example, a silicon nitride (SixNy) film having a thickness of 350 nm is formed. Further, the intrinsic amorphous silicon film 5' having a thickness of 120 nm, for example, and an n+type amorphous silicon film 6' having a thickness of 30 nm, for example, are formed.

Then, the island-shaped semiconductor layer 5 and the contact layer 6 are obtained as illustrated in FIG. 24AD by patterning the intrinsic amorphous silicon film 5' and the n+ type amorphous silicon film 6'. The semiconductor film used for the semiconductor layer 5 is not limited to an amorphous silicon film. For example, an oxide semiconductor layer may be formed as the semiconductor layer 5. In this case, it is not necessary to provide a contact layer between the semiconductor layer 5 and the source/drain electrodes.

Then, as illustrated in FIG. 23AE, the opening 12p that reaches the gate connection section 3p in the transfer terminal section formation region, and the opening 12sg exposing a part of the gate connection wiring line 3sg in the source-gate connection section formation region are formed in the gate insulating layer 4 by a known photolithography process. Here, the opening 12sg is formed so as to expose only a part of the gate connection wiring line 3sg, and the opening 12p is formed so as to expose a part of the gate connection section 3p.

Next, as illustrated in FIG. 23AF, a source conductive film 7' is formed on the gate insulating layer 4, on the contact layer 6, inside the opening 12p, and inside the opening 12sg. Here, as the source conductive film 7', a layered film (MoN/Al/Ti) is formed by layering Ti (having a thickness of 20 nm, for example), Al (having a thickness of 380 nm, for example), and MoN (having a thickness of 100 nm, for example), in this order.

Figure 23B:
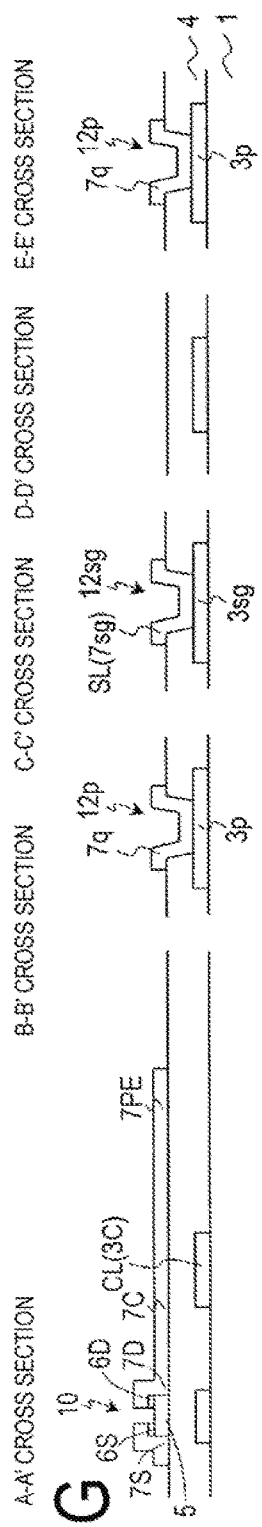
FIG. 23BG to FIG. 23BK are each a process cross-sectional view illustrating an example of a manufacturing method of the TFT substrate 105.
Figure 23B:
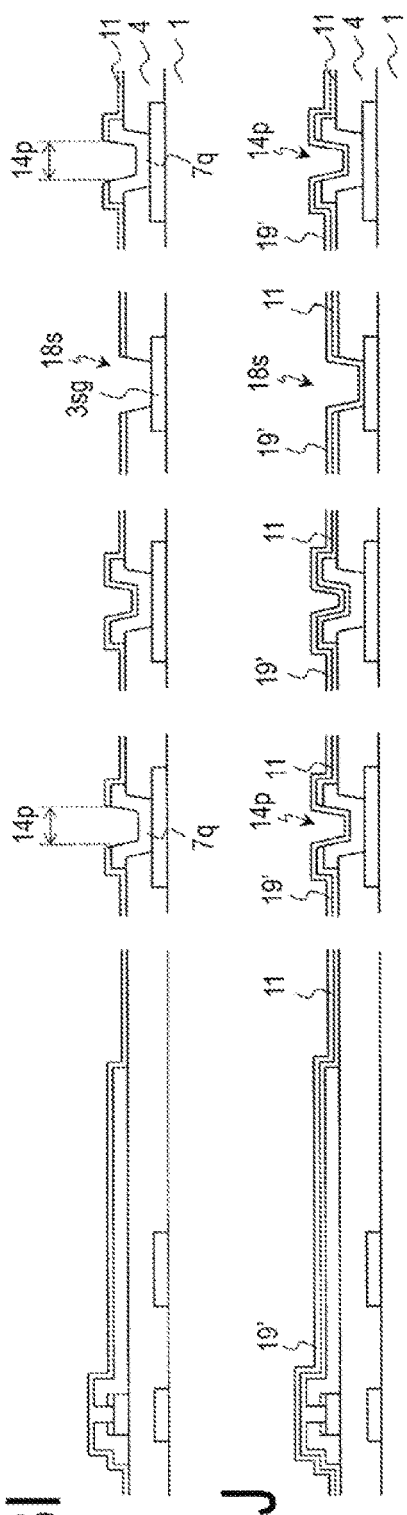

Then, as illustrated in FIG. 23BG, the source metal layer including the source bus line SL (including the source connection section 7sg), the source electrode 7S, the drain electrode 7D, the upper capacitance electrode 7C, the source connection section 7q, and the patch electrode 7PE is formed by patterning the source conductive film 7'. At this time, the contact layer 6 is also etched, and the source contact layer 6S and the drain contact layer 6D separated from each other are formed. Thus, the TFT 10 and the source-gate connection section SG are obtained.

In the patterning of the source conductive film 7', after patterning the MoN film and the Al film by wet etching using, for example, an aqueous solution of phosphoric acid, nitric acid, and acetic acid, the Ti film and the n+ type amorphous silicon film 6' may be simultaneously patterned by dry etching using fluorine gas, for example. Alternatively, it is also possible to collectively etch the source conductive film 7' and the n+ type amorphous silicon film 6'. In the present embodiment, the patterning of the source conductive film 7' is performed using the same mask and thus, when the source conductive film 7' has a layered structure, the side surfaces of each of the layers included in the layered structure are aligned at the side surfaces of the electrodes (including the source electrode 7S, the drain electrode 7D, and the patch electrode 7P, for example) included in the source metal layer. Similarly, the source conductive film 7' and the n+type amorphous silicon film 6' are etched using the same mask, and thus the side surface of the contact layer 6 and the side surfaces of the source electrode 7S and the drain electrode 7D are aligned.

Next, the first insulating layer 11 is formed so as to cover the TFT 10 and the source metal layer, as illustrated in FIG. 23BH. In this example, the first insulating layer 11 is disposed so as to be in contact with a channel region of the semiconductor layer 5 (the region inside the semiconductor layer 5 where the source electrode 7S and the drain electrode 7D do not overlap when viewed from the normal direction of the dielectric substrate 1). Here, as the first insulating layer 11, for example, a silicon nitride (SixNy) film having a thickness of 100 nm is formed.

Then, the first insulating layer 11 and the gate insulating layer 4 are etched by a known photolithography process. Thus, as illustrated in FIG. 23BI, the opening 18s exposing a part of the gate connection wiring line 3sg in the source terminal section formation region is formed in the first insulating layer 11 and the gate insulating layer 4. In this etching process, in the source terminal section formation region, the first insulating layer 11 and the gate insulating layer 4 are collectively etched. Thus, at a side wall of the obtained opening 18s, side walls of the first insulating layer 11 and the gate insulating layer 4 are aligned. At the same time, the opening 14p exposing a part of the source connection section 7q in the transfer terminal section formation region is formed in the first insulating layer 11. A side wall of the obtained opening 14p is not necessarily integrated with the source connection section 7q formed on the side surface of the opening 12p.

Then, as illustrated in FIG. 23BJ, a transparent conductive film 19' is formed on the first insulating layer 11, inside the opening 14p, and inside the opening 18s by a sputtering method, for example. Here, an ITO film having a thickness of, for example, 70 nm is used as the transparent conductive film 19'. As the transparent conductive film 19', a layered film that includes a transparent conductive film and a film containing a metal having a high melting point, and is configured with the transparent conductive film as the uppermost layer, may be used. For example, a layered film (ITO/TI) formed by layering Ti (having a thickness of 100 nm, for example) and ITO (having a thickness of 70 nm, for example), in this order, may be used.

Then, the transparent conductive film 19' is patterned. Thus, as illustrated in FIG. 23BK, the transfer upper connection section 19p in contact with the source connection section 7q inside the opening 14p, and the source terminal upper connection section 19s in contact with the gate connection wiring line 3sg inside the opening 18s are formed. Thus, the antenna unit region U, the transfer terminal section PT, and the source terminal section ST are obtained. Note that, although not illustrated, the gate terminal section GT and the CS terminal section CT may be formed using the same method as that for the source terminal section ST.

In this manner, the TFT substrate 105 is manufactured.

Modification 1

Below is described the TFT substrate of modification 1 of the present embodiment with reference to FIGS. 24A to 25E.

FIGS. 24A to 24C are each a schematic plan view illustrating a TFT substrate 105a of modification 1 of the present embodiment. FIG. 24A illustrates the antenna unit region U of the transmission and/or reception region R1, FIG. 24B illustrates the transfer terminal section PT, the gate terminal section GT, and the CS terminal section CT provided to the non-transmission and/or reception region R2, and FIG. 24C illustrates the source-gate connection section SG and the source terminal section ST provided to the non-transmission and/or reception region R2. FIGS. 25A to 25E are each a schematic cross-sectional view of the TFT substrate 105a. FIG. 25A illustrates a cross section of the antenna unit region U along the line A-A' in FIG. 24A, FIG. 25B illustrates a cross section of the transfer terminal section PT along the line B-B' in FIG. 24B, FIG. 25C illustrates a cross section of the source-gate connection section SG along the line C-C' in FIG. 24C, FIG. 25D illustrates a cross section of the source terminal section ST along the line D-D' in FIG. 24C, and FIG. 25E illustrates a cross section of the transfer terminal section PT along the line E-E' in FIG. 24B.

The TFT substrate 105a differs from the TFT substrate 105 in the thickness of the first insulating layer 11. As illustrated in FIGS. 25A to 25E, the thickness of the first insulating layer 11 of the TFT substrate 105a is greater than the thickness of the first insulating layer 11 of the TFT substrate 105. However, in the present specification, the thickness, size, shape, and the like of each layer are not limited to the modes illustrated in the drawings.

In the TFT substrate 105a having such a configuration as well, it is possible to achieve the same effect as that of the TFT substrate 105.

A method for manufacturing the TFT substrate 105a will now be described with reference to FIGS. 26AA to 26BK. FIGS. 26AA to 26BK are each a process cross-sectional view illustrating an example of the manufacturing method of the TFT substrate 105a. These diagrams illustrate cross sections respectively corresponding to FIGS. 25A to 25E. Hereinafter, the differences from the manufacturing method of the TFT substrate 105 are mainly described.

The manufacturing method of the TFT substrate 105a is the same as the manufacturing method of the TFT substrate 105 described with reference to FIGS. 24AA to 24BK, excluding the thickness of the first insulating layer 11.

As illustrated in FIGS. 26AA to 26AD, the gate metal layer, the gate insulating layer 4, and the island-shaped semiconductor layer 5 are formed. Here, as the gate conductive film 3', a layered film (Cu/Ti) is formed by layering a Ti film (having a thickness of 20 nm, for example) and a CU film (having a thickness of 200 nm, for example), in this order. Further, here, as the gate insulating layer 4, a layered film (SiOx/SiNy) is formed by layering a silicon nitride (SiNy) film (having a thickness of 300 nm, for example) and a silicon oxide (SiOx) film (having a thickness of 50 nm, for example), in this order. Further, here, the oxide semiconductor layer 5 may be formed as the semiconductor layer 5. As the oxide semiconductor film 5', an In—Ga—Zn—O based semiconductor film having a thickness of 70 nm, for example, is formed, and this is then patterned to obtain the island-shaped oxide semiconductor layer 5. Thus, when the oxide semiconductor layer 5 is formed as the semiconductor layer 5, the contact layer between the semiconductor layer 5 and the source/drain electrodes may be omitted.

Then, as illustrated in FIGS. 26AE to 26BG, the openings 12p and 12sg are formed by etching the gate insulating layer 4, and subsequently the source metal layer is formed. Here, as the source conductive film 7', a layered film (Cu/Ti) is formed by layering Ti (having a thickness of 20 nm, for example) and CU (having a thickness of 480 nm, for example), in this order. The source conductive film 7' is patterned by first patterning the Cu film by wet etching using, for example, an acid-based etching solution (an etching solution containing hydrogen peroxide and nitric acid, for example) and then patterning the Ti film by dry etching using fluorine gas, for example. Alternatively, it is also possible to collectively etch the Cu film and the Ti film using a hydrofluoric acid-based etching solution. The Cu film and the Ti film are patterned using the same mask.

Next, the first insulating layer 11 is formed so as to cover the TFT 10 and the source metal layer, as illustrated in FIG. 26BH. Here, as the first insulating layer 11, a layered film (SixNy/SiOX) is formed by layering a silicon oxide (SiOx) film (having a thickness of 250 nm, for example) and a silicon nitride (SixNy) film (having a thickness of 250 nm, for example), in this order.

Next, as illustrated in FIGS. 26BI to 26BK, the openings 18p and 14p are formed by etching the gate insulating layer 4 and the first insulating layer 11, and subsequently forming the transfer upper connection section 19p and the source terminal upper connection section 19s.

In this manner, the TFT substrate 105a is manufactured.

Note that while the above illustrates a case where the semiconductor layer 5 made from an oxide semiconductor is formed as the semiconductor layer 5 of the TFT substrate 105a, the TFT substrate of modification 1 is not limited thereto. As in the semiconductor layer 5 of the TFT substrate 105, the semiconductor layer 5 may be formed from an intrinsic amorphous silicon film.

Modification 2

Below is described the TFT substrate of modification 2 of the present embodiment with reference to FIGS. 27A to 28E.

FIGS. 27A to 27C are each a schematic plan view illustrating a TFT substrate 105b of modification 2 of the present embodiment. FIG. 27A illustrates the antenna unit region U of the transmission and/or reception region R1, FIG. 27B illustrates the transfer terminal section PT, the gate terminal section GT, and the CS terminal section CT provided to the non-transmission and/or reception region R2, and FIG. 27C illustrates the source-gate connection section SG and the source terminal section ST provided to the non-transmission and/or reception region R2. FIGS. 28A to 28E are each a schematic cross-sectional view of the TFT substrate 105b. FIG. 28A illustrates a cross section of the antenna unit region U along the line A-A' in FIG. 27A, FIG. 28B illustrates a cross section of the transfer terminal section PT along the line B-B' in FIG. 27B, FIG. 28C illustrates a cross section of the source-gate connection section SG along the line C-C' in FIG. 27C, FIG. 28D illustrates a cross section of the source terminal section ST along the line D-D' in FIG. 27C, and FIG. 28E illustrates a cross section of the transfer terminal section PT along the line E-E' in FIG. 27B.

The TFT substrate 105b differs from the TFT substrate 105 in that the TFT substrate includes an etch stop (channel protective layer) 8 on the semiconductor layer (oxide semiconductor layer, for example) 5.

Antenna Unit Region U

As illustrated in FIGS. 27A and 28A, the TFT substrate 105b includes the etch stop 8 formed so as to be in contact with the channel region of the semiconductor layer 5. The etch stop 8 includes a first opening 8as that reaches a source region of the semiconductor layer 5, and a second opening 8ad that reaches a drain region of the semiconductor layer 5. The source electrode 7S is provided on the etch stop 8 and inside the first opening 8as, and is in contact with the source region of the semiconductor layer 5 inside the first opening 8as. The drain electrode 7D is provided on the etch stop 8 and inside the second opening 8ad, and is in contact with the drain region of the semiconductor layer 5 inside the second opening gad.

In the TFT substrate 105b having such a configuration as well, it is possible to achieve the same effect as that of the TFT substrate 105. The TFT substrate 105b, as described with reference to FIGS. 29AA to 29BL, can be manufactured using six photomasks.

Furthermore, the TFT substrate 105b protects at least the channel region of the semiconductor layer 5 using the etch stop 8, making it possible to suppress process damage to the semiconductor layer 5 in the etching step of the source conductive film 7T, in particular. This makes it possible to effectively suppress deterioration (resistance reduction) of the semiconductor layer 5.

The etch stop 8 may be an insulating film. When the semiconductor layer 5 is formed by an oxide semiconductor, preferably an oxide film, such as a silicon oxide (SiOx) film, for example, is used as the etch stop 8. When an oxide film is used and oxygen deficiency occurs in the oxide semiconductor layer 5, the oxygen deficiency can be recovered by the oxygen contained in the oxide film, making it possible to more effectively reduce oxygen deficiencies in the oxide semiconductor layer 5.

Transfer Terminal Section PT

The first transfer terminal section PT1 and the second transfer terminal section PT2, as illustrated in FIGS. 27B, 28B, and 28E, include the gate connection section 3p supported by the dielectric substrate 1, the gate insulating layer 4 and the etch stop 8 extending over the gate connection section 3p, the source connection section 7q formed on the etch stop 8, the first insulating layer 11 formed on the source connection section 7q, and the transfer upper connection section 19p formed on the first insulating layer 11. The gate insulating layer 4 and the etch stop 8 include the opening (contact hole) 12p that reaches the gate connection section 3p. The source connection section 7q is formed on the etch stop 8 and inside the opening 12p, and is in contact with the gate connection section 3p inside the opening 12p. The first insulating layer 11 includes the opening 14p extending over the source connection section 7q and exposing a part of the source connection section 7q. The transfer upper connection section 19p is formed on the first insulating layer 11 and inside the opening 14p, and is in contact with the source connection section 7q inside the opening 14p.

Source-Gate Connection Section SG

Figures 38A, 38B, 38C:
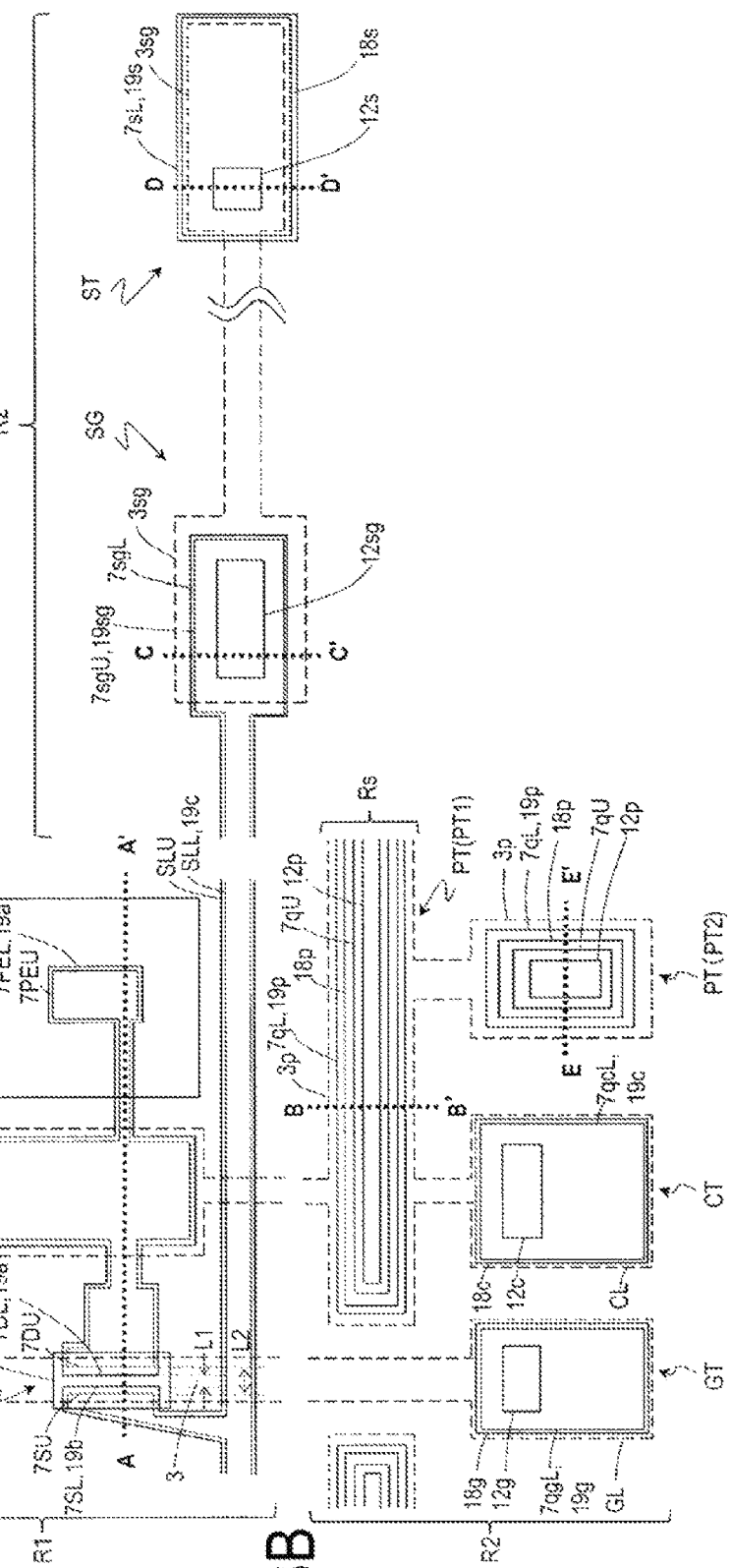
FIG. 38A to FIG. 38C are each a schematic plan view illustrating a TFT substrate 107a of modification 1 of the sixth embodiment.

As illustrated in FIGS. 27C and 38C, the source-gate connection section SG includes the gate connection wiring line 3sg, the gate insulating layer 4 and the etch stop 8 extending over the gate connection wiring line 3sg, and the source bus line SL formed on the etch stop 8.

The gate insulating layer 4 and the etch stop 8 include the opening 12sg that reaches the gate connection wiring line 3sg. The source connection section 7sg is disposed on the etch stop 8 and inside the opening 12sg, and is in contact with the gate connection wiring line 3sg inside the opening 12sg. The source-gate connection section SG may further include the first insulating layer 11 covering the source connection section 7sg.

Source Terminal Section ST, Gate Terminal Section GT, and CS Terminal Section CT The source terminal section ST, as illustrated in FIGS. 27C and 28D, includes the gate connection wiring line 3sg extending from the source-gate connection section SG; the gate insulating layer 4, the etch stop 8, and the first insulating layer 11 covering the gate connection wiring line 3sg; and the source terminal upper connection section 19s. The gate insulating layer 4, the etch stop 8, and the first insulating layer 11 include the opening 18s that reaches the gate connection wiring line 3sg. The source terminal upper connection section 19s is disposed on the first insulating layer 11 and inside the opening 18s, and is in contact with the gate connection wiring line 3sg inside the opening 18s.

The gate terminal section GT and the CS terminal section CT, as illustrated in FIG. 27B, for example, may have the same configuration as the source terminal section ST.

In this example, the gate terminal section GT includes the gate bus line GL; the gate insulating layer 4, the etch stop 8, and the first insulating layer 11 formed on the gate bus line GL; and the gate terminal upper connection section 19g formed on the first insulating layer 11. The gate insulating layer 4, the etch stop 8, and the first insulating layer 11 include the opening 18g exposing a part of the gate bus line GL. The gate terminal upper connection section 19g is disposed on the first insulating layer 11 and inside the opening 18g, and is in contact with the gate bus line GL inside the opening 18g.

The CS terminal section CT includes the CS bus line CL; the gate insulating layer 4, the etch stop 8, and the first insulating layer 11 formed on the CS bus line CL; and the CS terminal upper connection section 19c formed on the first insulating layer 11. The gate insulating layer 4, the etch stop 8, and the first insulating layer 11 include the opening 18c that reaches the CS bus line CL. The CS terminal upper connection section 19c is disposed on the first insulating layer 11 and inside the opening 18c, and is in contact with the CS bus line CL inside the opening 18c.

Manufacturing Method of TFT Substrate 105b

A method for manufacturing the TFT substrate 105b will now be described with reference to FIGS. 29AA to 29BL. FIGS. 29AA to 29BL are each a process cross-sectional view illustrating an example of the manufacturing method of the TFT substrate 105b. These diagrams illustrate cross sections respectively corresponding to FIGS. 28A to 28E. The description below focuses on the differences from the manufacturing method of the TFT substrate 105 described with reference to FIGS. 23AA to 23BK.

As illustrated in FIGS. 29AA to 29AD, the gate metal layer, the gate insulating layer 4, and the island-shaped oxide semiconductor layer 5 are formed. These steps are similar to the steps illustrated in FIGS. 23AA to 23AD. Here, as the gate conductive film 3', a layered film (MoN/Al) is formed by layering an Al film (having a thickness of 150 nm, for example) and an MoN film (having a thickness of 100 nm, for example), in this order. Further, here, as the gate insulating layer 4, a layered film (SiOx/SixNy) is formed by layering a silicon nitride (SixNy) film (having a thickness of 300 nm, for example) and a silicon oxide (SiOx) film (having a thickness of 50 nm, for example), in this order. Further, here, the oxide semiconductor layer 5 may be formed as the semiconductor layer 5. As the oxide semiconductor film 5', an In—Ga—Zn—O based semiconductor film having a thickness of 70 nm, for example, is formed, and this is then patterned to obtain the island-shaped oxide semiconductor layer 5.

Then, as illustrated in FIG. 29AE, an etch stop insulating film 8' is formed on the gate insulating layer 4 and on the oxide semiconductor layer 5. Here, a silicon oxide layer (SiOx) film (having a thickness of 300 nm, for example) is formed as the etch stop insulating film 8'.

Then, the gate insulating layer 4 and the etch stop insulating film 8' are etched. As illustrated in FIG. 29AF, in the TFT formation region, the etch stop 8 is obtained by forming the first opening 8as and the second opening 8ad that reach the semiconductor layer 5 in the etch stop insulating film 8'. In this example, the first opening 8as and the second opening 8ad are formed in sections of the etch stop insulating film 8' that are positioned on both sides of the section that is to become the channel of the semiconductor layer 5. At the same time, the opening 12p exposing the gate connection section 3p in the transfer terminal section formation region, and the opening 12sg exposing the gate connection wiring line 3sg in the source-gate connection section formation region are formed in the gate insulating layer 4 and the etch stop 8. At side walls of the obtained openings 12p, 12sg, side walls of the etch stop 8 and the gate insulating layer 4 are aligned.

Then, as illustrated in FIG. 29AG, the source conductive film 7' is formed on the etch stop 8, inside the first opening 8as, inside the second opening 8ad, inside the opening 12p, and inside the opening 12sg. Here, as the source conductive film 7', a layered film (Cu/Ti) is formed by layering Ti (having a thickness of 20 nm, for example) and CU (having a thickness of 480 nm, for example), in this order.

Then, as illustrated in FIG. 298H, the source metal layer including the source bus line SL (including the source connection section 7sg), the source electrode 7S, the drain electrode 7D, the upper capacitance electrode 7C, the source connection section 7q, and the patch electrode 7PE is formed by patterning the source conductive film 7'. According to this step, the source electrode 7S is provided on the etch stop 8 and inside the first opening 8as, and is in contact with the section that is to become the source region of the semiconductor layer 5 inside the first opening 8as. The drain electrode 7D is formed on the etch stop 8 and inside the second opening 8ad, and is in contact with the section that is to become the drain region of the semiconductor layer 5 inside the second opening 8ad.

Next, the first insulating layer 11 is formed so as to cover the TFT 10 and the source metal layer, as illustrated in FIG. 29BI. In this example, the first insulating layer 11 is disposed so as to be in contact with the etch stop 8 covering the channel region of the semiconductor layer 5. Further, here, as the first insulating layer 11, a layered film (SixNy/SiOX) is formed by layering a silicon oxide (SiOx) film (having a thickness of 50 nm, for example) and a silicon nitride (SixNy) film (having a thickness of 50 nm, for example), in this order.

Then, as illustrated in FIG. 2913J, the first insulating layer 11, the etch stop 8, and the gate insulating layer 4 are etched by a known photolithography process. Thus, as illustrated in FIG. 29BJ, the opening 18s exposing a part of the gate connection wiring line 3sg in the source terminal section formation region is formed in the first insulating layer 11, the etch stop 8, and the gate insulating layer 4. In this etching process, in the source terminal section formation region, the first insulating layer 11, the etch stop 8, and the gate insulating layer 4 are collectively etched. Thus, at a side wall of the obtained opening 18s, side walls of the first insulating layer 11, the etch stop 8, and the gate insulating layer 4 are aligned. At the same time, the opening 14p exposing a part of the source connection section 7q in the transfer terminal section formation region is formed in the first insulating layer 11.

Then, as illustrated in FIG. 29BK, a transparent conductive film 19' is formed on the first insulating layer 11, inside the opening 14p, and inside the opening 18s by a sputtering method, for example.

Then, the transparent conductive film 19' is patterned. Thus, as illustrated in FIG. 29BL, the transfer upper connection section 19p in contact with the source connection section 7q inside the opening 14p, and the source terminal upper connection section 19s in contact with the gate connection wiring line 3sg inside the opening 18s are formed.

In this manner, the TFT substrate 105b is manufactured.

Note that while the above illustrates a case where the semiconductor layer 5 made from an oxide semiconductor is formed as the semiconductor layer 5 of the TFT substrate 10b, the present embodiment is not limited thereto, and the semiconductor layer 5 may be formed from an intrinsic amorphous silicon film.

Modification 3

Below is described the TFT substrate of modification 3 of the present embodiment with reference to FIGS. 30A to 30E.

The TFT substrate of modification 3 of the present embodiment differs from the TFT substrate 105b in the thickness of the first insulating layer 11.

The schematic plan views of a TFT substrate 105c of modification 3 of the present embodiment, while omitted, are the same as the schematic plan views of the TFT substrate 105b illustrated in FIGS. 27A to 27C. FIGS. 30A to 30E are each a schematic cross-sectional view of the TFT substrate 105c. FIG. 30A illustrates a cross section of the antenna unit region U along the line A-A' in FIG. 27A, FIG. 30B illustrates a cross section of the transfer terminal section PT along the line B-B' in FIG. 27B, FIG. 30C illustrates a cross section of the source-gate connection section SG along the line C-C' in FIG. 27C, FIG. 30D illustrates a cross section of the source terminal section ST along the line D-D' in FIG. 27C, and FIG. 30E illustrates a cross section of the transfer terminal section PT along the line E-E' in FIG. 27B.

The TFT substrate 105c differs from the TFT substrate 105b in the thickness of the first insulating layer 11. As illustrated in FIGS. 30A to 30E, the thickness of the first insulating layer 11 of the TFT substrate 105c is greater than the thickness of the first insulating layer 11 of the TFT substrate 105b.

In the TFT substrate 105c having such a configuration as well, it is possible to achieve the same effect as that of the TFT substrate 105b.

A method for manufacturing the TFT substrate 105c will now be described with reference to FIGS. 31A to 31D. FIGS. 31A to 31D are each a process cross-sectional view illustrating an example of the manufacturing method of the TFT substrate 105c. These diagrams illustrate cross sections respectively corresponding to FIGS. 30A to 30E. Hereinafter, the differences from the manufacturing method of the TFT substrate 105 are mainly described.

The manufacturing method of the TFT substrate 105c is the same as the manufacturing method of the TFT substrate 105b described with reference to FIGS. 29AA to 29BL, excluding the thickness of the first insulating layer 11.

First, similar to the method described with reference to FIGS. 29AA to 29BH, the gate metal layer, the gate insulating layer 4, the island-shaped semiconductor layer 5, the etch stop 8, and the source metal layer are formed. Here, as the source conductive film 7', a layered film (MoN/Al/MoN/Ti) is formed by layering Ti (having a thickness of 20 nm, for example), MoN (having a thickness of 50 nm, for example), Al (having a thickness of 330 nm, for example), and MoN (having a thickness of 100 nm, for example), in this order. The source conductive film 7' is patterned by first patterning the MoN film and the Al film by wet etching using, for example, an aqueous solution containing phosphoric acid, nitric acid, and acetic acid, and then patterning the Ti film by dry etching.

Figures 31A, 31B, 31C, 31D:
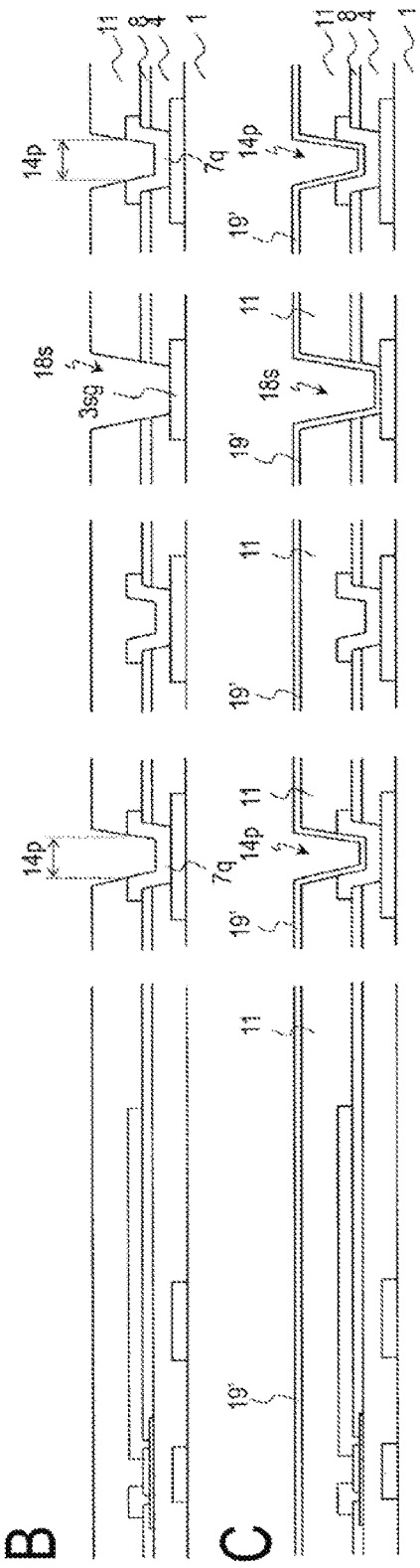
FIG. 31A to FIG. 31D are each a process cross-sectional view illustrating an example of a manufacturing method of the TFT substrate 105c.

Next, the first insulating layer 11 is formed so as to cover the TFT 10 and the source metal layer, as illustrated in FIG. 31A. Here, as the first insulating layer 11, a layered film (SixNy/SiOX) is formed by layering a silicon oxide (SiOx)

film (having a thickness of 250 nm, for example) and a silicon nitride (SixNy) film (having a thickness of 250 nm, for example), in this order.

Next, as illustrated in FIG. 31B, the openings 18s and 14p are formed by etching the gate insulating layer 4, the etch stop 8, and the first insulating layer 11. Subsequently, as illustrated in FIG. 31C, the transparent conductive film 19' is formed on the first insulating layer 11, inside the opening 14p, and inside the opening 18s. Subsequently, as illustrated in FIG. 31D, the transfer upper connection section 19p and the source terminal upper connection section 19s are formed. The steps illustrated in FIGS. 31B to 31D are the same as the steps illustrated with reference to FIGS. 29BJ to 29BL.

In this manner, the TFT substrate 105c is manufactured.

Fifth Embodiment

Below, the scanning antenna of a fifth embodiment will be described.

In the TFT substrate used in the scanning antenna of the present embodiment, the patch electrode is formed from the same conductive film as the source electrode and the drain electrode, similar to the fourth embodiment. The TFT substrate of the present embodiment differs from the TFT substrate in the fourth embodiment in the structure of the source electrode and the drain electrode of the TFT.

Below is described the TFT substrate of the present embodiment with reference to FIGS. 32A to 33E. Hereinafter, the differences from the fourth embodiment are mainly described.

Figures 32A, 32B, 32C:
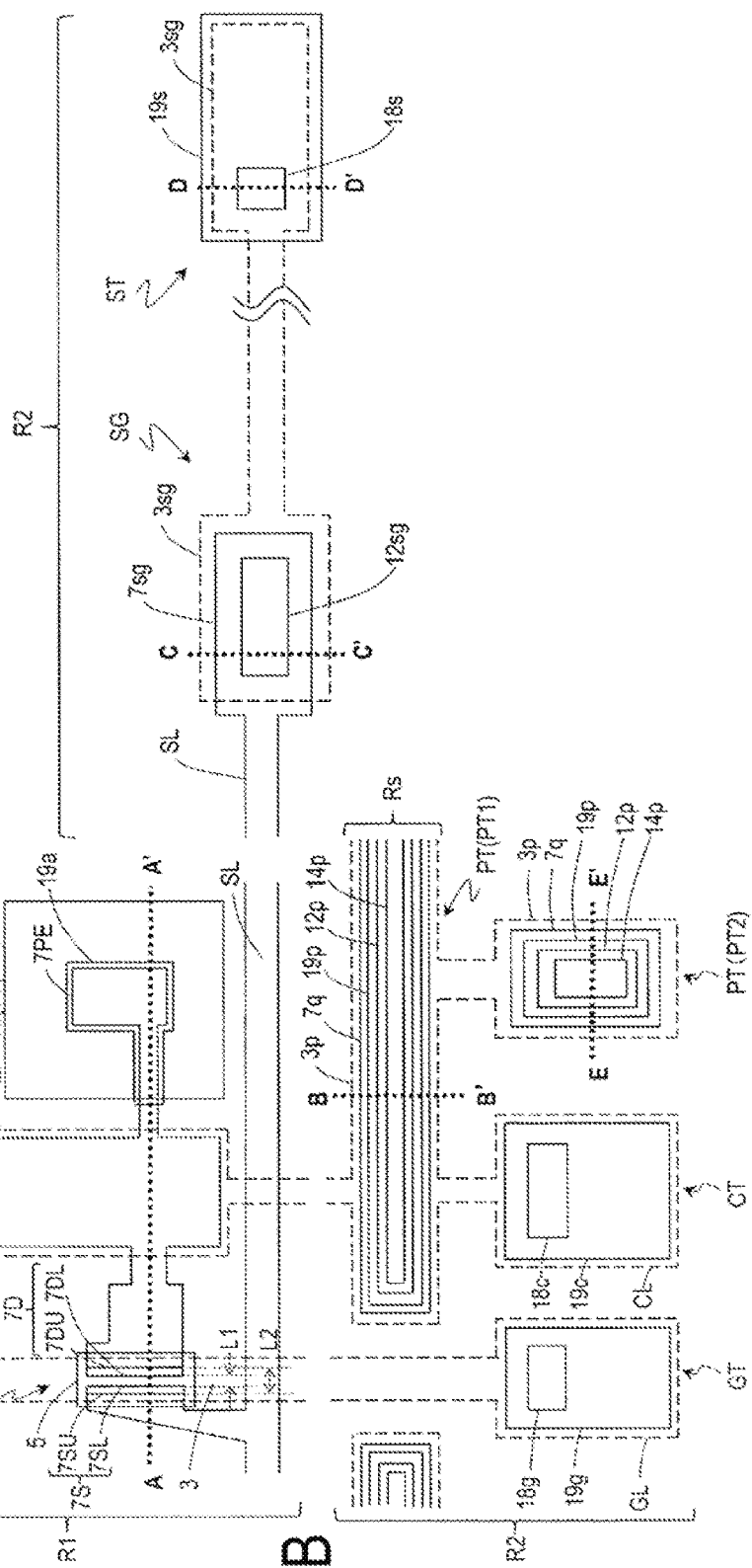
FIG. 32A to FIG. 32C are each a schematic plan view illustrating a TFT substrate 106 of a fifth embodiment.

FIGS. 32A to 32C are each a schematic plan view illustrating a TFT substrate 106 of the present embodiment. FIG. 32A illustrates the antenna unit region U of the transmission and/or reception region R1, FIG. 32B illustrates the transfer terminal section PT, the gate terminal section GT, and a CS terminal section CT provided to the non-transmission and/or reception region R2, and FIG. 32C illustrates the source-gate connection section SG and the source terminal section ST provided to the non-transmission and/or reception region R2. FIGS. 33A to 33E are each a schematic cross-sectional view of the TFT substrate 106. FIG. 33A illustrates a cross section of the antenna unit region U along the line A-A' in FIG. 32A, FIG. 33B illustrates a cross section of the transfer terminal section PT along the line B-B' in FIG. 33B, FIG. 33C illustrates a cross section of the source-gate connection section SG along the line C-C' in FIG. 32C, FIG. 33D illustrates a cross section of the source terminal section ST along the line D-D' in FIG. 32C, and FIG. 33E illustrates a cross section of the transfer terminal section PT along the line E-E' in FIG. 32B.

Antenna Unit Region U

As illustrated in FIGS. 32A and 33A, the source metal layer has a layered structure including a first metal layer and a second metal layer formed on the first metal layer. The first metal layer contains one of Ti, Mo, Ta, W, and Nb, and the second metal layer contains one of Cu, Al, Ag, and Au. The first metal layer may be the "high melting-point metal layer" described above, and the second metal layer may be the "low resistance metal layer" described above. The first metal layer and the second metal layer may each have an independent single layer structure, or may have a layered structure formed by a plurality of layers.

As illustrated in FIGS. 32A and 33A, the drain electrode 7D includes a first metal layer 7DL and a second metal layer 7DU, and the source electrode 7S includes a first metal layer 7SL and a second metal layer 7SU. A distance L1 in the channel direction from the first metal layer 7SL of the source electrode 7S to the first metal layer 7DL of the drain electrode 7D is less than a distance L2 in the channel direction from the second metal layer 7SU of the source electrode 7S to the second metal layer 7DU of the drain electrode 7D.

In the TFT substrate 106, with the source electrode 7S and the drain electrode 7D having such a configuration, it is possible to suppress the occurrence of a problem in which the gap (corresponding to the channel length of the TFT) between the source electrode 7S and the drain electrode 7D cannot be controlled at high accuracy, even when the thickness of the source metal layer is great. In the present embodiment, it is possible to make the source metal layer thick compared to that in the fourth embodiment. The thickness of the source metal layer of the present embodiment is, for example, from 0.3 to 1.5 µm, inclusive.

While the TFT substrate 105 can be manufactured using six photomasks, the manufacturing process of the TFT substrate 106 described above uses seven photomasks as described with reference to FIGS. 34AA to 34BL. Thus, from the viewpoint of reducing the number of photomasks, the TFT substrate 106 is inferior to the TFT substrate 105. Nevertheless, the TFT substrate 106 has the advantage of allowing the source metal layer to have an increased thickness compared to the TFT substrate 105, as described above.

In the TFT 10 included in the TFT substrate 106, the gap (corresponding to the channel length of the TFT) from the source electrode 7S to the drain electrode 7D is the distance L1 in the channel direction from the first metal layer 7SL of the source electrode 7S to the first metal layer 7DL of the drain electrode 7D. The thickness of the first metal layer is, for example, less than the thickness of the second metal layer. Thus, the thickness of the first metal layer is preferably, for example, 0.3 µm or less.

As illustrated in FIGS. 32A and 33A, the patch electrode 7PE includes a first metal layer 7PEL and a second metal layer 7PEU. The TFT substrate 106 can be manufactured by the manufacturing method described with reference to FIGS. 34AA to 34BL, and thus a side surface of the first metal layer 7PEL of the patch electrode 7PE and a side surface of the second metal layer 7PEU of the patch electrode 7PE are not aligned. The first metal layer 7PEL and the second metal layer 7PEU are patterned using different masks. The details thereof will be described later.

As illustrated in FIGS. 32A and 33B, the antenna unit region further includes the first insulating layer 11 formed on the source metal layer, and a transparent conductive section 19a formed on the first insulating layer 11. The first insulating layer 11 includes an opening 18a exposing at least a part of the patch electrode 7PE. The transparent conductive section 19a is formed on the first insulating layer 11 and inside the opening 18a, and covers the at least part of the patch electrode 7PE (that is, covers the section of the patch electrode 7PE that is exposed inside the opening 18a). In the example illustrated in FIG. 32A, the opening 18a is formed so as to expose the patch electrode 7PE in its entirety, and a part of the section extending from the drain electrode 7D. The opening 18a, however, is not limited thereto and may be formed so as to expose only a part of the patch electrode 7PE.

Note that the opening 18a and the transparent conductive section 19a may be omitted.

Manufacturing Method of TFT Substrate 106

A method for manufacturing the TFT substrate 106 will now be described with reference to FIGS. 34AA to 34BL. FIGS. 34AA to 34BL are each a process cross-sectional view illustrating an example of the manufacturing method of the TFT substrate 106. These diagrams illustrate cross sections respectively corresponding to FIGS. 33A to 33E. The description below focuses on the differences from the manufacturing method of the TFT substrate 105 described with reference to FIGS. 23AA to 23BK.

As illustrated in FIGS. 34AA to 34AE, the gate metal layer, the gate insulating layer 4, and the island-shaped oxide semiconductor layer 5 are formed, and subsequently the openings 12p and 12sg by etching the gate insulating layer 4. These steps are performed in the same way as described with reference to FIGS. 23AA to 23AE. Here, as the gate conductive film 3', a layered film (Cu/Ti) is formed by layering a Ti film (having a thickness of 20 nm, for example) and a CU film (having a thickness of 200 nm, for example), in this order. Further, here, as the gate insulating layer 4, a layered film (SiOx/SixNy) is formed by layering a silicon nitride (SixNy) film (having a thickness of 300 nm, for example) and a silicon oxide (SiOx) film (having a thickness of 50 nm, for example), in this order. Further, here, the oxide semiconductor layer 5 may be formed as the semiconductor layer 5. As the oxide semiconductor film 5', an In—Ga—Zn—O based semiconductor film having a thickness of 70 nm, for example, is formed, and this is then patterned to obtain the island-shaped oxide semiconductor layer 5. The contact layer between the semiconductor layer 5 and the source/drain electrodes is omitted.

Then, as illustrated in FIG. 34AF, a first source conductive film M1 and a second source conductive film M2 are formed in this order on the gate insulating layer 4, on the semiconductor layer 5, inside the opening 12p, and inside the opening 12sg. Here, a Ti film (having a thickness of 20 nm, for example) is formed as the first source conductive film M1, and a Cu film (having a thickness of 480 nm, for example) is formed as the second source conductive film M2.

Then, as illustrated in FIG. 34AG, the second metal layer included in the source metal layer is formed by patterning the second source conductive film M2. In this step, the first source conductive film M1 is not patterned.

In the antenna unit formation region, the second metal layer 7SU included in the source electrode 7S, the second metal layer SLU included in the source bus line SL, the second metal layer 7DU included in the drain electrode 7D, the second metal layer 7CU included in the upper capacitance electrode 7C, and the second metal layer 7PEU included in the patch electrode 7PE are formed from the second source conductive film M2.

In the transfer terminal section formation region, a second metal layer 7qU included in the source connection section 7q is formed from the second source conductive film M2. The second metal layer 7qU is formed so as to cover the opening 12p.

In the source-gate connection section formation region, a second metal layer 7sgU included in the source connection section 7sg is formed from the second source conductive film M2. The second metal layer 7sgU is formed so as to cover the opening 12sg.

In the source terminal section formation region, the second source conductive film M2 is removed.

The second source conductive film M2 is patterned under etching conditions that make it possible to increase the etching solution ratio of the second source conductive film M2 (here, a Cu film) and the first source conductive film M1 (here, a Ti film). In this example, the Cu film serving as the second source conductive film M2 is etched using, for example, an acid-based etching solution (an etching solution containing hydrogen peroxide and nitric acid, for example).

Then, as illustrated in FIG. 34BH, the first metal layer included in the source metal layer is formed by patterning the first source conductive film M1. Thus, the TFT 10 and the source-gate connection section SG are obtained. Here, the Ti film serving as the first source conductive film M1 is patterned by dry etching using fluorine gas, for example.

The first source conductive film M1 is patterned using a mask different from that in the patterning of the second source conductive film M2. Thus, it is possible to make the distance L1 in the channel direction from the first metal layer 7SL of the source electrode 7S to the first metal layer 7DL of the drain electrode 7D less than the distance L2 in the channel direction from the second metal layer 7SU of the source electrode 7S to the second metal layer 7DU of the drain electrode 7D. Further, with the first source conductive film M1 being patterned using a mask different from that in the patterning of the second source conductive film M2, the side surface of the first metal layer and the side surface of the second metal layer do not align.

In the antenna unit formation region, the first metal layer 7SL included in the source electrode 7S, a first metal layer SLL included in the source bus line SL, the first metal layer 7DL included in the drain electrode 7D, a first metal layer 7CL included in the upper capacitance electrode 7C, and the first metal layer 7PEL included in the patch electrode are formed from the first source conductive film M1. Here, the distance in the channel direction from the first metal layer 7SL of the source electrode 7S to the first metal layer 7DL of the drain electrode 7D is less than the distance in the channel direction from the second metal layer 7SU of the source electrode 7S to the second metal layer 7DU of the drain electrode 7D. The side surface of the first metal layer 7SL of the source electrode 7S is not aligned with the side surface of the second metal layer 7SU of the source electrode 7S, and the side surface of the first metal layer 7DL of the drain electrode 7D does not align with the second metal layer 7DU of the drain electrode 7D. Furthermore, a side surface of the first metal layer 7PEL of the patch electrode 7PE is not aligned with the side surface of the second metal layer 7PEU of the patch electrode 7PE.

In the transfer terminal section formation region, a first metal layer 7qL included in the source connection section 7q is formed from the first source conductive film M1. The first metal layer 7qL is formed so as to cover the opening 12p. Furthermore, a side surface of the first metal layer 7qL of the source connection section 7q is not aligned with the side surface of the second metal layer 7qU of the source connection section 7q.

In the source-gate connection section formation region, a first metal layer 7sgL included in the source connection section 7sg is formed from the first source conductive film M1. The first metal layer 7sgL is formed so as to cover the opening 12sg. Furthermore, a side surface of the first metal layer 7sgL of the source connection section 7sg is not aligned with the side surface of the second metal layer 7sgU of the source connection section 7sg.

In the source terminal section formation region, the first source conductive film M1 is removed.

Next, the first insulating layer 11 is formed so as to cover the TFT 10 and the source metal layer, as illustrated in FIG. 34BI. Here, as the first insulating layer 11, a layered film (SixNy/SiOX) is formed by layering a silicon oxide (SiOx) film (having a thickness of 250 nm, for example) and a silicon nitride (SixNy) film (having a thickness of 250 nm, for example), in this order.

Then, the first insulating layer 11 and the gate insulating layer 4 are etched by a known photolithography process.

Thus, as illustrated in FIG. 34BJ, the opening 18s exposing a part of the gate connection wiring line 3sg in the source terminal section formation region is formed in the first insulating layer 11 and the gate insulating layer 4, and the opening 14p exposing a part of the source connection section 7q in the transfer terminal section formation region is formed in the first insulating layer 11. In addition to the opening 18s and the opening 14p, the opening 18a exposing at least a part of the patch electrode 7PE in the antenna unit formation region is formed in the first insulating layer 11.

Then, as illustrated in FIG. 34BK, the transparent conductive film 19' is formed on the first insulating layer 11, inside the opening 14p, inside the opening 18s, and inside the openings 18a. Here, an ITO film having a thickness of, for example, 70 nm is used as the transparent conductive film 19'. As the transparent conductive film 19', a layered film that includes a transparent conductive film and a film containing a metal having a high melting point, and is configured with the transparent conductive film as the uppermost layer, may be used. For example, a layered film (ITO/TI) formed by layering Ti (having a thickness of 100 nm, for example) and ITO (having a thickness of 70 nm, for example), in this order, may be used.

Then, the transparent conductive film 19' is patterned. Thus, as illustrated in FIG. 34BL, the transfer upper connection section 19p in contact with the source connection section 7q inside the opening 14p, the source terminal upper connection section 19s in contact with the gate connection wiring line 3sg inside the opening 18s, and the transparent conductive section 19a covering a section of the patch electrode 7PE inside the opening 18a that is exposed inside the opening 18a are formed. Thus, the antenna unit region U, the transfer terminal section PT and the source terminal section ST are obtained.

In this manner, the TFT substrate 106 is manufactured.

In the method described above, an acid-based etching solution (an etching solution containing hydrogen peroxide and nitric acid, for example) is used to pattern the second source conductive film M2, using the Cu film as the main layer of the second source conductive film M2. This makes it possible to pattern the second source conductive film M2 without removing the Ti film serving as the first source conductive film M1. Note that the materials of the first source conductive film M and the second source conductive film M2 as well as the etching solution used to pattern the second source conductive film M2 are not limited to the examples described above. The etching method applied to the patterning of the second source conductive film M2 need only be a method that increases the etching selection ratio of the materials of the first source conductive film M1 and the second source conductive film M2.

An example in which an Al film is used as the main layer of the source conductive film M2 will now be described. In the step illustrated in FIG. 34AF, a layered film (MoN/Al) including a Ti film (having a thickness of 20 nm, for example) as the first source conductive film M1, an Al film (having a thickness of 380 nm, for example) as the second source conductive film M2, and an MoN film (having a thickness of 100 nm, for example), in this order, is formed. Then, in the step illustrated in FIG. 34AG, the second source conductive film M2 is patterned using an aqueous solution including phosphoric acid, nitric acid, and acetic acid. Subsequently, the first source conductive film M1 is etched by dry etching using fluorine gas, for example, as illustrated in FIG. 34BH.

Or, an Ag film may be used as the main layer of the second source conductive film M2. For example, a Ti film (having a thickness of 100 nm, for example) is formed as the first source conductive film M1, and an Ag film (having a thickness of 450 nm, for example) is formed as the second source conductive film M2. In this case, in the step illustrated in FIG. 34AG, the second source conductive film M2 is patterned using an etching solution including nitric acid, for example. In this patterning step, the first source conductive film M1 is not removed, but remains. Subsequent steps are similar to those described above.

Sixth Embodiment

Below, the scanning antenna of a sixth embodiment will be described.

In the TFT substrate used in the scanning antenna of the present embodiment, similar to the fifth embodiment, the distance L1 in the channel direction from the first metal layer 7SL of the source electrode 7S to the first metal layer 7DL of the drain electrode 7D is less than the distance L2 in the channel direction from the second metal layer 7SU of the source electrode 7S to the second metal layer 7DU of the drain electrode 7D. The TFT substrate of the present embodiment can be manufactured by a number of steps (number of photomasks, for example) less than that in the fifth embodiment.

Below is described the TFT substrate of the present embodiment with reference to FIGS. 35A to 36E. Hereinafter, the differences from the fifth embodiment are mainly described.

FIGS. 35A to 35C are each a schematic plan view illustrating a TFT substrate 107 of the present embodiment. FIG. 35A illustrates the antenna unit region U of the transmission and/or reception region R1, FIG. 35B illustrates the transfer terminal section PT, the gate terminal section GT, and the CS terminal section CT provided to the non-transmission and/or reception region R2, and FIG. 35C illustrates the source-gate connection section SG and the source terminal section ST provided to the non-transmission and/or reception region R2. FIGS. 36A to 36E are each a schematic cross-sectional view of the TFT substrate 107. FIG. 36A illustrates a cross section of the antenna unit region U along the line A-A' in FIG. 35A, FIG. 36B illustrates a cross section of the transfer terminal section PT along the line B-B' in FIG. 35B, FIG. 36C illustrates a cross section of the source-gate connection section SG along the line C-C' in FIG. 35C, FIG. 36D illustrates a cross section of the source terminal section ST along the line D-D' in FIG. 35C, and FIG. 36E illustrates a cross section of the transfer terminal section PT along the line E-E' in FIG. 35B.

Antenna Unit Region U

As illustrated in FIGS. 35A and 36B, the source metal layer (including the source electrode 7S, the drain electrode 7D, the patch electrode 7PE, and the upper capacitance electrode 7C) has a layered structure including a first metal layer and a second metal layer formed on the first metal layer. The side surface of the first metal layer and the side surface of the second metal layer are not aligned. When viewed from the normal direction of the dielectric substrate 1, an edge of the second metal layer is on an inner side of an edge of the first metal layer.

For example, the source electrode 7S has a layered structure including the first metal layer 7SL and the second metal layer 7SU. The side surface of the first metal layer 7SL and the side surface of the second metal layer 7SU are not aligned. When viewed from the normal direction of the dielectric substrate 1, an edge of the second metal layer 7SU is on an inner side of an edge of the first metal layer 7SL.

The other electrodes and wiring lines included in the source metal layer are similar to the above.

For example, the drain electrode 7D has a layered structure including the first metal layer 7DL and the second metal layer 7DU. A side surface of the first metal layer 7DL and a side surface of the second metal layer 7DU are not aligned. When viewed from the normal direction of the dielectric substrate 1, an edge of the second metal layer 7DU is on an inner side of an edge of the first metal layer 7DL.

The patch electrode 7PE has a layered structure including the first metal layer 7PEL and the second metal layer 7PEU. The side surface of the first metal layer 7PEL and the side surface of the second metal layer 7PEU are not aligned. When viewed from the normal direction of the dielectric substrate 1, an edge of the second metal layer 7PEU is on an inner side of an edge of the first metal layer 7PEL.

As illustrated in FIGS. 35A and 36A, the antenna unit region U is formed on the source metal layer, and further includes a transparent conductive layer provided with the transparent conductive sections 19a, 19b. The transparent conductive sections 19a, 19b are in contact with the upper surface and the side surface of the second metal layer. A side surface of the transparent conductive layer is aligned with the side surface of the first metal layer.

As illustrated in FIGS. 35A and 36A, the antenna unit region U further includes the first insulating layer 11 formed on the transparent conductive sections 19a, 19b. The first insulating layer 11 includes the opening 18a exposing at least a part of the transparent conductive section 19a.

Note that the opening 18a may be omitted.

As illustrated in FIGS. 35A and 36A, the distance L1 in the channel direction from the first metal layer 7SL of the source electrode 7S to the first metal layer 7DL of the drain electrode 7D is less than the distance L2 in the channel direction from the second metal layer 7SU of the source electrode 7S to the second metal layer 7DU of the drain electrode 7D. Thus, the TFT substrate 107 is capable of suppressing the occurrence of a problem in which the gap (corresponding to the channel length of the TFT) between the source electrode 7S and the drain electrode 7D cannot be controlled at high accuracy, even when the thickness of the source metal layer is great. In the present embodiment, it is possible to make the source metal layer thick compared to that in the fourth embodiment.

Furthermore, the TFT substrate 107 can be manufactured by the manufacturing method described with reference to FIGS. 37AA to 37BK, and thus can be manufactured using a smaller number of photomasks than in the fifth embodiment. The TFT substrate 107 can be manufactured using six photomasks, as described later with reference to FIGS. 37AA to 37BK. Thus, the source metal layer can have an increased thickness compared to that of the TFT substrate 105, and the TFT substrate 107 can be manufactured using a smaller number of photomasks than the TFT substrate 106.

Transfer Terminal Section PT

The first transfer terminal section PT1, as illustrated in FIGS. 35B and 36B, includes the gate connection section 3p supported by the dielectric substrate 1, the gate insulating layer 4 extending over the gate connection section 3p, the source connection section 7q formed on the gate insulating layer 4, the transfer upper connection section 19p formed on the source connection section 7q, and the first insulating layer 11 formed on the transfer upper connection section 19p. Note that the second transfer terminal section PT2, as illustrated in FIGS. 35B and 36E, has the same cross-sectional structure as the first transfer terminal section PT1.

The gate connection section 3p is formed inside the gate metal layer, and is electrically separated from the gate bus line GL. The gate connection section 3p is connected to the CS bus line CL (integrally formed with the CS bus line). The gate insulating layer 4 includes the opening 12p exposing a part of the gate connection section 3p.

The source connection section 7q is formed on the gate insulating layer 4 and inside the opening 12p, and is in contact with the gate connection section 3p inside the opening 12p. The first insulating layer 11 includes the opening 14p extending over the source connection section 7q and exposing a part of the source connection section 7q. The transfer upper connection section 19p is formed on the first insulating layer 11 and inside the opening 14p, and is in contact with the source connection section 7q inside the opening 14p.

The source connection section 7q is formed inside the source metal layer, and is electrically separated from the source electrode 7S and the drain electrode 7D. In this example, the source connection section 7q has a layered structure including the first metal layer 7qL and the second metal layer 7qU. When viewed from the normal direction of the dielectric substrate 1, an edge of the second metal layer 7qU is positioned in an interior of the first metal layer 7qL. That is, the side surfaces of the second metal layer 7qU and the first metal layer 7qL are not aligned.

The transfer upper connection section 19p is formed inside the transparent conductive layer. In this example, the transfer upper connection section 19p is disposed so as to cover the upper surface and the side surfaces of the second metal layer 7qU of the source connection section 7q. The transfer upper connection section 19p may be in contact with the upper surface and the side surfaces of the second metal layer 7qU of the source connection section 7q, and in contact with the upper surface of the first metal layer 7qL around the second metal layer 7qU. As described later, the transfer upper connection section 19p and the first metal layer 7qL can be etched at the same time using the same mask. In this case, the side surfaces of the transfer upper connection section 19p and the first metal layer 7qL are aligned.

The gate connection section 3p is electrically connected to the transfer upper connection section 19p via the source connection section 7q. Specifically, the opening (gate contact hole) 12p that reaches the gate connection section 3p is provided to the gate insulating layer 4. The source connection section 7q is formed on the gate insulating layer 4 and inside the opening 12p, and is in contact with the gate connection section 3p inside the opening 12p.

The first insulating layer 11 is formed on the transfer upper connection section 19p, and includes the opening 18p exposing a part of the transfer terminal upper connection section 19p. The section of the transfer upper connection section 19p that is exposed by the opening 18p is connected with a transfer connection section on the slot substrate side by a sealing material containing conductive particles, for example (refer to FIG. 7).

Source-Gate Connection Section SG

Specifically, as illustrated in FIGS. 35C and 36C, the source-gate connection section SG includes the gate connection wiring line 3sg supported by the dielectric substrate 1, the gate insulating layer 4 extending over the gate connection wiring line 3sg, and the source connection section 7sg formed on the gate insulating layer 4. The source-gate connection section SG may further include the first insulating layer 11 covering the source connection section 7sg.

The source connection section 7sg is formed inside the source metal layer. In this example, the source connection section 7sg has a layered structure including the first metal layer 7sgL and the second metal layer 7sgU.

In this example, as described later, the source connection section 7sg is formed by patterning the first metal layer 7sgL using the second metal layer 7sgU of the source connection section 7sg as a mask. Thus, on the side surface of the source connection section 7sg, the side surface of the second metal layer 7sgU and the side surface of the first metal layer 7sgL are aligned.

The first insulating layer 11 is disposed so as to cover the upper surface and the side surfaces of the source connection section 7sg. Here, the first insulating layer 11 is in contact with the upper surface and the side surfaces of the second metal layer 7sgU, and in contact with the side surfaces of the first metal layer 7sgL. Corrosion of the source connection section 7sg can be suppressed by covering the source connection section 7sg with the first insulating layer 11. The first insulating layer 11, while not particularly limited, may be formed using an SiN layer having excellent moisture resistance, for example.

Source Terminal Section ST, Gate Terminal Section GT, and CS Terminal Section CT The source terminal section ST, as illustrated in FIGS. 35C and 36D, includes the gate connection wiring line 3sg extending from the source-gate connection section SG, the gate insulating layer 4 formed on the gate connection wiring line 3sg, the source terminal source connection section 7sL, the source terminal upper connection section 19s, and the first insulating layer 11.

The gate insulating layer 4 includes an opening 12s that reaches the gate connection wiring line 3sg. The source terminal source connection section 7sL is disposed on the gate insulating layer 4 and inside the opening 12s, and is in contact with the gate connection wiring line 3sg inside the opening 12s. The source terminal upper connection section 19s is formed on the source terminal source connection section 7sL. As described later, the source terminal source connection section 7sL and the source terminal upper connection section 19s can be etched at the same time using the same mask. In this case, the side surfaces of the source terminal source connection section 7sL and the source terminal upper connection section 19s are aligned. The first insulating layer 11 is formed on the gate insulating layer 4 and on the source terminal upper connection section 19p, and includes the opening 18s exposing at least a part of the source terminal upper connection section 19s.

The gate terminal section GT and the CS terminal section CT, as illustrated in FIG. 35B, may have the same configuration as the source terminal section ST. In this example, the gate terminal section GT includes the gate bus line GL, the gate insulating layer 4 formed on the gate bus line GL, a gate terminal source connection section 7qgL, the gate terminal upper connection section 19g, and the first insulating layer 11. The gate insulating layer 4 includes the opening 12g that reaches the gate bus line GL. The gate terminal source connection section 7qgL is disposed on the gate insulating layer 4 and inside the opening 12g, and is in contact with the gate bus line GL inside the opening 12g. The gate terminal upper connection section 19g is formed on the gate terminal source connection section 7qgL. The first insulating layer 11 is formed on the gate insulating layer 4 and on the gate terminal upper connection section 19g, and includes the opening 18g exposing at least a part of the gate terminal upper connection section 19g.

The CS terminal section CT includes the CS bus line CL, the gate insulating layer 4 formed on the CS bus line CL, a CS terminal source connection section 7qcL, the CS terminal upper connection section 19c, and the first insulating layer 11. The gate insulating layer 4 includes an opening 12c that reaches the CS bus line CL. The CS terminal source connection section 7qcL is disposed on the gate insulating layer 4 and inside the opening 12c, and is in contact with the CS bus line CL inside the opening 12c. The CS terminal upper connection section 19c is formed on the CS terminal source connection section 7qcL. The first insulating layer 11 is formed on the gate insulating layer 4 and on the CS terminal upper connection section 19c, and includes the opening 18c exposing at least a part of the CS terminal upper connection section 19c.

Manufacturing Method of TFT Substrate 107

A method for manufacturing the TFT substrate 107 will now be described with reference to FIGS. 37AA to 37BK. FIGS. 37AA to 37BK are each a process cross-sectional view illustrating an example of the manufacturing method of the TFT substrate 107. These diagrams illustrate cross sections respectively corresponding to FIGS. 36A to 36E. The description below focuses on the differences from the manufacturing method of the TFT substrate 106 described with reference to FIGS. 34AA to 34BL. In particular, the steps illustrated in FIGS. 37AA to 37BG are performed in the same way as the manufacturing steps of the TFT substrate 106 described with reference to FIGS. 34AA to 34AG, excluding formation of the opening 12s.

As illustrated in FIGS. 37AA to 37AD, the gate metal layer, the gate insulating layer 4, and the island-shaped oxide semiconductor layer 5 are formed.

Subsequently, as illustrated in FIG. 37AE, the opening 12p exposing the gate connection section 3p in the transfer terminal section formation region, the opening 12sg exposing the gate connection wiring line 3sg in the source-gate connection section formation region, and the opening 12s exposing the gate connection wiring line 3sg in the source terminal section are formed in the gate insulating layer 4 by etching the gate insulating layer 4. The manufacturing method differs from that of the TFT substrate 106 in that the opening 12s is formed in the source terminal section in addition to the openings 12p, 12sg.

Then, as illustrated in FIG. 37AF, the first source conductive film M1 and the second source conductive film M2 are formed in this order on the gate insulating layer 4, on the semiconductor layer 5, inside the opening 12p, inside the opening 12sg, and inside the opening 12s.

Then, as illustrated in FIG. 37BG, the second metal layer included in the source metal layer is formed by patterning the second source conductive film M2. In this step, the first source conductive film M1 is not patterned. The second source conductive film M2 is patterned under etching conditions that make it possible to increase the etching solution ratio of the second source conductive film M2 and the first source conductive film M1, similar to the manufacturing method of the TFT substrate 106.

In the antenna unit formation region, the second metal layer 7SU included in the source electrode 7S, the second metal layer SLU included in the source bus line SL, the second metal layer 7DU included in the drain electrode 7D, the second metal layer 7CU included in the upper capacitance electrode 7C, and the second metal layer 7PEU included in the patch electrode 7PE are formed from the second source conductive film M2.

In the transfer terminal section formation region, the second metal layer 7qU included in the source connection section 7$q$ is formed from the second source conductive film M2. The second metal layer 7$q$U is formed so as to cover the opening 12$p$.

In the source-gate connection section formation region, a second metal layer 7$sg$U included in the source connection section 7$sg$ is formed from the second source conductive film M2. The second metal layer 7$sg$U is formed so as to cover the opening 12$sg$.

In the source terminal section formation region, the second source conductive film M2 is removed.

Then, as illustrated in FIG. 37BH, the transparent conductive film 19' is formed on the second metal layer and on the first source conductive film M1. Here, an ITO film having a thickness of, for example, 70 nm is used as the transparent conductive film 19'. As the transparent conductive film 19', a layered film that includes a transparent conductive film and a film containing a metal having a high melting point, and is configured with the transparent conductive film as the uppermost layer, may be used. For example, a layered film (ITO/TI) formed by layering Ti (having a thickness of 100 nm, for example) and ITO (having a thickness of 70 nm, for example), in this order, may be used.

Subsequently, a resist layer is formed as a mask layer on the transparent conductive film 19'. The mask layer includes mask sections 90$a$, 90$b$ formed in the antenna unit formation region, a mask section 90$p$ formed in the transfer terminal section formation region, and a mask section 90$s$ formed in the source terminal section formation region. The mask section 90$a$ is formed so as to cover the second metal layer 7DU of the drain electrode 7D, the second metal layer 7CU of the upper capacitance electrode 7C, and the second metal layer 7PEU of the patch electrode 7PE. The mask section 90$b$ is formed so as to cover the second metal layer 7SU of the source electrode 7S, and the second metal layer SLU of the source bus line SL connected thereto. The mask section 90$p$ is formed so as to cover the second metal layer 7$q$U of the source connection section 7$q$. The mask section 90$s$ is formed so as to cover the opening 12$s$. A mask section is not formed in the source-gate connection section formation region. That is, the mask layer includes an opening in the source-gate connection section formation region.

Then, the transparent conductive layer and the first metal layer are obtained as illustrated in FIG. 37BI by simultaneously patterning the transparent conductive film 19' and the first source conductive film M1 using the mask sections 90$a$, 90$b$, 90$p$, 90$s$ and the second metal layer 7$sg$U of the source connection section 7$sg$ as etching masks. Thus, the TFT 10 and the source-gate connection section SG are obtained.

In the antenna unit formation region, the first metal layer 7SL included in the source electrode 7S, the first metal layer SLL included in the source bus line SL, the first metal layer 7DL included in the drain electrode 7D, the first metal layer 7CL included in the upper capacitance electrode 7C, and the first metal layer 7PEL included in the patch electrode are formed from the first source conductive film M1. In the antenna unit formation region, the first transparent conductive section 19$a$ and the second transparent conductive section 19$b$ are formed from the transparent conductive film 19'. The side surface of the first transparent conductive section 19$a$ is aligned with the side surfaces of the first metal layer 7PEL of the patch electrode, the first metal layer 7DL of the drain electrode 7D, and the first metal layer 7CL of the upper capacitance electrode 7C. The side surface of the second transparent conductive section 19$b$ is aligned with the side surface of the first metal layer 7SL of the source electrode 7S. The edges of the first transparent conductive section 19$a$, the first metal layer 7PEL of the patch electrode 7PE, the first metal layer 7DL of the drain electrode 7D, and the first metal layer 7CL of the upper capacitance electrode 7C are on the outer sides of the edges of the second metal layer 7PEU of the patch electrode 7PE, the second metal layer 7DU of the drain electrode 7D, and the second metal layer 7CU of the upper capacitance electrode 7C, when viewed from the normal direction of the dielectric substrate 1. The edges of the second transparent conductive section 19$b$ and the first metal layer 7SL of the source electrode 7S are on the outer sides of the edge of the second metal layer 7SU of the source electrode 7S when viewed from the normal direction of the dielectric substrate 1.

In the transfer terminal section formation region, the first metal layer 7$q$L included in the source connection section 7$q$ is formed from the first source conductive film M1, and the transfer terminal upper connection section 19$p$ is formed from the transparent conductive film 19'. The side surface of the transfer terminal upper connection section 19$p$ is aligned with the first metal layer 7$q$L. When viewed from the normal direction of the dielectric substrate 1, the edges of the transfer terminal upper connection section 19$p$ and the first metal layer 7$q$L are on an outer side of an edge of the second metal layer 7$q$U.

In the source terminal section formation region, the source terminal source connection section 7$s$L is formed from the first source conductive film M1, and the source terminal upper connection section 19$s$ is formed from the transparent conductive film 19'. The side surface of the source terminal upper connection section 19$s$ is aligned with the side surface of the source terminal source connection section 7$s$L.

In the source-gate connection section SG, the first metal layer 7$sg$L included in the source connection section 7$sg$ is formed from the first source conductive film M1. The side surface of the first metal layer 7$sg$L is aligned with the side surface of the second metal layer 7$sg$U. In the source-gate connection section SG, the transparent conductive film 19' is removed.

Next, the first insulating layer 11 is formed so as to cover the TFT 10, the transparent conductive layer, the second source metal layer, and the gate insulating layer 4, as illustrated in FIG. 37BJ. Here, as the first insulating layer 11, a layered film (SixNy/SioX) is formed by layering a silicon oxide (SiOx) film (having a thickness of 250 nm, for example) and a silicon nitride (SixNy) film (having a thickness of 250 nm, for example), in this order.

Then, the first insulating layer 11 is etched by a known photolithography process. Thus, as illustrated in FIG. 37BK, in the first insulating layer 11, the opening 18$a$ exposing a part of the first transparent conductive section 19$a$ is formed in the antenna unit formation region, the opening 18$p$ exposing a part of the transfer terminal upper connection section 19$p$ is formed in the transfer terminal section formation region, and the opening 18$s$ exposing a part of the source terminal upper connection section 19$s$ is formed in the source terminal section formation region. Thus, the antenna unit region U, the transfer terminal section PT and the source terminal section ST are obtained.

In this manner, the TFT substrate 107 is manufactured.

Modification 1 Below is described the TFT substrate of modification 1 of the present embodiment with reference to FIGS. 38A to 39E.

FIGS. 38A to 38C are each a schematic plan view illustrating a TFT substrate 107$a$ of modification 1 of the present embodiment. FIG. 38A illustrates the antenna unit region U of the transmission and/or reception region R1, FIG. 38B illustrates the transfer terminal section PT, the gate terminal section GT, and the CS terminal section CT provided to the non-transmission and/or reception region R2, and FIG. 38C illustrates the source-gate connection section SG and the source terminal section ST provided to the non-transmission and/or reception region R2. FIGS. 39A to 39E are each a schematic cross-sectional view of the TFT substrate 107a. FIG. 39A illustrates a cross section of the antenna unit region U along the line A-A' in FIG. 38A, FIG. 39B illustrates a cross section of the transfer terminal section PT along the line B-B' in FIG. 38B, FIG. 39C illustrates a cross section of the source-gate connection section SG along the line C-C' in FIG. 38C. FIG. 39D illustrates a cross section of the source terminal section ST along the line D-D' in FIG. 38C, and FIG. 39E illustrates a cross section of the transfer terminal section PT along the line E-E' in FIG. 38B.

The TFT substrate 107a differs from the TFT substrate 107 in the structure of the source-gate connection section SG and the thickness of the first insulating layer 11. The source-gate connection section SG, as illustrated in FIGS. 38C and 39C, has the same cross-sectional structure as the transfer terminal section PT except that the transparent conductive layer does not include an opening. Further, as illustrated in FIGS. 39A to 39E, the thickness of the first insulating layer 11 of the TFT substrate 107a is less than the thickness of the first insulating layer 11 of the TFT substrate 107. Furthermore, the TFT substrate 107a differs from the TFT substrate 107 in that the first insulating layer 11 does not include an opening exposing at least a part of the transparent conductive section 19a in the antenna unit region U.

In the TFT substrate 107a having such a configuration as well, it is possible to achieve the same effect as that of the TFT substrate 107.

Source-Gate Connection Section SG

The source-gate connection section SG as illustrated in FIGS. 38C and 39C, has the same cross-sectional structure as the transfer terminal section PT except that the transparent conductive layer does not include an opening. That is, the source-gate connection section SG includes the gate connection wiring line 3sg supported by the dielectric substrate 1, the gate insulating layer 4 extending over the gate connection wiring line 3sg, the source connection section 7sg formed on the gate insulating layer 4, a connection section transparent conductive section 19sp formed on the source connection section 7sg, and the first insulating layer 11 formed on a connection section transparent conductive section 19sg.

The source connection section 7sg is formed inside the source metal layer. In this example, the source connection section 7sg has a layered structure including the first metal layer 7sgL and the second metal layer 7sgU. When viewed from the normal direction of the dielectric substrate 1, an edge of the second metal layer 7sgU is positioned in an interior of the first metal layer. That is, the side surfaces of the second metal layer 7sgU and the first metal layer 7sgL are not aligned.

The connection section transparent conductive section 19sg is formed inside the transparent conductive layer. In this example, the connection section transparent conductive section 19sg is formed so as to cover the upper surface and the side surfaces of the second metal layer 7sgU. The connection section transparent conductive section 19sg may be in contact with the upper surface and the side surfaces of the second metal layer 7sgU, and in contact with the upper surface of the first metal layer 7sgL around the second metal layer 7sgU. As described later, the connection section transparent conductive section 19sg and the first metal layer 7sgL can be etched at the same time using the same mask. In this case, the side surfaces of the connection section transparent conductive section 19sg and the first metal layer 7sgL are aligned.

The gate connection wiring line 3sg is electrically connected to the connection section transparent conductive section 19sg via the source connection section 7sg. Specifically, the opening (gate contact hole) 12sg that reaches the gate connection wiring line 3sg is provided to the gate insulating layer 4. The source connection section 7sg is formed on the gate insulating layer 4 and inside the opening 12sg, and is in contact with the gate connection wiring line 3sg inside the opening 12sg.

A method for manufacturing the TFT substrate 107a will now be described with reference to FIGS. 40A to 40D. FIGS. 40A to 40D are each a process cross-sectional view illustrating an example of a manufacturing method of the TFT substrate 107a. These diagrams illustrate cross sections respectively corresponding to FIGS. 39A to 39E. Hereinafter, the differences from the manufacturing method of the TFT substrate 107 are mainly described.

The manufacturing method of the TFT substrate 107a is the same as the manufacturing method of the TFT substrate 107 described with reference to FIGS. 37AA to 37BK, excluding the thicknesses of the source-gate connection section SG and the first insulating layer 11.

First, similar to the method described with reference to FIGS. 37AA to 37BG, the gate metal layer, the gate insulating layer 4, the island-shaped semiconductor layer 5, the first source conductive film M1, and the second metal layer are formed.

Then, as illustrated in FIG. 40A, the transparent conductive film 19' is formed on the second metal layer and on the first source conductive film M1. Subsequently, a resist layer is formed as a mask layer on the transparent conductive film 19'. The mask layer includes the mask sections 90a, 90b formed in the antenna unit formation region, the mask section 90p formed in the transfer terminal section formation region, the mask section 90s formed in the source terminal section formation region, and a mask section 90sg formed in the source-gate connection section formation region. The manufacturing method differs from that of the TFT substrate 107 in that the mask section 90sg is formed in addition to the mask sections 90a, 90b, 90p, 90s. The mask section 90sg is formed so as to cover the opening 12sg.

Then, the transparent conductive layer and the first metal layer are obtained as illustrated in FIG. 40B by simultaneously patterning the transparent conductive film 19' and the first source conductive film M1 using the mask sections 90a, 90b, 90p, 90s, 90sg as etching masks. Thus, the TFT 10 and the source-gate connection section SG are obtained.

In the source-gate connection section SG, the first metal layer 7sgL included in the source connection section 7sg is formed from the first source conductive film M1, and the connection section transparent conductive section 19sg is formed from the transparent conductive film 19'. The side surface of the connection section transparent conductive section 19sg is aligned with the side surface of the first metal layer 7sgL.

Next, the first insulating layer 11 is formed so as to cover the TFT 10, the transparent conductive layer, and the gate insulating layer 4, as illustrated in FIG. 40C.

Then, the first insulating layer 11 is etched by a known photolithography process. Thus, as illustrated in FIG. 40D, in the first insulating layer 11, the opening 18p exposing a part of the transparent terminal upper connection section 19p is formed in the transfer terminal section formation region, and the opening 18s exposing a part of the source terminal upper connection section 19s is formed in the source terminal section formation region. Here, the manufacturing method differs from that of the TFT substrate 107 in that an opening exposing at least a part of the first transparent conductive section 19a is not formed in the antenna unit region U. Thus, the antenna unit region U, the transfer terminal section PT, and the source terminal section ST are obtained.

In this manner, the TFT substrate 107a is manufactured.

The scanning antenna according to the embodiments of the disclosure is housed in a plastic housing, for example, as necessary. It is preferable to use a material having a small dielectric constant $\varepsilon_M$ that does not affect microwave transmission and/or reception in the housing. In addition, a through-hole may be provided in a portion of the housing corresponding to the transmission and/or reception region R1. Furthermore, a light blocking structure may be provided such that the liquid crystal material is not exposed to light. The light blocking structure is, for example, provided so as to block light that passes through the dielectric substrate 1 and/or 51 from the side surface of the dielectric substrate 1 of the TFT substrate 101 and/or the side surface of the dielectric substrate 51 of the slot substrate 201 and is incident upon the liquid crystal layer. A liquid crystal material having a large dielectric anisotropy $\Delta\varepsilon_M$ may be prone to photodegradation, and as such it is preferable to shield not only ultraviolet rays but also short-wavelength blue light from among visible light. By using a light-blocking tape such as a black adhesive tape, for example, the light blocking structure can be easily formed in desired locations.

INDUSTRIAL APPLICABILITY

Embodiments according to the disclosure are used in scanning antennas for satellite communication or satellite broadcasting that are mounted on mobile bodies (ships, aircraft, and automobiles, for example) and the manufacturing methods thereof.

REFERENCE SIGNS LIST

1 Dielectric substrate
2 Base insulating film
3 Gate electrode
4 Gate insulating layer
5 Semiconductor layer
6D Drain contact layer
6S Source contact layer
7D Drain electrode
7S Source electrode
7PE Patch electrode
7p Source connection wiring line
11 First insulating layer
15 Patch electrode
15p Patch connection section
17 Second insulating layer
18g, 18s, 18p Opening
19g Gate terminal upper connection section
19p Transfer terminal upper connection section
19s Source terminal upper connection section
21 Alignment mark
23 Protective conductive layer
51 Dielectric substrate
52 Third insulating layer
54 Dielectric layer (air Layer)
55 Slot electrode
55L Lower layer
55M Main layer
55U Upper layer
55 Contact surface
57 Slot
58 Fourth insulating layer
60 Upper connection section
65 Reflective conductive plate
67 Adhesive layer
68 Heater resistive film
70 Power feed device
71 Conductive beads
72 Power feed pin
73 Sealing portion
101, 102, 103, 104 TFT substrate
105, 105a to 105c, 106, 107, 107a TFT substrate
201, 203 Slot substrate
1000 Scanning antenna
CH1, CH2, CH3, CH4, CH5, CH6 Contact hole
GD Gate driver
GL Gate bus line
GT Gate terminal section
SD Source driver
SL Source bus line
ST Source terminal section
PT Transfer terminal section
IT Terminal section
LC Liquid crystal layer
R1 Transmission and/or reception region
R2 Non-transmission and/or reception region
Rs Seal region
U, U1, U2 Antenna unit, Antenna unit region

The invention claimed is:

1. A TFT substrate comprising:
   a dielectric substrate;
   a transmission and/or reception region provided with a plurality of antenna unit regions arranged on the dielectric substrate, the plurality of antenna unit regions each including a TFT provided with a drain electrode, a gate electrode, and a source electrode, and a patch electrode connected with the drain electrode;
   a non-transmission and/or reception region positioned in a region other than the transmission and/or reception region;
   a gate metal layer supported by the dielectric substrate and including the gate electrode;
   a gate insulating layer formed on the gate metal layer; and
   a source metal layer formed on the gate insulating layer and including the source electrode, the drain electrode, and the patch electrode,
   wherein the source metal layer includes a first metal layer that contains one of Ti, Mo, Ta, W, and Nb, and a second metal layer that is formed on the first metal layer and contains one of Cu, Al, Ag, and Au,
   the source electrode and the drain electrode each include the first metal layer and the second metal layer, and
   a distance from the first metal layer of the source electrode to the first metal layer of the drain electrode in a channel direction is less than a distance from the second metal layer of the source electrode to the second metal layer of the drain electrode in the channel direction.

2. The TFT substrate according to claim 1,
   wherein the patch electrode comprises the first metal layer and the second metal layer; and a side surface of the first metal layer of the patch electrode and a side surface of the second metal layer of the patch electrode are not aligned on a side surface of the patch electrode.

3. The TFT substrate according to claim 2,
wherein an edge of the second metal layer of the patch electrode is on an inner side of an edge of the first metal layer of the patch electrode when viewed from a normal direction of the dielectric substrate.

4. The TFT substrate according to claim 2, further comprising:
a transparent conductive section formed on the source metal layer and in contact with an upper surface and a side surface of the second metal layer of the patch electrode,
wherein a side surface of the first metal layer of the patch electrode and a side surface of the transparent conductive section are aligned on a side surface of the patch electrode.

5. The TFT substrate according to claim 4, further comprising a first insulating layer formed on the transparent conductive section.

6. The TFT substrate according to claim 5,
wherein the first insulating layer includes a first opening exposing at least a part of the transparent conductive section.

7. The TFT substrate according to claim 5, further comprising:
a transfer terminal section in the non-transmission and/or reception region,
wherein the transfer terminal section includes a gate connection section formed from the same conductive film as the gate electrode, the gate insulating layer that extends over the gate connection section and is provided with a second opening exposing a part of the gate connection section, a source connection section provided with the first metal layer and the second metal layer, formed on the gate insulating layer and inside the second opening, and in contact with the gate connection section inside the second opening, a transparent conductive connection section formed on the source connection section, and the first insulating layer formed on the transparent conductive connection section and provided with a third opening exposing a part of the transparent conductive connection section.

8. The TFT substrate according to claim 7,
wherein an edge of the second metal layer of the source connection section is on an inner side of an edge of the first metal layer of the source connection section when viewed from the normal direction of the dielectric substrate.

9. The TFT substrate according to claim 7,
wherein a side surface of the first metal layer of the source connection section and a side surface of the transparent conductive connection section are aligned.

10. The TFT substrate according to claim 1, further comprising:
a first insulating layer formed on the source metal layer and provided with a first opening exposing at least a part of the patch electrode; and
a transparent conductive section formed on the first insulating layer and inside the first opening, and covering at least a part of the patch electrode.

11. The TFT substrate according to claim 10, further comprising:
a transfer terminal section in the non-transmission and/or reception region,
wherein the transfer terminal section includes a gate connection section formed from the same conductive film as the gate electrode, the gate insulating layer that extends over the gate connection section and is provided with a second opening exposing a part of the gate connection section, a source connection section provided with the first metal layer and the second metal layer, formed on the gate insulating layer and inside the second opening, and in contact with the gate connection section inside the second opening, the first insulating layer formed on the source connection section and provided with a third opening exposing a part of the source connection section, and a transparent conductive connection section formed on the first insulating layer and inside the third opening, and in contact with the source connection section inside the third opening.

12. The TFT substrate according to claim 11,
wherein a side surface of the first metal layer of the source connection section and a side surface of the second metal layer of the source connection section are not aligned on a side surface of the source connection section.

13. A scanning antenna, comprising:
the TFT substrate described in claim 1;
a slot substrate disposed facing the TFT substrate;
a liquid crystal layer provided between the TFT substrate and the slot substrate; and
a reflective conductive plate disposed facing a surface of the slot substrate on a side opposite the liquid crystal layer via a dielectric layer,
wherein the slot substrate includes another dielectric substrate, and a slot electrode formed on a surface of the other dielectric substrate on the liquid crystal layer side,
the slot electrode includes a plurality of slots, and
the plurality of slots are disposed correspondingly with the patch electrodes of the plurality of antenna unit regions of the TFT substrate.

14. A method for manufacturing a TFT substrate provided with a transmission and/or reception region including a plurality of antenna unit regions, and a non-transmission and/or reception region positioned in a region other than the transmission and/or reception region, each of the plurality of antenna unit regions being provided with a TFT and a patch electrode, the method comprising the steps of:
(a) forming a gate conductive film on a dielectric substrate, and forming a pluralit of gate bus lines and a gate electrode of the TFT by patterning the gate conductive film;
(b) forming a gate insulating layer that covers the plurality of gate bus lines and the gate electrode;
(c) forming a semiconductor layer of the TFT on the gate insulating layer; and
(d) forming a source conductive film on the semiconductor layer and on the gate insulating layer, and forming a plurality of source bus lines, a source electrode and a drain electrode connected to the semiconductor layer, and the patch electrode by patterning the source conductive film.

15. The method for manufacturing a TFT substrate according to claim 14,
wherein the step (d) further includes the steps of (d1) forming a first source conductive film containing one of Ti, Mo, Ta, W, and Nb on the semiconductor layer and on the gate insulating layer, (d2) forming a second source conductive film containing one of Cu, Al, Ag, and Au on the first source conductive film, (d3) forming a first metal layer by patterning the first source conductive film, and (d4) forming a second metal layer by patterning the second source conductive film; and the source electrode, the drain electrode, and the patch electrode each include the first metal layer and the second metal layer.

16. The method for manufacturing a TFT substrate according to claim 15,
wherein the patterning of the step (d3) and the patterning of the step (d4) are performed using the same mask.

17. The method for manufacturing a TFT substrate according to claim 15,
wherein the patterning of the step (d3) and the patterning of the step (d4) are performed using different masks.

18. The method for manufacturing a TFT substrate according to claim 17,
wherein the step (d3) and the step (d4) comprise forming the first metal layer and the second metal layer with a distance in a channel direction from the first metal layer of the source electrode to the first metal layer of the drain electrode being less than a distance in the channel direction from the second metal layer of the source electrode to the second metal layer of the drain electrode.

19. The method for manufacturing a TFT substrate according to claim 15,
wherein the step (d) further includes the step of (d5) forming a transparent conductive film on the first source conductive film and on the second metal layer before the step (d1), after the steps (d2) and (d4), and before the step (d3); and
the step (d3) includes patterning the transparent conductive film and the first source conductive film using the same mask.

* * * * *